(12) United States Patent
Honjo

(10) Patent No.: US 11,637,128 B2
(45) Date of Patent: Apr. 25, 2023

(54) BOTTOM-GATE TFT INCLUDING GATE SIDEWALL SPACERS FORMED TO RELAX THE LOCAL ELECTRIC FIELD CONCENTRATION

(71) Applicant: Sony Corporation, Tokyo (JP)

(72) Inventor: Akiko Honjo, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

(21) Appl. No.: 16/878,031

(22) Filed: May 19, 2020

(65) Prior Publication Data
US 2021/0036027 A1 Feb. 4, 2021

Related U.S. Application Data

(63) Continuation of application No. 16/006,759, filed on Jun. 12, 2018, now Pat. No. 10,707,235, which is a
(Continued)

(30) Foreign Application Priority Data

Dec. 12, 2013 (JP) .................................. 2013-256582

(51) Int. Cl.
*H01L 27/12* (2006.01)
*H01L 29/786* (2006.01)
(Continued)

(52) U.S. Cl.
CPC ...... *H01L 27/1222* (2013.01); *H01L 27/1218* (2013.01); *H01L 27/3211* (2013.01);
(Continued)

(58) Field of Classification Search
CPC .......... H01L 27/1222; H01L 29/78603; H01L 29/78612; H01L 29/78621;
(Continued)

(56) References Cited

U.S. PATENT DOCUMENTS 6,037,017 A 3/2000 Kashiro
8,247,813 B2 8/2012 Koyama et al.
(Continued)

FOREIGN PATENT DOCUMENTS

JP 2012-109579 6/2012

*Primary Examiner* — Marcos D. Pizarro
(74) *Attorney, Agent, or Firm* — Michael Best & Friedrich LLP

(57) ABSTRACT

Provided is a thin film transistor, including: a base that includes, on an upper surface, a first region and a second region; a gate electrode that is provided on the first region of the base; a gate insulating film that is provided on a surface of the gate electrode and the second region of the base; and a semiconductor layer that is provided on a surface of the gate insulating film, wherein the semiconductor layer includes a third region and a fourth region, in the third region, the semiconductor layer and the gate electrode face with a minimum interval, in the fourth region, a distance from the semiconductor layer to the gate electrode is larger than the minimum interval, and at a boundary position between the third region and the fourth region, the semiconductor layer forms a linear shape or a substantially linear shape.

8 Claims, 40 Drawing Sheets

Related U.S. Application Data continuation of application No. 14/528,620, filed on Oct. 30, 2014, now Pat. No. 10,014,324.

(51) Int. Cl.
*H01L 27/32* (2006.01)
*H01L 29/66* (2006.01)
*H01L 29/423* (2006.01)

(52) U.S. Cl.
CPC .... *H01L 27/3262* (2013.01); *H01L 29/42384* (2013.01); *H01L 29/66765* (2013.01); *H01L 29/7869* (2013.01); *H01L 29/78603* (2013.01); *H01L 29/78612* (2013.01); *H01L 29/78621* (2013.01); *H01L 29/78669* (2013.01); *H01L 29/78678* (2013.01); *H01L 29/78693* (2013.01); *H01L 29/78696* (2013.01); *H01L 2029/42388* (2013.01)

(58) Field of Classification Search
CPC ........... H01L 29/78678; H01L 29/7869; H01L 29/78693; H01L 29/78696; H01L 27/1218; H01L 27/3262; H01L 27/3211; H01L 29/42384; H01L 29/66765; H01L 29/78669; H01L 2029/42388
See application file for complete search history.

(56) References Cited

U.S. PATENT DOCUMENTS

| | | |
|---|---|---|
| 2003/0063229 A1 | 4/2003 | Takahashi et al. |
| 2007/0087487 A1 | 4/2007 | Honda |
| 2008/0119018 A1 | 5/2008 | Toyota et al. |
| 2012/0288993 A1 | 11/2012 | Sasagawa et al. |
| 2013/0292675 A1* | 11/2013 | Tsubuku ............. H01L 29/4908 257/57 |

* cited by examiner

BOTTOM-GATE TFT INCLUDING GATE SIDEWALL SPACERS FORMED TO RELAX THE LOCAL ELECTRIC FIELD CONCENTRATION

CROSS REFERENCE TO RELATED APPLICATIONS

The present application is a Continuation of application Ser. No. 16/006,759, filed Jun. 12, 2018, which is a Continuation of application Ser. No. 14/528,620, filed Oct. 30, 2014, now U.S. Pat. No. 10,014,324, issued on Jul. 3, 2018, and claims the benefit of Japanese Priority Patent Application JP 2013-256582 filed on Dec. 12, 2013, the entire contents of which are incorporated herein by reference.

BACKGROUND

The present disclosure relates to a thin film transistor that includes a back gate (hereinafter, referred to as a thin film transistor (TFT) of a bottom gate type), a display device that includes the thin film transistor, an electronic apparatus that includes the display device, and a method of manufacturing the thin film transistor.

A thin film transistor is used as a semiconductor element that controls a display device such as an organic EL (electroluminescence) display device or a liquid crystal display device. In a thin film transistor that controls a display device, since a high voltage is applied to a drain, a local concentration of electric field tends to develop in a semiconductor layer in a vicinity of gate edge on the drain side, leading to occurrence of a kink current and degradation in reliability. Therefore, in Japanese Unexamined Patent Application Publication No. 2012-109579, the gate and the drain are more spaced to allow a low-concentration impurity region to be implanted between the gate and the drain, forming an LDD (lightly doped drain).

SUMMARY

However, even such an LDD configuration as in Japanese Unexamined Patent Application Publication No. 2012-109579 has a disadvantage of insufficient relaxing the concentration of electric field in the semiconductor layer in the vicinity of the gate edge.

It is desirable to provide a thin film transistor that makes it possible to relax local concentration of electric field in a semiconductor layer, a display device and an electronic apparatus that include the thin film transistor, and a method of manufacturing the thin film transistor.

According to an embodiment of the present disclosure, there is provided a thin film transistor including: a base that includes, on an upper surface, a first region and a second region other than the first region; a gate electrode that is provided on the first region of the base; a gate insulating film that is provided on a surface of the gate electrode and the second region of the base; and a semiconductor layer that is provided on a surface of the gate insulating film. The semiconductor layer includes a third region and a fourth region other than the third region. In the third region, the semiconductor layer and the gate electrode face with a minimum interval. In the fourth region, a distance from the semiconductor layer to the gate electrode is larger than the minimum interval. At a boundary position between the third region and the fourth region, the semiconductor layer forms a linear shape or a substantially linear shape.

In the thin film transistor according to the above-described embodiment of the present disclosure, at the boundary position between the third region and the fourth region, the semiconductor layer forms a linear shape or a substantially linear shape. Accordingly, at the boundary position between the third region and the fourth region, a degree of bending of a shape of the semiconductor layer is small, allowing a gradual change in a distance from the semiconductor layer to the gate electrode. This leads to a gradual change in a potential in the semiconductor layer in vicinity of the gate edge, relaxing the concentration of electric field.

According to an embodiment of the present disclosure, there is provided a display device provided with a display element and a thin film transistor that is configured to drive the display element. The thin film transistor includes: a base that includes, on an upper surface, a first region and a second region other than the first region; a gate electrode that is provided on the first region of the base; a gate insulating film that is provided on a surface of the gate electrode and the second region of the base; and a semiconductor layer that is provided on a surface of the gate insulating film. The semiconductor layer includes a third region and a fourth region other than the third region. In the third region, the semiconductor layer and the gate electrode face with a minimum interval. In the fourth region, a distance from the semiconductor layer to the gate electrode is larger than the minimum interval. At a boundary position between the third region and the fourth region, the semiconductor layer forms a linear shape or a substantially linear shape.

In the display device according to the above-described embodiment of the present disclosure, the display element is driven by the thin film transistor according to the above-described embodiment of the present disclosure, in which the local concentration of electric filed is relaxed. Accordingly, the occurrence of a kink current or the degradation in reliability of the thin film transistor is restrained, reducing defects of pixel characteristics and improving display quality.

According to an embodiment of the present disclosure, there is provided an electric apparatus provided with a display device. The display device includes a display element and a thin film transistor that is configured to drive the display element. The thin film transistor includes: a base that includes, on an upper surface, a first region and a second region other than the first region; a gate electrode that is provided on the first region of the base; a gate insulating film that is provided on a surface of the gate electrode and the second region of the base; and a semiconductor layer that is provided on a surface of the gate insulating film. The semiconductor layer includes a third region and a fourth region other than the third region. In the third region, the semiconductor layer and the gate electrode face with a minimum interval. In the fourth region, a distance from the semiconductor layer to the gate electrode is larger than the minimum interval. At a boundary position between the third region and the fourth region, the semiconductor layer forms a linear shape or a substantially linear shape.

In the electronic apparatus according to the above-described embodiment of the present disclosure, image display is performed by the display device according to the above-described embodiment of the present disclosure.

According to an embodiment of the present disclosure, there is provided a method of manufacturing a thin film transistor, the method including: forming a gate electrode on a first region of a base, the base including, on an upper surface, the first region and a second region other than the first region; forming a gate insulating film on a surface of the gate electrode and the second region of the base; and forming a semiconductor layer on a surface of the gate insulating film. The semiconductor layer includes a third region and a fourth region other than the third region. In the third region, the semiconductor layer and the gate electrode face with a minimum interval. In the fourth region, a distance from the semiconductor layer to the gate electrode is larger than the minimum interval. At a boundary position between the third region and the fourth region, the semiconductor layer forms a linear shape or a substantially linear shape.

According to the thin film transistor, the display device, the electronic apparatus, and the method of manufacturing the thin film transistor in the above-described embodiments of the present disclosure, at the boundary position between the third region and the fourth region, the semiconductor layer forms a linear shape or a substantially linear shape. Hence, it is possible, at the boundary position between the third region and the fourth region, to allow a gradual change in a distance from the semiconductor layer to the gate electrode, relaxing the local concentration of electric field in the semiconductor layer.

It is to be noted that some effects described here are not necessarily limitative, and any of other effects described herein may be achieved.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

In the following, some embodiments of the present disclosure will be described in detail with reference to the accompanying drawings. It is to be noted that description will be made in the following order.

1. Reference Example 1
2. First Embodiment (thin film transistor; one example in which a fifth region and a sixth region are provided in a second region on a source side and on a drain side of a base)
3. Modification Example 1 (thin film transistor; one example in which the fifth region and the sixth region are provided in the second region on the drain side of the base)
4. Modification Example 2 (method of manufacturing thin film transistor; one example in which, in etching the second region of the base, a mask of a same layout as that of a gate electrode is used)
5. Second Embodiment (thin film transistor; one example in which the base is configured of a laminated body of a first insulating layer and a second insulating layer)
6. Third Embodiment (thin film transistor; one example in which an upper surface of a gate insulating film is flat)
7. Fourth Embodiment (thin film transistor; one example in which a side wall is attached to a side surface of the gate electrode)
8. Fifth Embodiment (organic EL display device)
9. Modification Example 3 (liquid crystal display device)
10. Modification Example 4 (electronic paper display device)
11. Application Examples (module and electronic apparatuses)

Reference Example 1

First, prior to description of specific example embodiments, as an assumption that is a base of the present disclosure and is common to the specific example embodiments, description will be given, with reference to experiment results, on a local concentration of electric field in a semiconductor layer in a vicinity of a gate edge.

Figure 1:
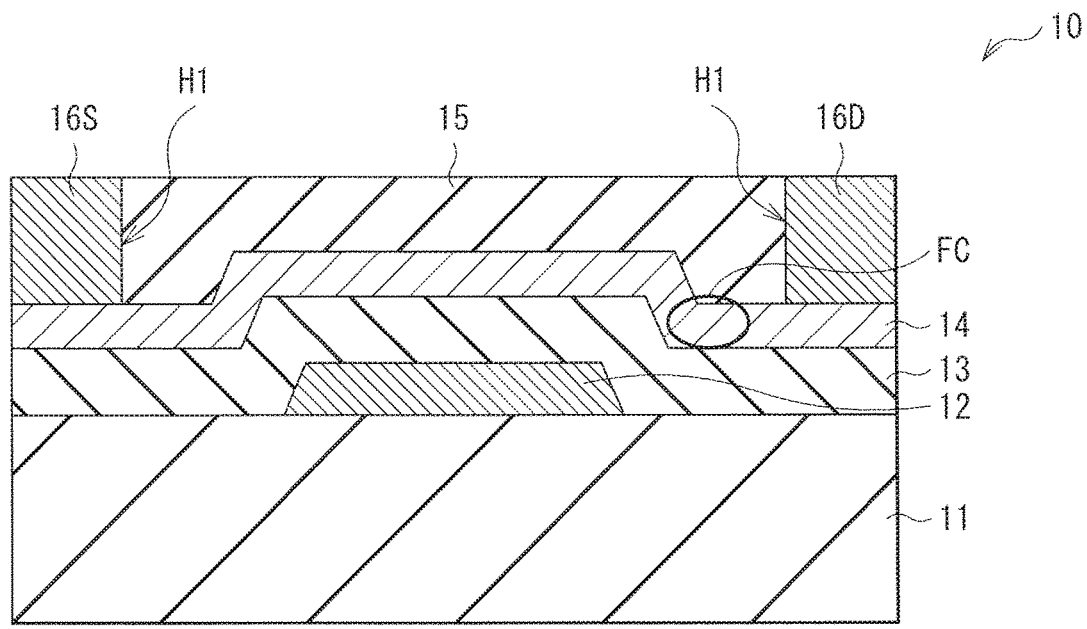
FIG. 1 is a cross-sectional view illustrating a configuration of a thin film transistor according to a reference example 1.

FIG. 1 illustrates a cross-sectional configuration of a thin film transistor 10R according to a reference example 1. The thin film transistor 10R according to the reference example 1 is a TFT of a bottom gate type, and includes, for example, on a flat surface of a base 11, a gate electrode 12, a gate insulating film 13, a semiconductor layer 14, an insulating film (a protective film) 15, a source electrode 16S, and a drain electrode 16D in this order.

The base 11 is configured of a glass substrate. The gate electrode 12 is configured of, for example, molybdenum (Mo). The gate insulating film 13 is configured of a layered film of a silicon nitride film ($Si_3N_4$) and a silicon oxide film ($SiO_2$). The semiconductor layer 14 is configured of polysilicon. The insulating film 15 is configured of a layered film of a silicon oxide film and a silicon nitride film. It is to be noted that an LDD (not illustrated) is provided at a gate edge of the semiconductor layer 14.

In the thin film transistor 10R, on the flat base 11, the gate electrode 12 is patterned. On the base 11 and the gate electrode 12, the gate insulating film 13 and the semiconductor layer 14 are provided. The semiconductor layer 14 bends in shape along a level difference due to the gate electrode 12. A bottom surface of a portion in which the semiconductor layer 14 does not rise up on the gate electrode 12 is positioned higher than the position of an upper surface of the base 11 by a thickness of the gate insulating film 13. In other words, a difference between a portion in which the semiconductor layer 14 rises up on the gate electrode 12 and the portion in which the semiconductor layer 14 does not rise up on the gate electrode 12 is equal to a thickness of the gate electrode 12.

Figure 2:
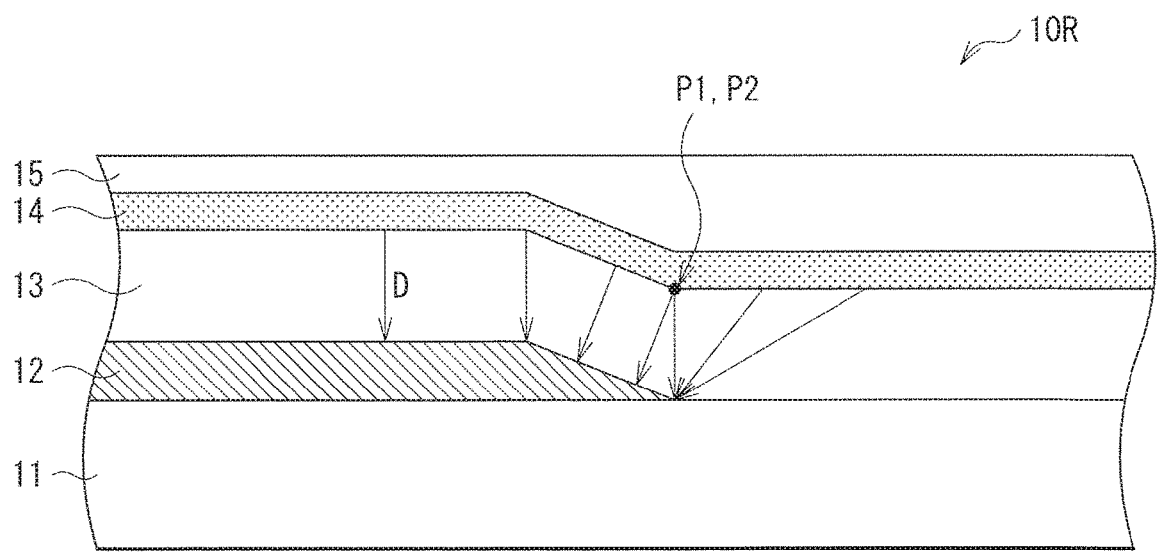
FIG. 2 is a cross-sectional view illustrating, in an enlarged manner, a part of the thin film transistor according to the reference example 1.
Figure 3:
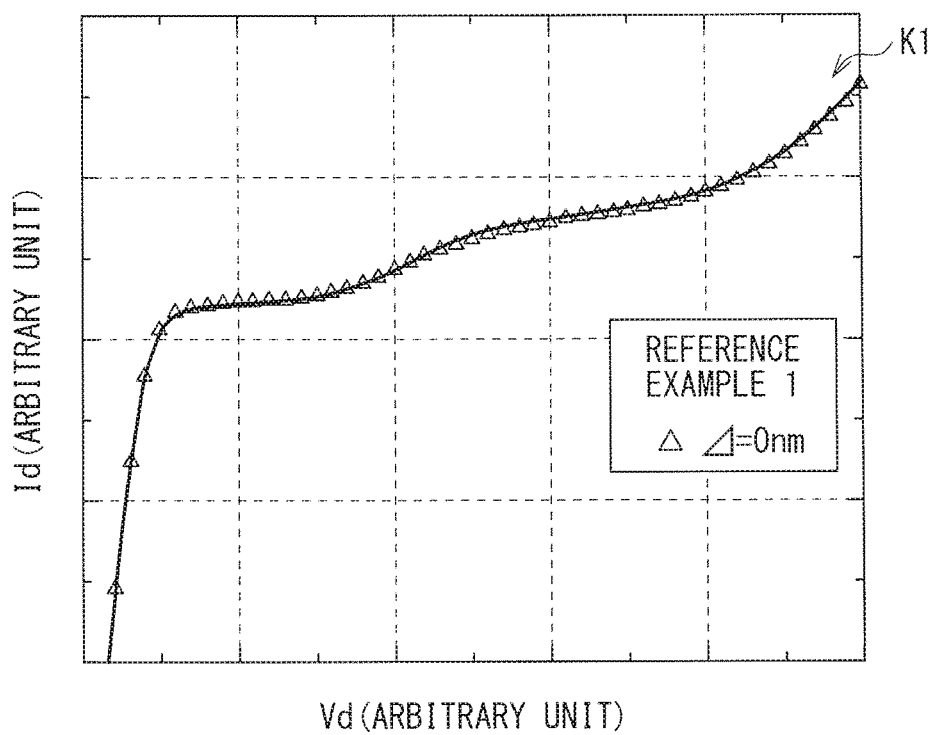
FIG. 3 is a diagram illustrating an Id-Vd curve of the thin film transistor illustrated in FIG. 1.

In the configuration of the reference example 1, as illustrated in FIG. 2, at an edge of the gate electrode 12, there is a sudden increase in a distance D from the semiconductor layer 14 to the gate electrode 12, causing a steep potential change. This leads to an increase in an electric field, also affected by the bending shape of the semiconductor layer 14. That is, a position P1 of the sudden increase in the distance D from the semiconductor layer 14 to the gate electrode 12 coincides with a position P2 where the semiconductor layer 14 bends in shape, involving occurrence of a concentration FC of electric field at the edge of the gate electrode 12, as illustrated in FIG. 1. Thus, impact ionization occurs, causing occurrence of a kink K1 as illustrated in FIG. 3 or degradation in reliability.

In other words, by allowing the position P1 of the sudden increase in the distance D from the semiconductor layer 14 to the gate electrode 12 to be different from the position P2 where the semiconductor layer 14 bends in shape, it is possible to allow the distance D to change gradually, relaxing the concentration of electric field and restraining the kink K1 due to the concentration of electric field.

In the following, description will be given, based on the result of the reference example 1 as described above, on specific example embodiments (first to fourth embodiments).

First Embodiment

Figure 4:
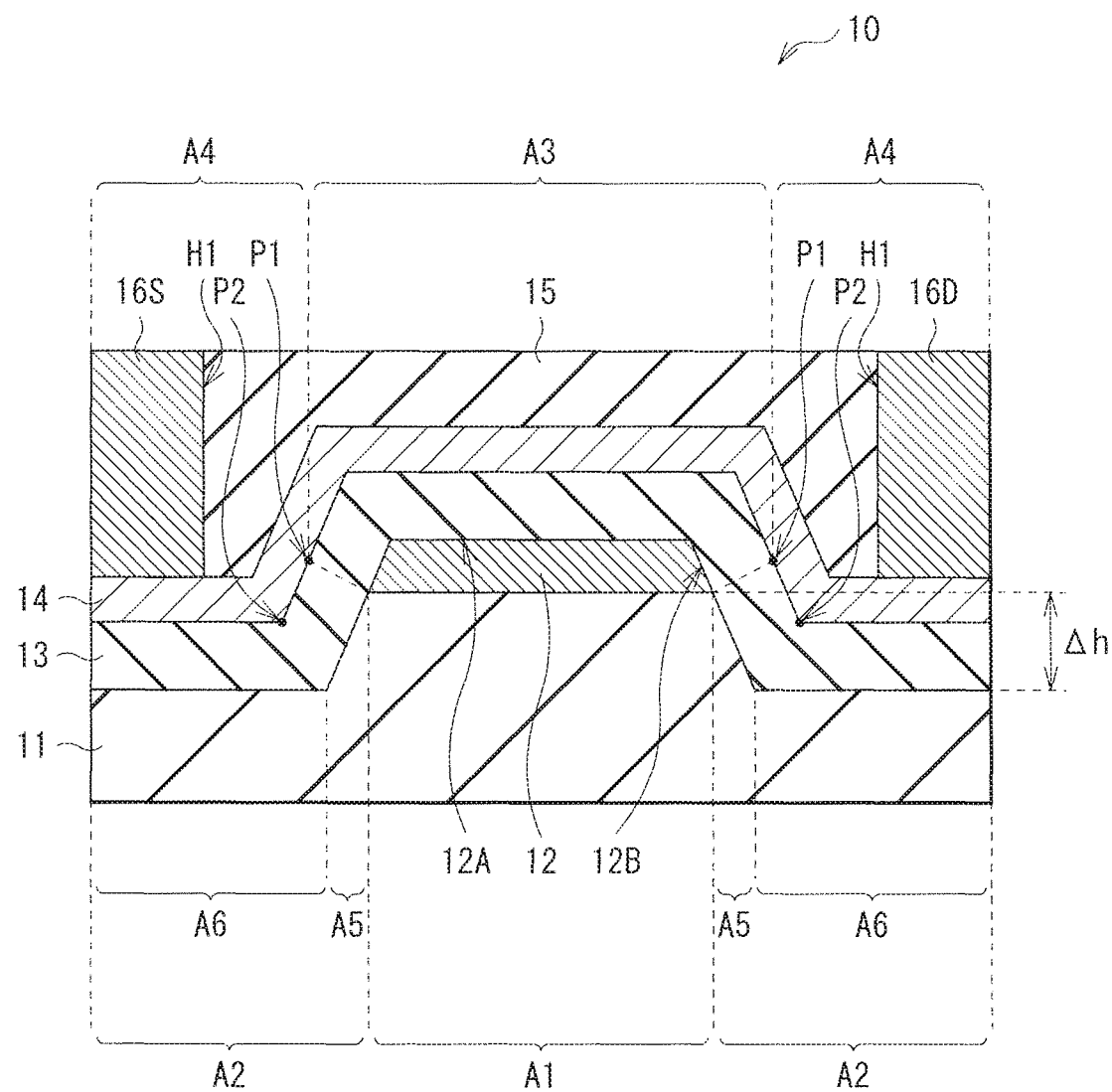
FIG. 4 is a cross-sectional view illustrating a configuration of a thin film transistor according to a first embodiment of the present disclosure.

FIG. 4 illustrates a cross-sectional configuration of a thin film transistor according to a first embodiment of the present disclosure. The thin film transistor 10 may be used in an active matrix drive circuit of a display device such as an organic EL display device or a liquid crystal display device. The thin film transistor 10 is, for example, a TFT of a bottom gate type, and includes, on the base 11, the gate electrode 12, the gate insulating film 13, the semiconductor layer 14, the insulating film (the protective film) 15, the source electrode 16S, and the drain electrode 16D.

The base 11 includes, on an upper surface, a first region A1 and a second region A2 other than the first region A1. The first region A1 is a flat region on which the gate electrode 12 is provided. The gate insulating film 13 is provided on a surface (an upper surface 12A and side surfaces 12B) of the gate electrode 12 and the second region A2 of the base 11. The semiconductor layer 14 is provided on a surface of the gate insulating film 13.

Figure 5:
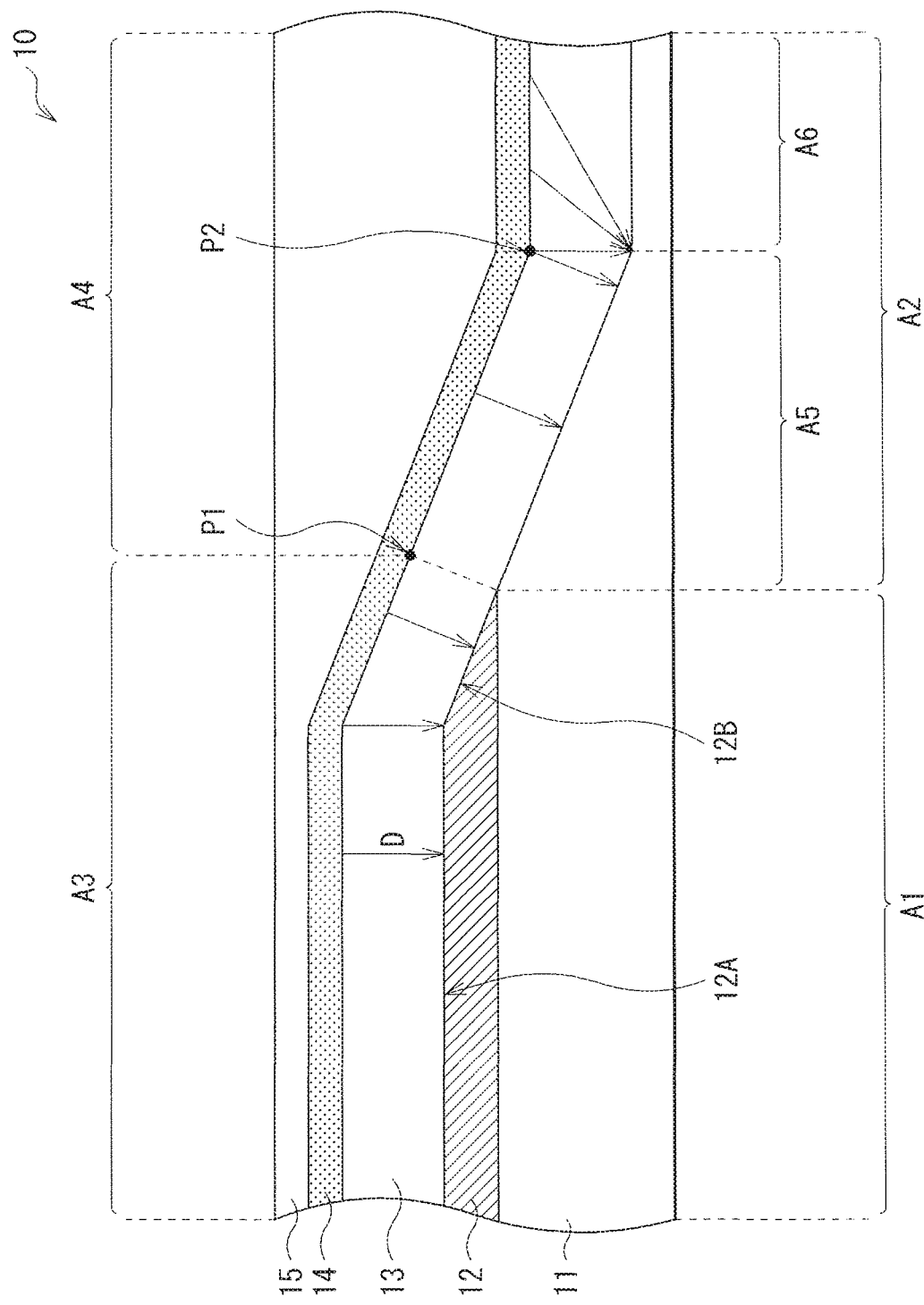
FIG. 5 is a cross-sectional view illustrating, in an enlarged manner, a part of the thin film transistor illustrated in FIG. 4.

In the thin film transistor 10, an upper surface of the first region A1 beneath the gate electrode 12 is positioned at a higher level than an upper surface of the second region A2 other than the first region A1. On the surface of gate electrode 12 and the second region A2 of the base 11, the gate insulating film 13 and the semiconductor layer 14 are provided. Thus, the difference between the portion in which the semiconductor layer 14 rises up on the gate electrode 12 and the portion in which the semiconductor layer 14 does not rise up on the gate electrode 12 is larger than the thickness of the gate electrode 12. Accordingly, as illustrated in FIG. 5 in an enlarged manner, at the edge of the gate electrode 12, there is a more gradual change in the difference D from the semiconductor layer 14 to the gate electrode 12 as compared to the reference example 1, causing a gradual potential change. That is, the position P1 where the distance D from the semiconductor layer 14 to the gate electrode 12 changes does not coincide with the position P2 where the semiconductor layer 14 bends in shape. This makes it possible to relax the concentration of the electric field at the edge of the gate electrode 12.

In other words, the semiconductor layer 14 includes a third region A3 and a fourth region A4 other than the third region A3. In the third region A3, the semiconductor layer 14 and the gate electrode 12 face with a minimum interval (i.e. a length of a perpendicular drawn down from a point of a bottom surface of the semiconductor layer 14 to the gate electrode 12, or a thickness of a gate insulating film 13). In the fourth region A4, the distance D from the semiconductor layer 14 to the gate electrode 12 is larger than the minimum interval. At a boundary position P1 between the third region A3 and the fourth region A4, the semiconductor layer 14 forms a linear shape or a substantially linear shape. Thus, in the display device 10, it is possible to relax the local concentration of electric field in the semiconductor layer 14. It is to be noted that "a linear shape or a substantially linear shape" includes not only a line as geometrically defined but also what may be called substantially a line in consideration of processing precision in a manufacturing procedure.

Moreover, the base 11 includes, in the second region A2, a fifth region A5 and a sixth region A6. The fifth region A5 is inclined with respect to the first region A1. The sixth region A6 is parallel to the first region A1, that is, a flat region. The boundary position P1 between the third region A3 and the fourth region A4 of the semiconductor layer 14 is different from the position P2 where the semiconductor layer 14 bends in shape at a boundary between the fifth region A5 and the sixth region A6 of the base 11. In this way, the degree of bending of the shape of the semiconductor layer 14 becomes small, causing a more gradual change in the distance D from the semiconductor layer 14 to the gate electrode 12 as compared to the reference example 1. As a result, it is possible to relax the concentration of electric field and to restrain a kink due to the concentration of electric field. A level difference Δh between the first region A1 and the sixth region A6 of the base 11 may preferably be larger than the thickness of the gate electrode 12.

Furthermore, the gate electrode 12 includes an upper surface 12A and side surfaces 12B. The upper surface 12A is parallel to the first region A1. The side surfaces 12B are inclined with respect to the first region A1. The side surface 12B of the gate electrode 12 and the fifth region A5 form a linear shape or a substantially linear shape. In this way, it is possible to reduce the degree of bending in shape of the semiconductor layer 14 at the boundary position P1, allowing the change in the distance D at the boundary position P1 to be more gradual.

Materials of the respective layers of the thin film transistor 10 are as follows.

The base 11 is configured of, for example, an insulating substrate such as a glass substrate. The base 11 may be a plastic film or a metal substrate such as stainless steel (SUS) depending on purposes. Examples of plastic materials may include polyethylene telephthalate (PET) and polyethylene naphthalate (PEN).

The gate electrode 12 is adapted to control a carrier density (an electron density as exemplified) in the semiconductor layer 14 according to a gate voltage applied to the thin film transistor 10. The gate electrode 12 may be configured of, for example, a single layer film of one of low resistance metals such as aluminum (Al) and copper (Cu), titanium (Ti), and molybdenum (Mo), and so on. The gate electrode 12 may be configured of a layered film of two or more of the above-mentioned materials.

The gate insulating film 13 and the insulating film 15 may be configured of a single layer film or a layered film of a silicon oxide film, a silicon nitride film, a silicon oxide nitride film, an aluminum oxide film, and so on.

The semiconductor layer 14 is provided, on the gate insulating film 13, in an island form that includes the gate electrode 12 and the neighborhood of the gate electrode 12. The semiconductor layer 14 has a function of an active layer of the thin film transistor 10. The semiconductor layer 14 may be configured of amorphous silicon, crystalline silicon (for example, polysilicon), an oxide semiconductor, an organic semiconductor, and so on. An oxide semiconductor refers to a compound that includes an element or elements such as indium, gallium, zinc, and tin, and oxygen. Specifically, examples of amorphous oxide semiconductors may include indium gallium zinc oxide (IGZO) and indium tin zinc oxide (ITZO), and so on. Examples of crystalline oxide semiconductors may include zinc oxide (ZnO), indium zinc oxide (IZO (a registered trademark)), indium gallium oxide (IGO), indium tin oxide (ITO), indium oxide (InO), and so on. Examples of organic semiconductors may include perixanthenoxanthene (PXX) derivatives, pentacene ($C_{22}H_{14}$), polythiophene, and so on.

The source electrode 16S and the drain electrode 16D may be configured of, for example, a single layer film of one of low resistance metals such as aluminum (Al) and copper (Cu), titanium (Ti), and molybdenum (Mo), and so on. The source electrode 16S and the drain electrode 16D may be configured of a layered film of two or more of the above-mentioned materials. The source electrode 16S and the drain electrode 16D are connected to the semiconductor layer 14 through contact holes H1 that are provided in the insulating film 15.

The thin film transistor 10 may be manufactured, for example, as follows.

Figure 6:
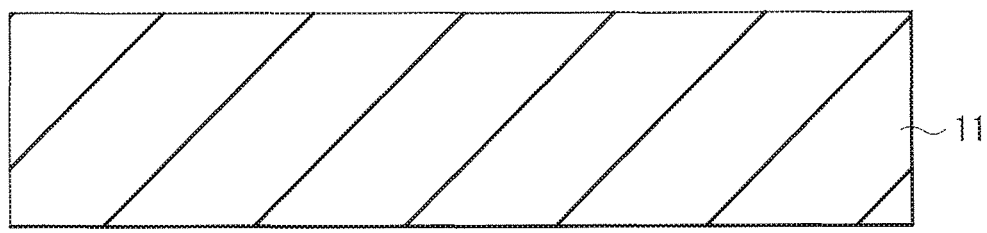
FIG. 6 is a cross-sectional view illustrating a method of manufacturing the thin film transistor illustrated in FIG. 4 in the order of procedure.
Figure 7:
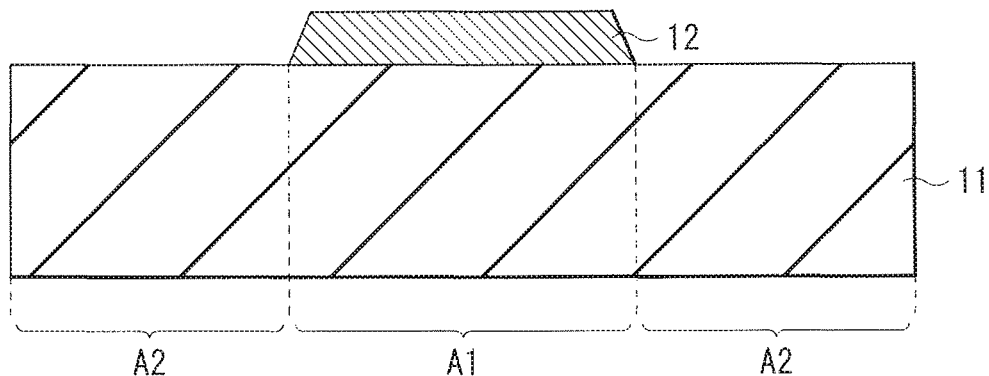
FIG. 7 is a cross-sectional view illustrating a process following FIG. 6.

FIGS. 6 to 13 illustrate a method of manufacturing the thin film transistor 10 in the order of procedure. First, as illustrated in FIG. 6, the base 11 that is configured of, for example, a glass substrate is prepared. On the base 11, a gate electrode material film (not illustrated) that is configured of, for example, molybdenum is formed by, for example, a sputtering method. Next, the gate electrode material film is subjected to photolithography and etching. Thus, as illustrated in FIG. 7, the gate electrode 12 is patterned in the first region A1 of the base 11.

Figure 8:
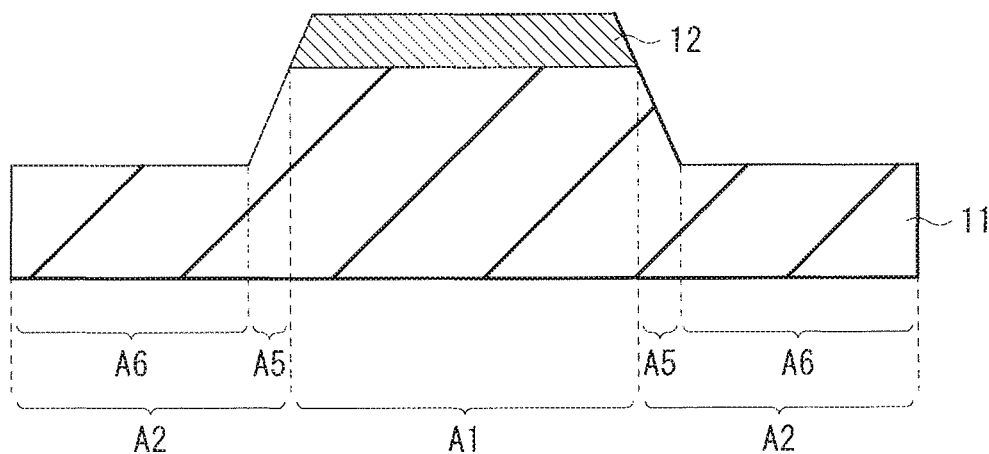
FIG. 8 is a cross-sectional view illustrating a process following FIG. 7.

Subsequently, as illustrated in FIG. 8, the second region A2 of the base 11 is etched with the gate electrode 12 as a mask. Thus, in the second region A2 of the base 11, the fifth region A5 and the sixth region A6 are formed. The fifth region A5 is inclined with respect to the first region A1. The sixth region A6 is parallel to the first region A1. A taper angle in etching the base 11 may be desirably same as a taper angle of the side surface 12B of the gate electrode 12; the side surface 12B of the gate electrode 12 and the fifth region A5 may desirably form a linear shape or a substantially linear shape; but this is not limitative. Moreover, the second region A2 of the base 11 may be preferably etched deeper than the thickness of the gate electrode 12. Thus, it is possible to allow the level difference Δh (FIG. 4) between the first region A1 and the sixth region A6 to be larger than the thickness of the gate electrode 12.

Figure 9:
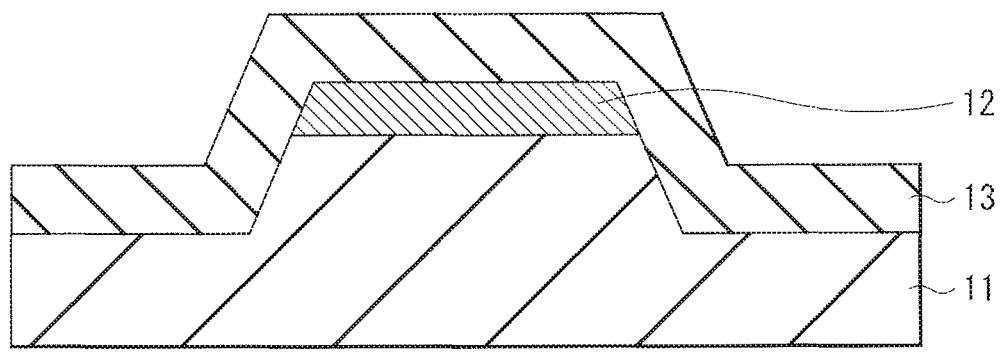
FIG. 9 is a cross-sectional view illustrating a process following FIG. 8.

After this, as illustrated in FIG. 9, on the surface of the gate electrode 12 and the second region A2 of the base 11, the gate insulating film 13 is formed by, for example, a chemical vapor deposition (CVD) method. The gate insulating film 13 may be configured of, for example, a layered film of a silicon nitride film and a silicon oxide film. The gate insulating film 13 may be preferably formed with a uniform thickness.

Figure 10:
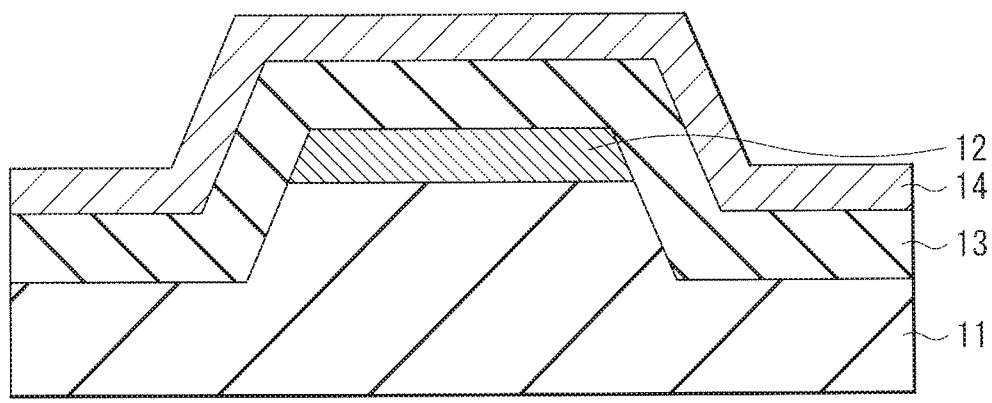
FIG. 10 is a cross-sectional view illustrating a process following FIG. 9.

After forming the gate insulating film 13, on the surface of the gate insulating film 13, a semiconductor material film (not illustrated), which is configured of the above-mentioned material, specifically polysilicon, is formed. The semiconductor material film is patterned to a predetermined shape by, for example, photolithography and etching. Thus, as illustrated in FIG. 10, the semiconductor layer 14 is formed. The semiconductor layer 14 may be preferably formed with a uniform thickness.

Figure 11:
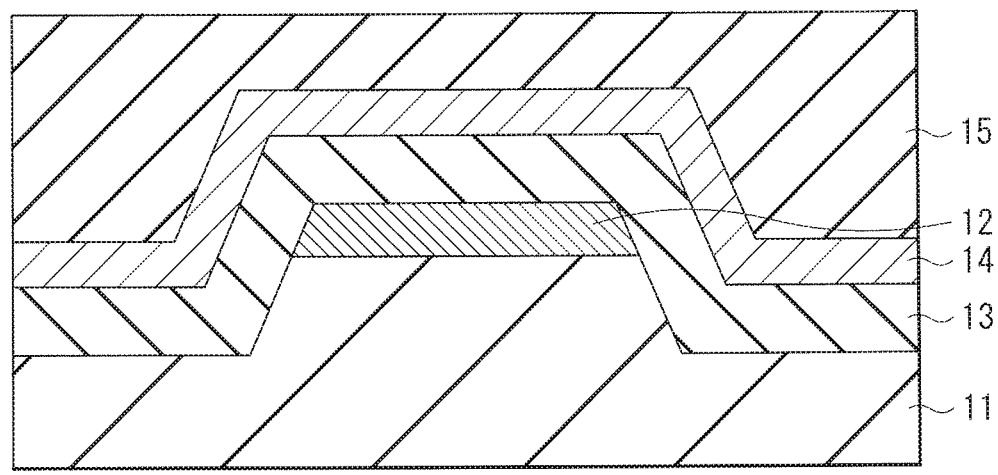
FIG. 11 is a cross-sectional view illustrating a process following FIG. 10.

After forming the semiconductor layer 14, as illustrated in FIG. 11, on the surface of the semiconductor layer 14, the insulating film 15 is formed by, for example, a CVD method. The insulating film 15 may be configured of a layered film of a silicon oxide film and a silicon nitride film.

Figure 12:
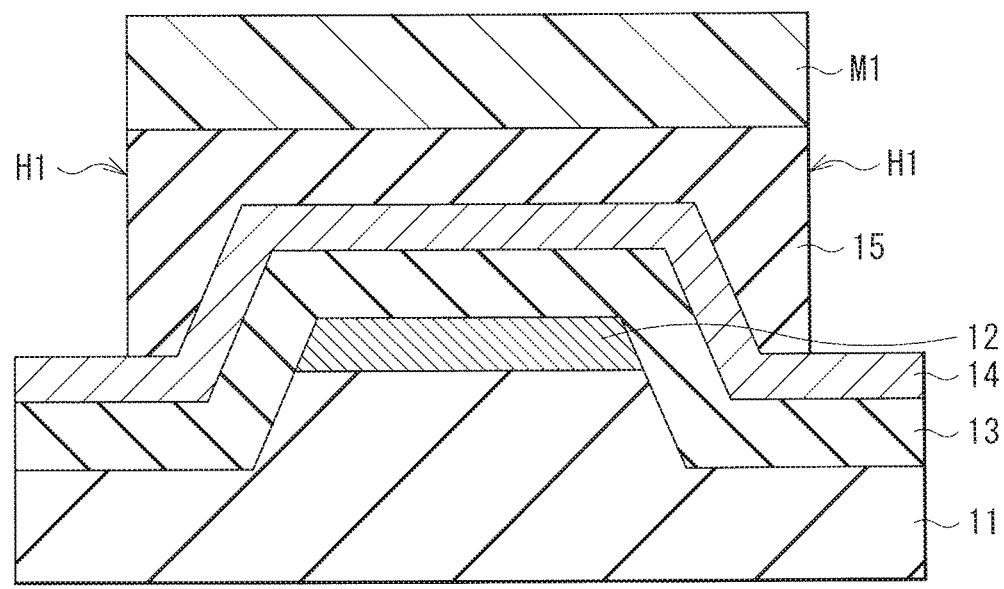
FIG. 12 is a cross-sectional view illustrating a process following FIG. 11.
Figure 13:
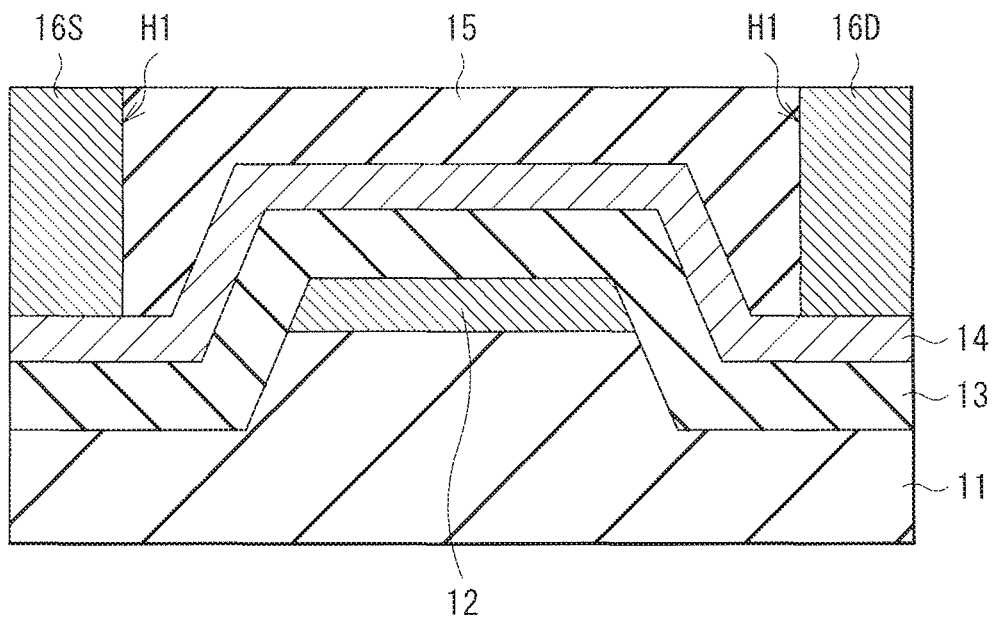
FIG. 13 is a cross-sectional view illustrating a process following FIG. 12.

After forming the insulating film 15, as illustrated in FIG. 12, a mask M1, which is configured of a resist film, is formed on the insulating film 15. By etching with the use of the mask M1, the contact holes H1 are formed in the insulating film 15. Subsequently, as illustrated in FIG. 13, the source electrode 16S and the drain electrode 16D are formed. The source electrode 16S and the drain electrode 16D are connected to the semiconductor layer 14 through the contact holes H1. Thus, the thin film transistor 10 as illustrated in FIG. 4 is completed.

Figure 14:
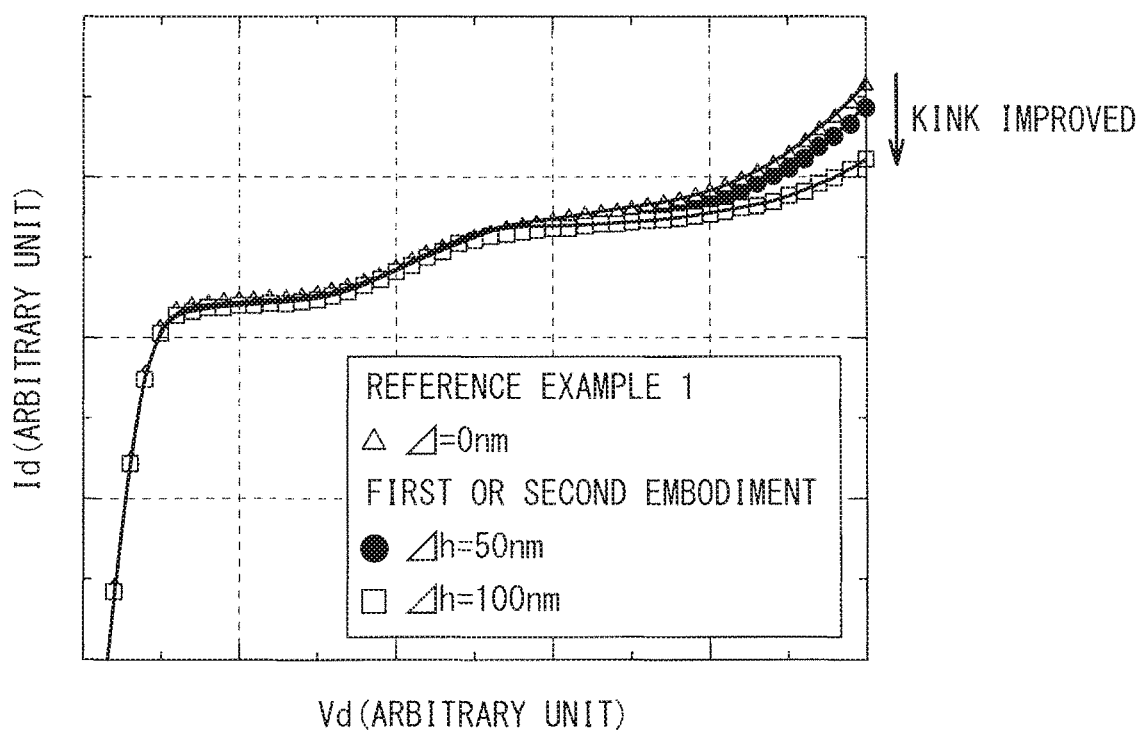
FIG. 14 is a diagram illustrating an Id-Vd curve of the thin film transistor illustrated in FIG. 4 in comparison with the reference example 1.

FIG. 14 illustrates an Id-Vd characteristic of the thin film transistor 10. It is to be noted that the FIG. 14 also illustrates the result of the reference example 1 as well.

As seen from FIG. 14, in the thin film transistor 10 according to the present embodiment, an amount of kink occurring is reduced as compared to the reference example 1. A possible reason may be as follows. In the present embodiment, the position P1 of the change in the distance D from the semiconductor layer 14 to the gate electrode 12 is apart from the position P2 where the semiconductor layer 14 bends in shape. This allows a gradual change in the distance D, relaxing the concentration of electric field at the edge of the gate electrode 12. That is, it is known that if the semiconductor layer 14 forms a linear shape or a substantially linear shape at the boundary position P1 between the third region A3 and the fourth region A4 of the semiconductor layer 14, it is possible to relax the local concentration of electric field in the semiconductor layer 14.

As described above, in the present embodiment, the semiconductor layer 14 forms a linear shape or a substantially linear shape at the boundary position P1 between the third region A3 and the fourth region A4 of the semiconductor layer 14. Hence, it is possible to reduce the degree of bending of the shape of the semiconductor layer 14, allowing the distance D from the semiconductor layer 14 to the gate electrode 12 to change gradually and relaxing the local concentration of electric filed in the semiconductor layer 14.

In particular, in the second region A2 of the base 11, the fifth region A5 and the sixth region A6 are formed. The fifth region A5 is inclined with respect to the first region A1. The sixth region A6 is parallel to the first region A1. The boundary position P1 between the third region A3 and the fourth region A4 of the semiconductor layer 14 is different from the position P2 where the semiconductor layer 14 bends in shape at the boundary between the fifth region A5 and the sixth region A6. Hence, it is possible to reduce the degree of bending of the shape of the semiconductor layer 14 at the boundary position P1, allowing the distance D to change more gradually.

Modification Example 1

Figure 15:
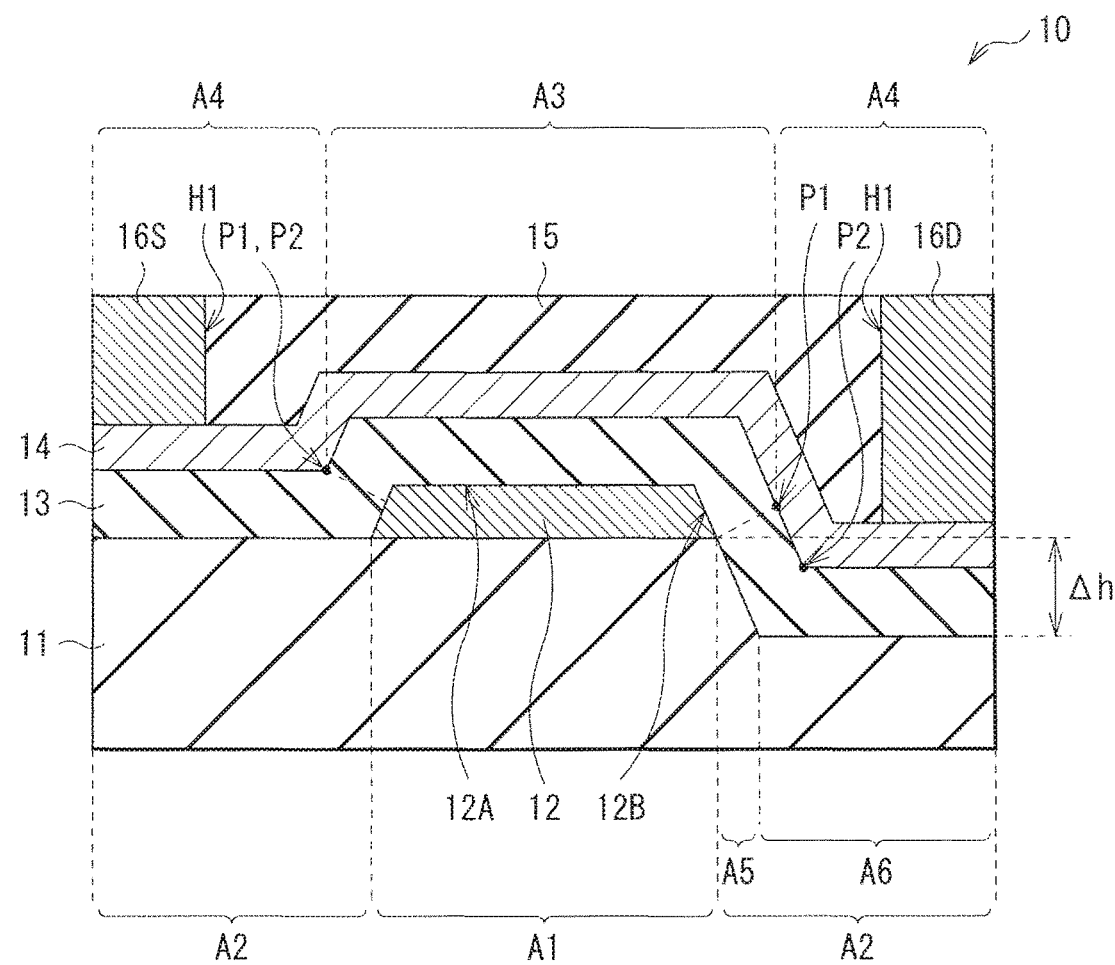
FIG. 15 is a cross-sectional view illustrating a configuration of a thin film transistor according to a modification example 1.

In the above-described first embodiment, description has been given on a case that the fifth region A5 is provided both on the source side and on the drain side of the gate electrode 12. However, as illustrated in FIG. 15, the fifth region A5 may be provided on the drain side of the gate electrode 12. In the thin film transistor 10 that drives a display device, since a high voltage is applied to the drain, the concentration of electric field is likely to occur on the drain side of the gate electrode 12 in particular. By providing the fifth region A5 on the drain side of the gate electrode 12, it is possible to relax the concentration of electric field occurring on the drain side.

Modification Example 2

Figure 16:
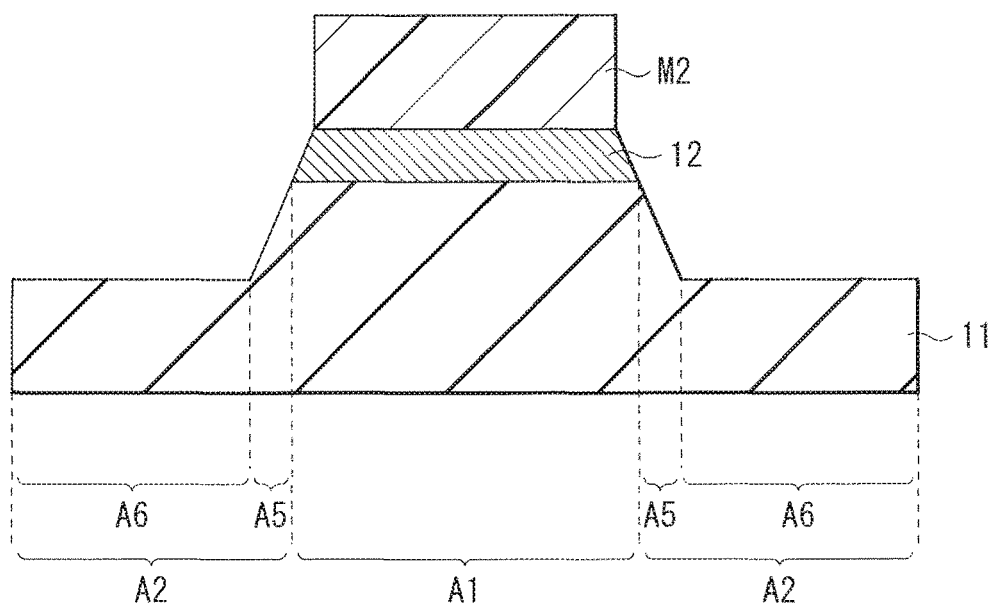
FIG. 16 is a cross-sectional view illustrating a process in a method of manufacturing a thin film transistor according to a modification example 2.

Moreover, in the above-described first embodiment, description has been given on a case that, in etching the second region A2 of the base 11, the gate electrode 12 is used as a mask. However, as illustrated in FIG. 16, in etching the second region A2 of the base 11, a resist film having a same layout as the gate electrode 12 may be used as a mask M2.

Second Embodiment

Figure 17:
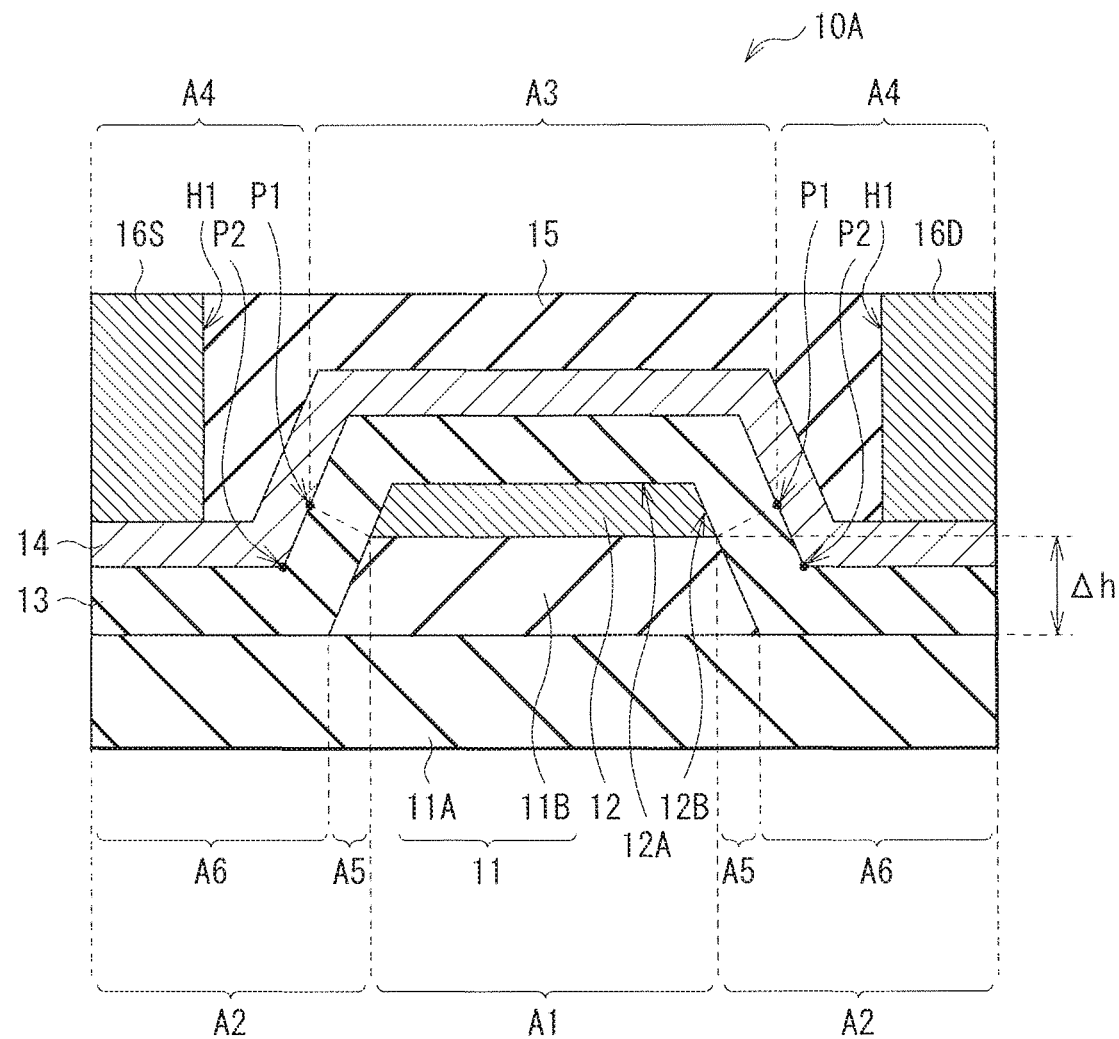
FIG. 17 is a cross-sectional view illustrating a configuration of a thin film transistor according to a second embodiment of the present disclosure.

FIG. 17 illustrates a cross-sectional configuration of a thin film transistor 10A according to a second embodiment of the present disclosure. The thin film transistor 10A according to the present embodiment is provided with an insulating layer that is separate from a glass substrate, in a portion of the base 11 beneath the gate electrode 12. Otherwise, configurations, functions, and effects are similar to those of the thin film transistor 10 according to the above-described first embodiment. Thus, description will be given with similar components denoted by similar reference numerals.

The base 11 is configured of a laminated body of a first insulating layer 11A and a second insulating layer 11B. The first insulating layer 11A serves as a support of the whole thin film transistor 10A, and may be configured of, for example, a glass substrate. The second insulating layer 11B is provided in a region beneath the gate electrode 12, and may be configured of, for example, a single layer film or a layered film of a silicon oxide film, a silicon nitride film, a silicon nitride oxide film, an aluminum oxide film, and so on. That is, the first region A1 of the base 11 has a configuration in which the second insulating layer 11B is laminated on the first insulating layer 11A. The fifth region A5 is configured of a side surface of the second insulating layer 11B. The sixth region A6 is configured of an upper surface of the first insulating layer 11A.

The thin film transistor 10A may be manufactured, for example, as follows.

Figure 18:
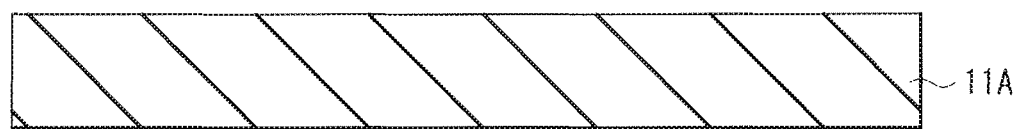
FIG. 18 is a cross-sectional view illustrating a method of manufacturing the thin film transistor illustrated in FIG. 17 in the order of procedures.
Figure 19:
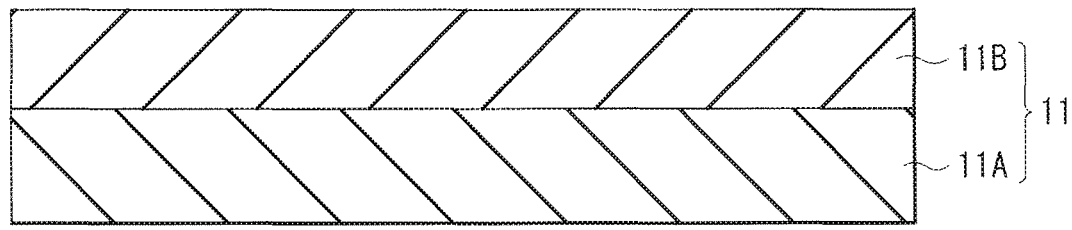
FIG. 19 is a cross-sectional view illustrating a process following FIG. 18.

FIGS. 18 to 26 illustrate a method of manufacturing the thin film transistor 10A in the order of procedure. First, as illustrated in FIG. 18, the first insulating layer 11A that is configured of, for example, a glass substrate is prepared. On the first insulating layer 11A, the second insulating layer 11B is formed. Thus, as illustrated in FIG. 19, the base 11 that is configured of a laminated body of the first insulating layer 11A and the second insulating layer 11B is formed.

Figure 20:
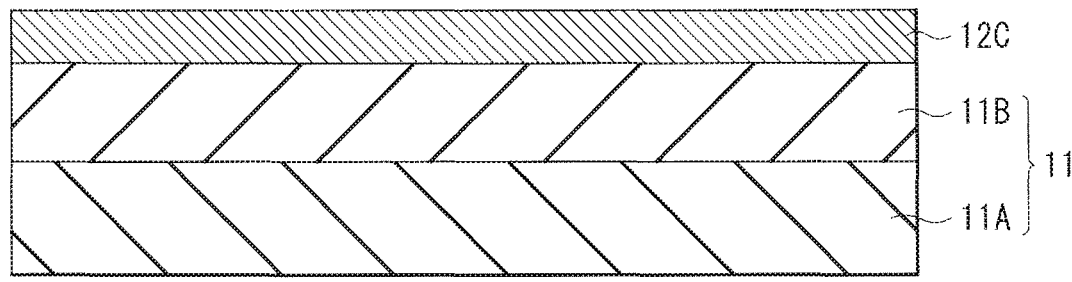
FIG. 20 is a cross-sectional view illustrating a process following FIG. 19.

Next, as illustrated in FIG. 20, on the second insulating layer 11B of the base 11, a gate electrode material film 12C that is configured of, for example, a metal such as molybdenum is formed by, for example, a sputtering method.

Subsequently, the gate electrode material film 12C is subjected to photolithography and etching. Thus, as illustrated in FIG. 21, the gate electrode 12 is patterned in the first region A1 of the base 11.

Figure 21:
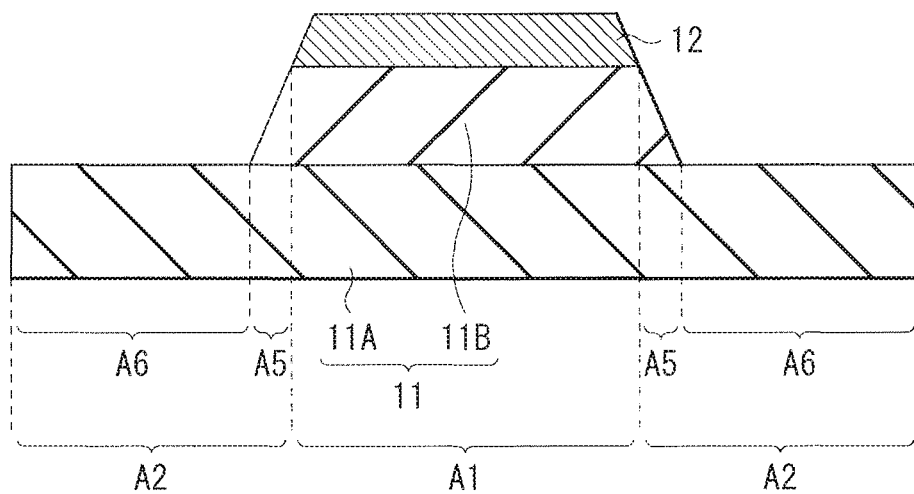
FIG. 21 is a cross-sectional view illustrating a process following FIG. 20.

Furthermore, as illustrated in FIG. 21 as well, the second region A2 of the base 11 is etched using, as a mask, the gate electrode 12 or a resist film (not illustrated) having a same layout as the gate electrode 12. Thus, in the second region A2 of the base 11, the fifth region A5 and the sixth region A6 are formed. The fifth region A5 is inclined with respect to the first region A1. The sixth region A6 is parallel to the first region A1. The first region A1 has a configuration in which the second insulating layer 11B is laminated on the first insulating layer 11A. The fifth region A5 is configured of the side surface of the second insulating layer 11B. The sixth region A6 is configured of the upper surface of the first insulating layer 11A. The taper angle in etching the base 11 may be desirably same as the taper angle of the side surface 12B of the gate electrode 12; the side surface 12B of the gate electrode 12 and the fifth region A5 may desirably form a linear shape or a substantially linear shape; but this is not limitative.

Figure 22:
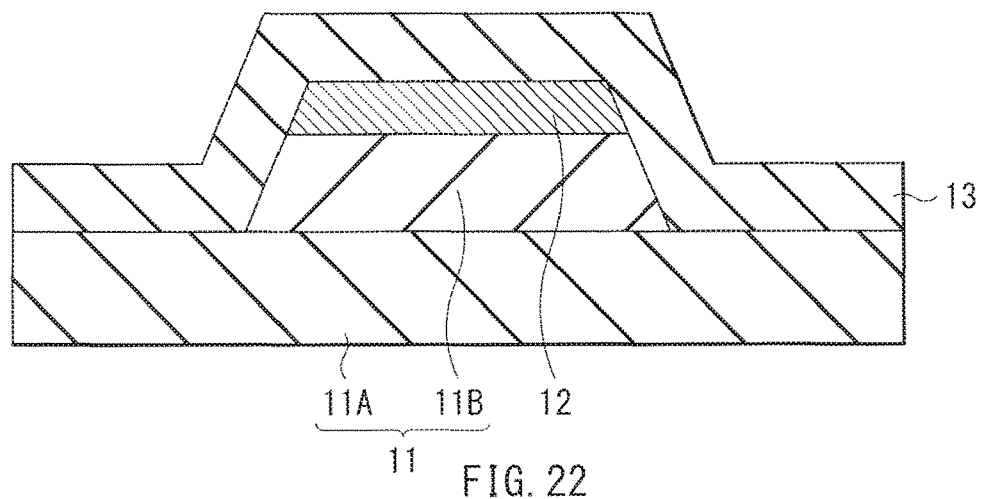
FIG. 22 is a cross-sectional view illustrating a process following FIG. 21.

After this, as illustrated in FIG. 22, on the surface of the gate electrode 12 and the second region A2 of the base 11, the gate insulating film 13 is formed by, for example, a CVD method. The gate insulating film 13 may be configured of, for example, a layered film of a silicon nitride film and a silicon oxide film. The gate insulating film 13 may be preferably formed with a uniform thickness.

Figure 23:
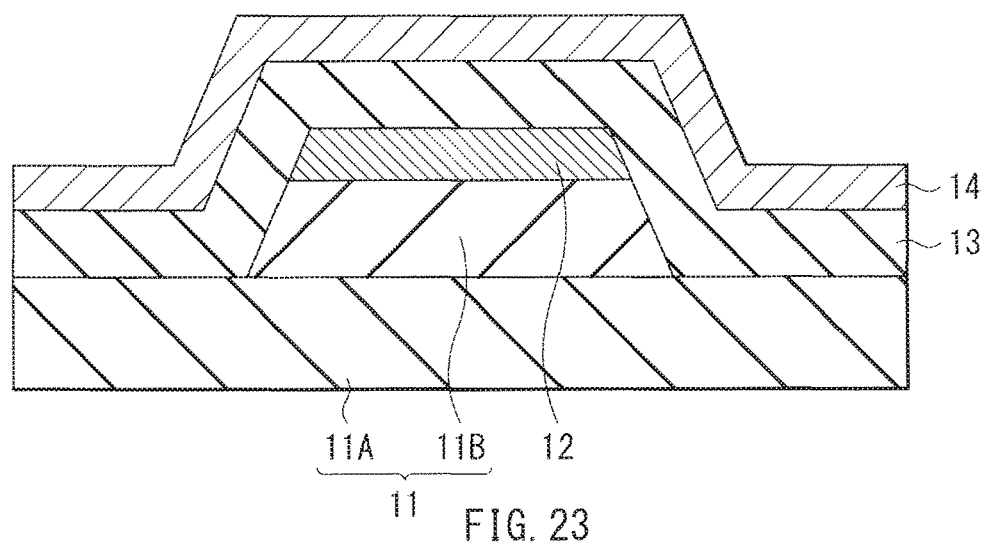
FIG. 23 is a cross-sectional view illustrating a process following FIG. 22.

After forming the gate insulating film 13, on the surface of the gate insulating film 13, a semiconductor material film (not illustrated), which is configured of the above-mentioned material, specifically polysilicon, is formed. The semiconductor material film is patterned to a predetermined shape by, for example, photolithography and etching. Thus, as illustrated in FIG. 23, the semiconductor layer 14 is formed. The semiconductor layer 14 may be preferably formed with a uniform thickness.

Figure 24:
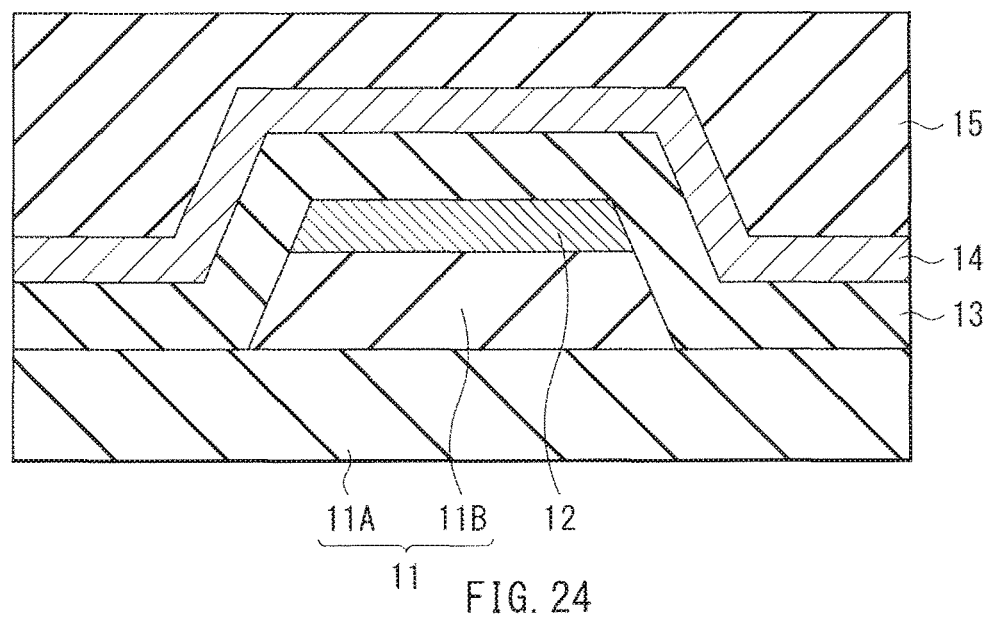
FIG. 24 is a cross-sectional view illustrating a process following FIG. 23.

After forming the semiconductor layer 14, as illustrated in FIG. 24, on the surface of the semiconductor layer 14, the insulating film 15 is formed by, for example, a CVD method. The insulating film 15 may be configured of a layered film of a silicon oxide film and a silicon nitride film.

Figure 25:
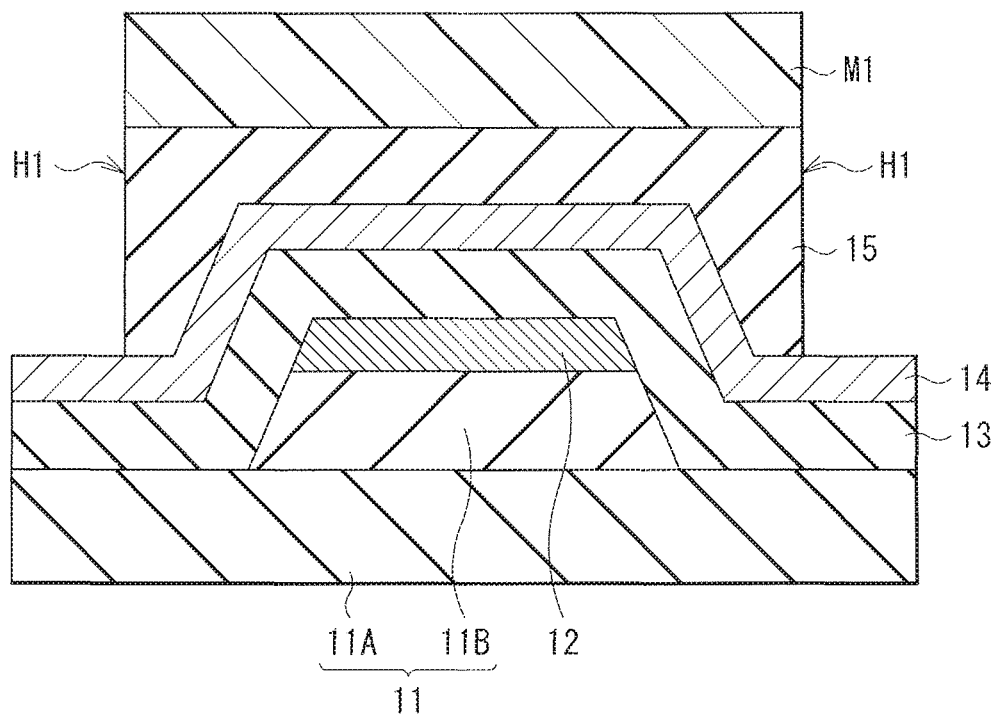
FIG. 25 is a cross-sectional view illustrating a process following FIG. 24.
Figure 26:
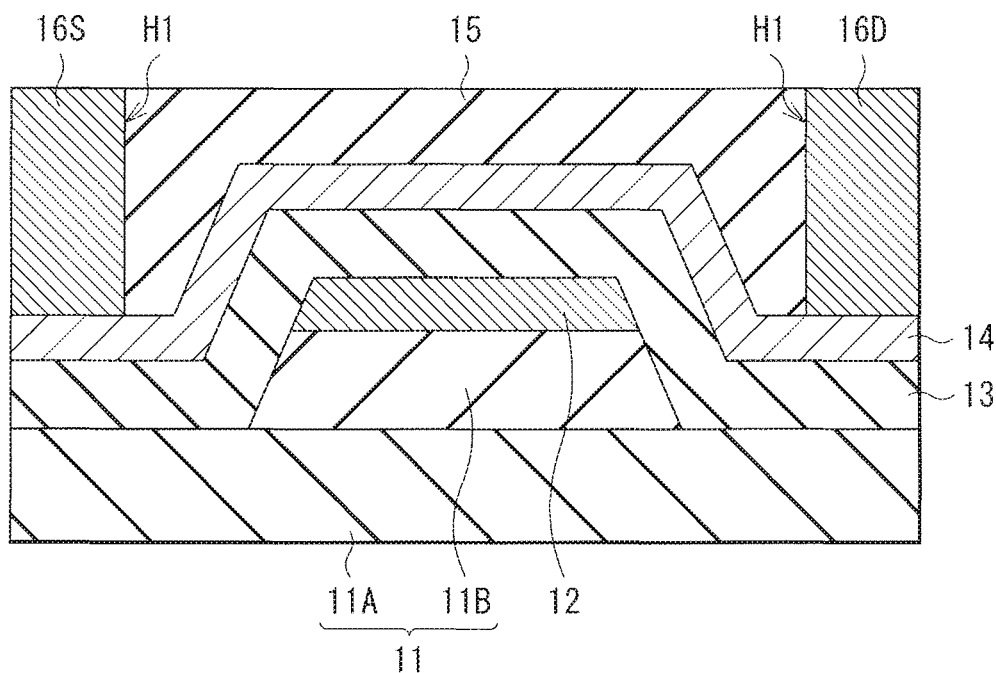
FIG. 26 is a cross-sectional view illustrating a process following FIG. 25.

After forming the insulating film 15, as illustrated in FIG. 25, a mask M1, which is configured of a resist film, is formed on the insulating film 15. By etching with the use of the mask M1, the contact holes H1 are formed in the insulating film 15. Subsequently, as illustrated in FIG. 26, the source electrode 16S and the drain electrode 16D are formed. The source electrode 16S and the drain electrode 16D are connected to the semiconductor layer 14 through the contact holes H1. Thus, the thin film transistor 10A as illustrated in FIG. 17 is completed.

The Id-Vd characteristic of the thin film transistor 10A is similar to the description in the first embodiment with reference to the FIG. 14.

As described above, in the present embodiment, in addition to effects of the above-described first embodiment, it is possible to obtain the following effects. The first region A1 of the base 11 is a laminated body in which the second insulating layer 11B is laminated on the first insulating layer 11A. The fifth region A5 is configured of the side surface of the second insulating layer 11B. The sixth region A6 is configured of the upper surface of the first insulating layer 11A. Hence, it is possible to form the fifth region A5 easily and with high precision.

Third Embodiment

Figure 27:
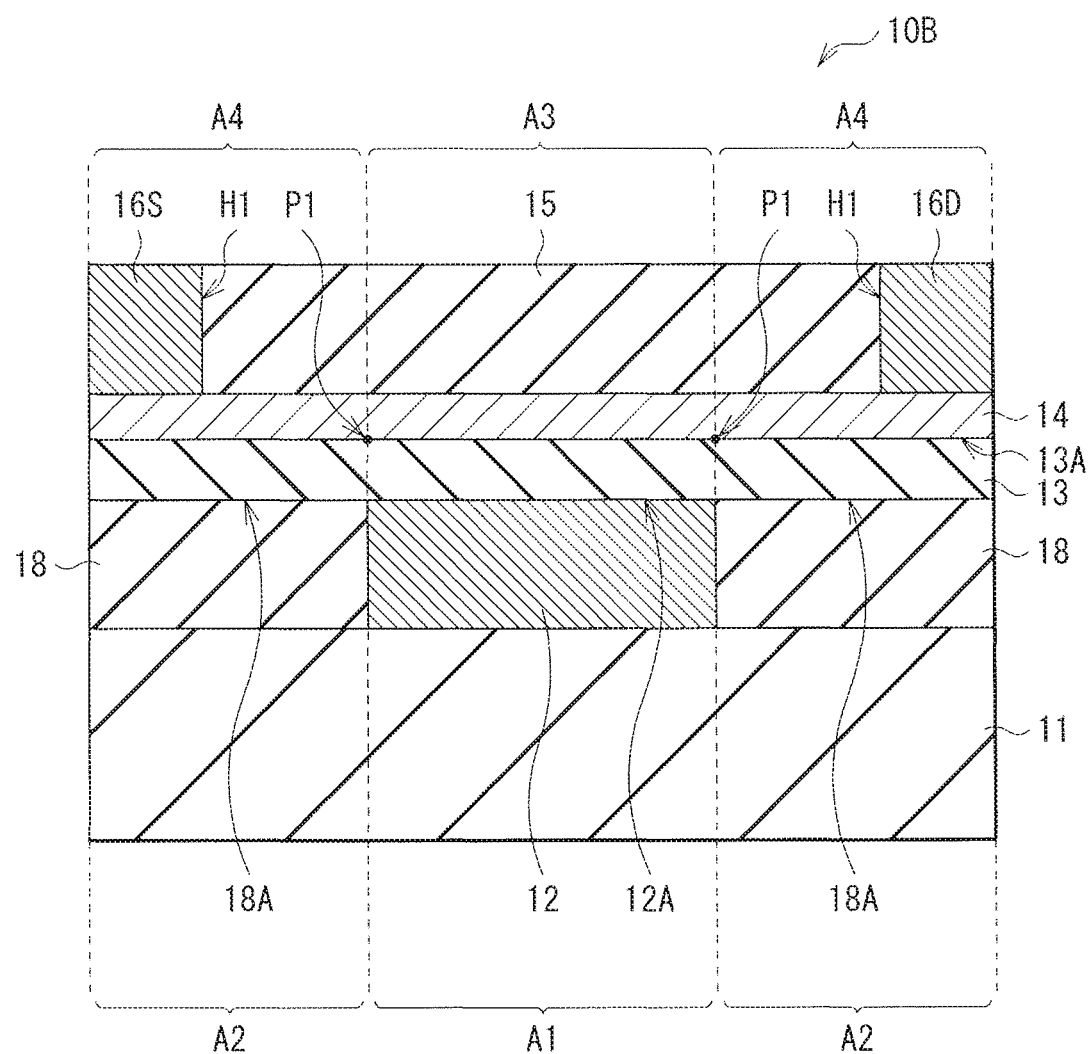
FIG. 27 is a cross-sectional view illustrating a configuration of a thin film transistor according to a third embodiment of the present disclosure.

FIG. 27 illustrates a cross-sectional configuration of the thin film transistor 10B according to a third embodiment of the present embodiment. In the thin film transistor 10B according to the present embodiment, the semiconductor layer 14 has a linear shape with little level difference. Otherwise, configurations, functions, and effects are similar to those of the thin film transistor 10 according to the above-described first embodiment. Thus, description will be given with similar components denoted by similar reference numerals.

Figure 28:
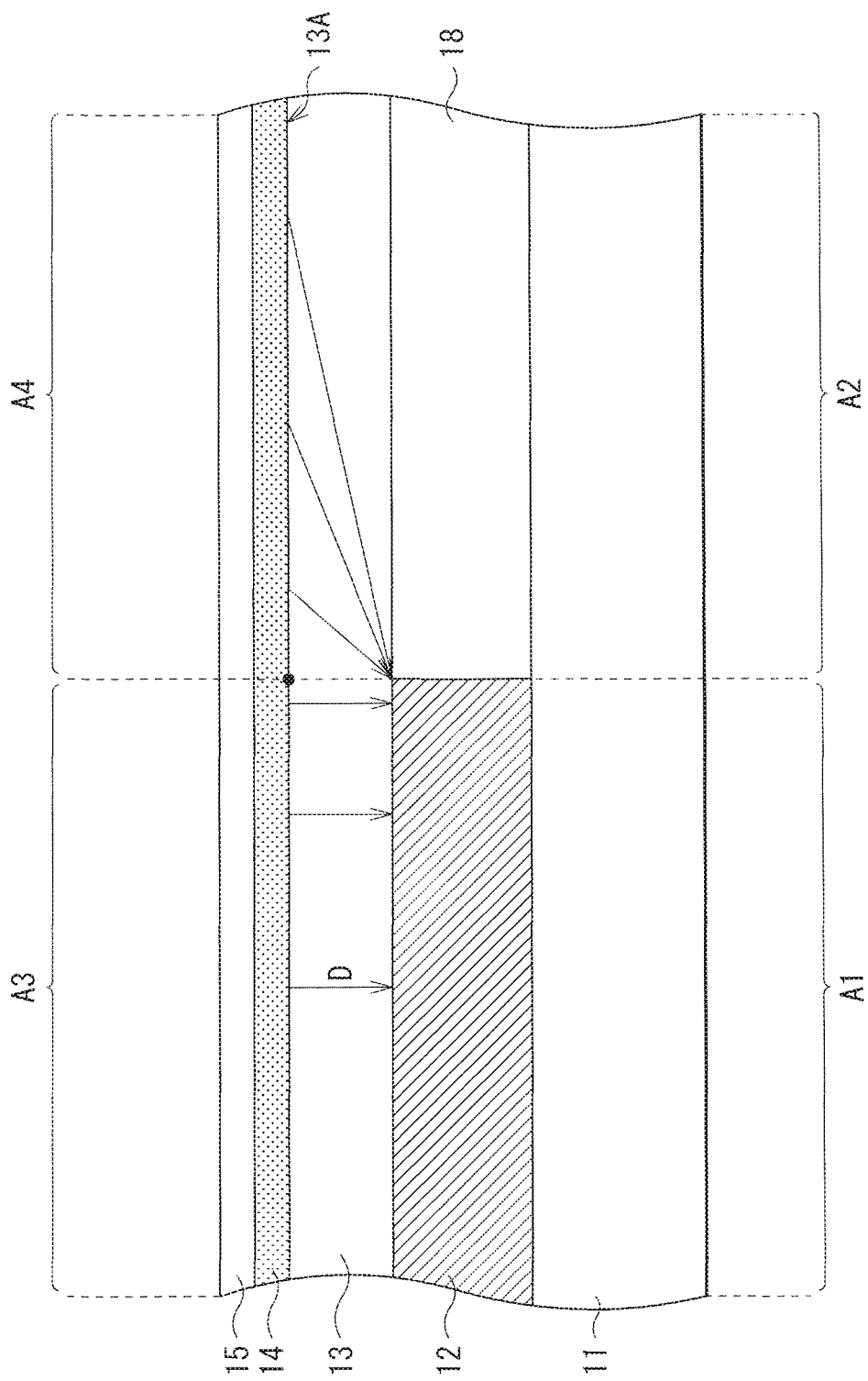
FIG. 28 is a cross-sectional view illustrating, in an enlarged manner, a part of the thin film transistor illustrated in FIG. 27.

In the thin film transistor 10B, there is provided a spacer layer 18 in the second region A2 of the base 11, allowing the surface 13A (also referred to as the upper surface 13A in the followings) of the gate insulating film 13 to be flat. The semiconductor layer 14 is formed in a linear shape parallel to the first region A1. That is, the semiconductor layer 14 is formed as a flat layer. Thus, as illustrated in FIG. 28 in an enlarged manner, there is no position P2 where the semiconductor layer 14 bends in shape. This allows a gradual change in the distance D from the semiconductor layer 14 to the gate electrode 12 at the boundary position P1 between the third region A3 and the fourth region A4, making it possible to relax the local concentration of electric field in the semiconductor layer 14.

Here, a surface may be sufficiently described "flat" if unevenness of the surface is smaller than the thickness of the gate electrode 12. Also, a layer may be described "flat" if both an upper surface and a lower surface of the layer satisfy the above-mentioned definition of flatness of a surface.

The spacer layer 18 is adapted to eliminate or relax a level difference due to the thickness of the gate electrode 12, allowing the upper surface 13A of the gate insulating film 13 to be flat. The spacer layer 18 is provided in the second region A2 of the base 11, and has a thickness that is equal to or substantially equal to the thickness of the gate electrode 12. An upper surface 18A of the spacer layer 18 forms a linear shape or a substantially linear shape that is continuous with the upper surface 12A of the gate electrode 12, forming a parallel surface to the first region A1.

The spacer layer 18 may be configured of, for example, a single layer film or a layered film of a resin, a silicon oxide film, a silicon nitride film, a silicon nitride oxide film, or an aluminum oxide film, or the like.

The thin film transistor 10B may be manufactured, for example, as follows.

Figure 29:
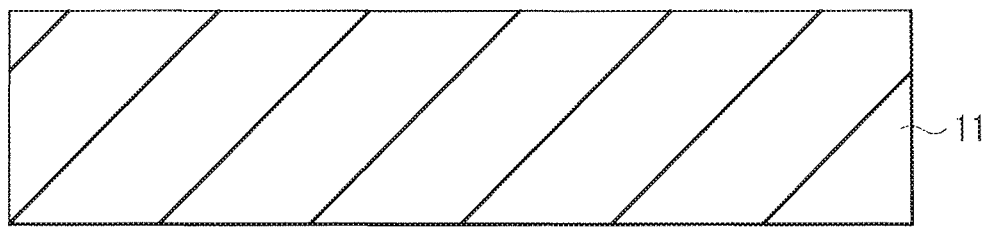
FIG. 29 is a cross-sectional view illustrating a method of manufacturing the thin film transistor illustrated in FIG. 27 in the order of procedure.
Figure 30:
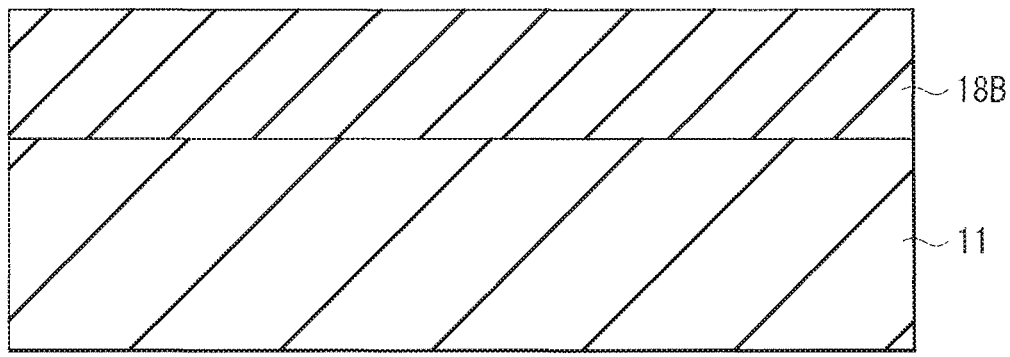
FIG. 30 is a cross-sectional view illustrating a process following FIG. 29.

FIGS. 29 to 36 illustrate a method of manufacturing the thin film transistor 10B in the order of procedure. First, as illustrated in FIG. 29, the base 11 that is configured of, for example, a glass substrate is prepared. As illustrated in FIG. 30, on the base 11, a spacer material film 18B, which is configured of a resin, or an oxide film, or the like as mentioned above, is formed.

Figure 31:
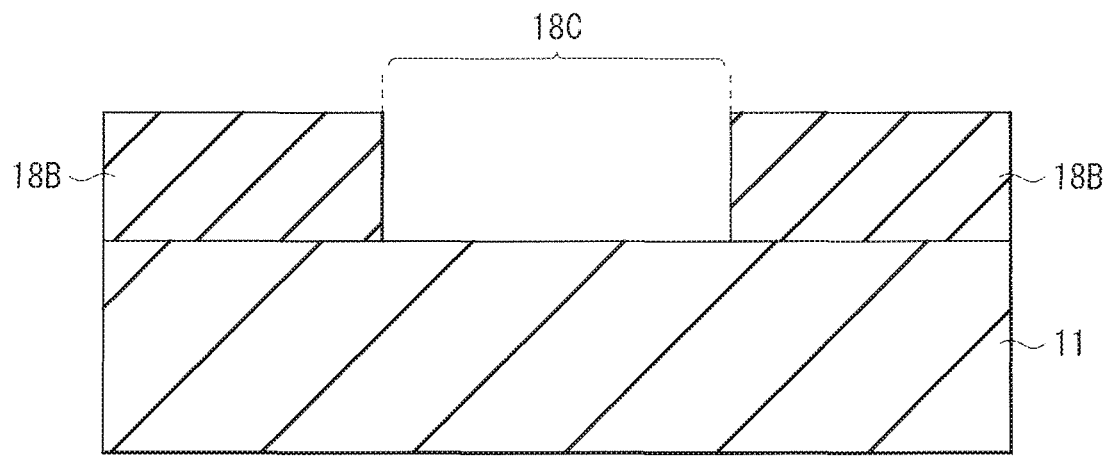
FIG. 31 is a cross-sectional view illustrating a process following FIG. 30.

Next, using photolithography, on the spacer material film 18B, a resist pattern (not illustrated) is formed. By etching with the resist pattern as a mask, a part of the spacer material film 18B is removed to form an opening 18C, in which the base 11 is exposed. Thus, as illustrated in FIG. 31, the spacer layer 18 is formed.

Figure 32:
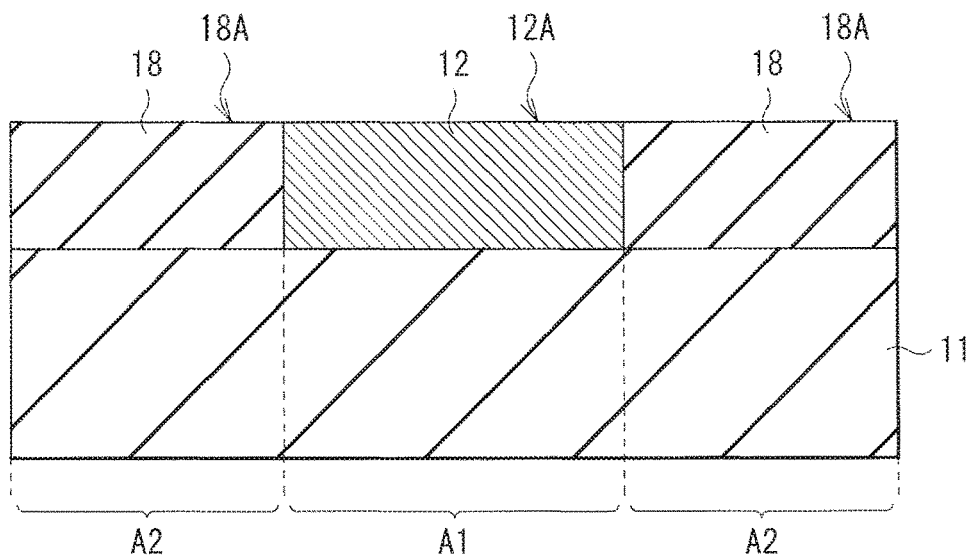
FIG. 32 is a cross-sectional view illustrating a process following FIG. 31.

Subsequently, in the opening 18C of the spacer layer 18, a material of the gate electrode 12, specifically molybdenum, is vapor-deposited. Alternatively, over the spacer layer 18 and in the opening 18C, a gate electrode material film (not illustrated), which is configured of, for example, molybdenum, is formed by, for example, a sputtering method, and then the gate electrode material film is etched back. Thus, as illustrated in FIG. 32, the gate electrode 12 is formed in the first region A1 of the base 11, while the spacer layer 18 is formed in the second region A2 of the base 11. The spacer layer 18 has a thickness that is same or substantially same as the thickness of the gate electrode 12. The upper surface 18A of the spacer layer 18 forms a linear shape or a substantially linear shape that is continuous with the upper surface 12A of the gate electrode 12.

Figure 33:
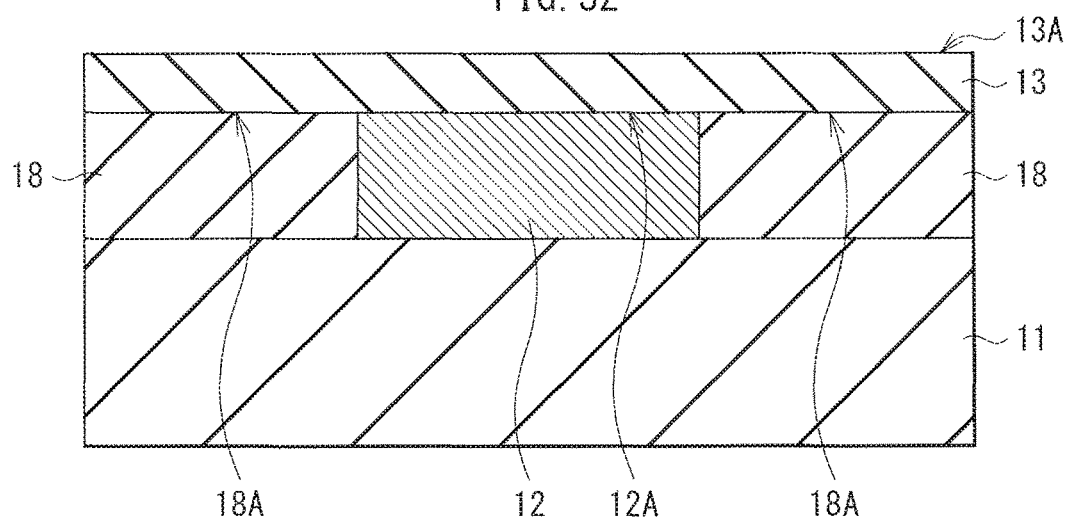
FIG. 33 is a cross-sectional view illustrating a process following FIG. 32.

After this, as illustrated in FIG. 33, on the upper surface 12A of the gate electrode 12 and the upper surface 18A of the spacer layer 18, the gate insulating film 13 is formed by, for example, a CVD method. The gate insulating film 13 may be configured of, for example, a layered film of a silicon nitride film and a silicon oxide film. Thus, the gate insulating film 13 having the flat upper surface 13A is formed. The gate insulating film 13 may be preferably formed with a uniform thickness.

Figure 34:
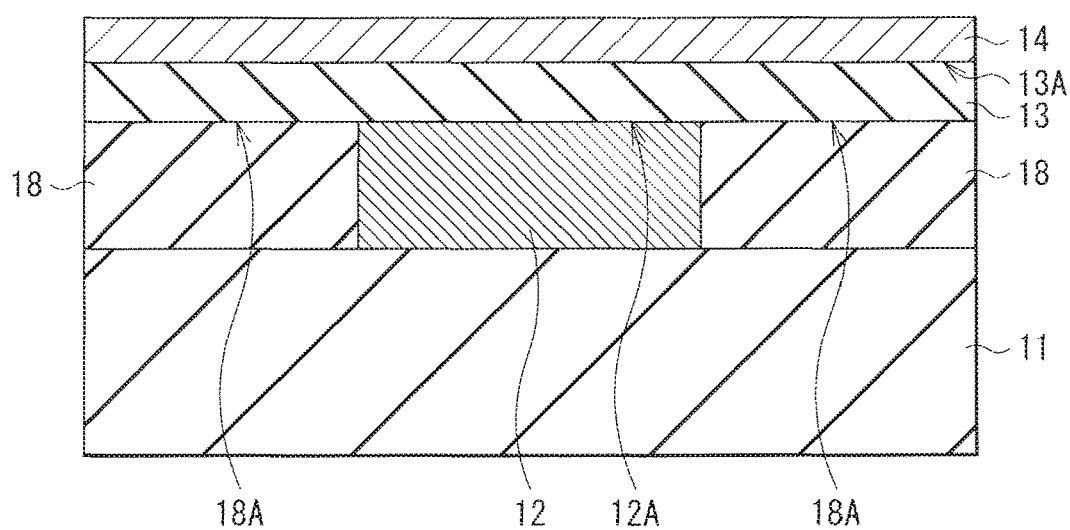
FIG. 34 is a cross-sectional view illustrating a process following FIG. 33.

After forming the gate insulating film 13, on the flat surface 13A of the gate insulating film 13, a semiconductor material film (not illustrated), which is formed of the above-mentioned material, specifically polysilicon, is formed. The semiconductor material film is patterned to a predetermined shape by, for example, photolithography and etching. Thus, as illustrated in FIG. 34, the semiconductor layer 14 as a flat layer is formed on the flat surface 13A of the gate insulating film 13. The semiconductor layer 14 may be preferably formed with a uniform thickness.

Figure 35:
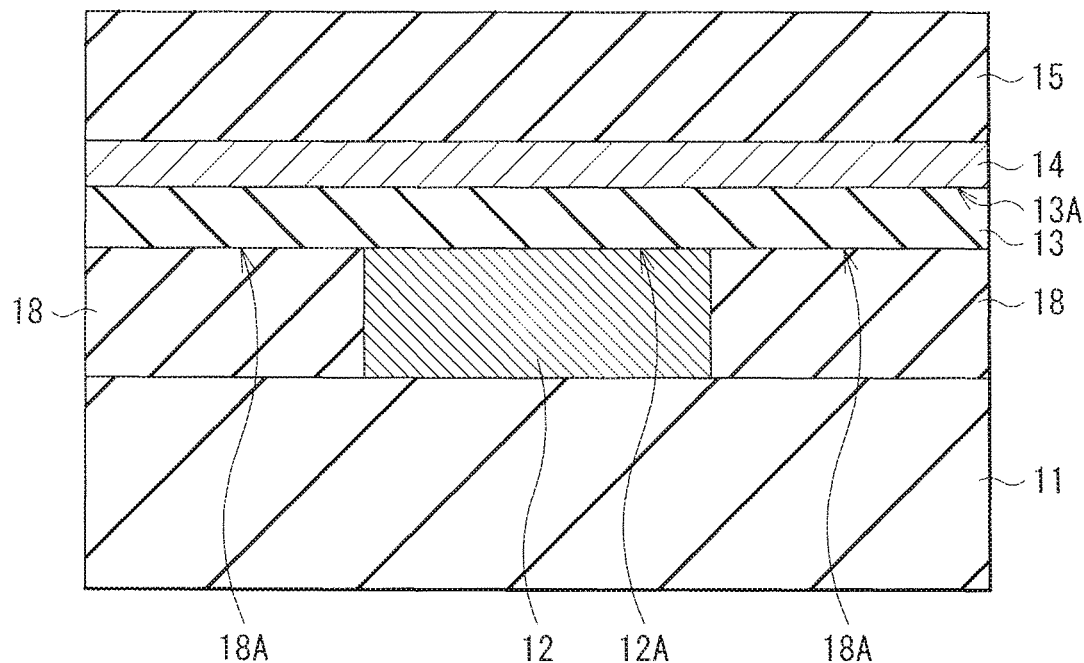
FIG. 35 is a cross-sectional view illustrating a process following FIG. 34.

After forming the semiconductor layer 14, as illustrated in FIG. 35, on the surface of the semiconductor layer 14, the insulating film 15 is formed by, for example, a CVD method. The insulating film 15 may be configured of a layered film of a silicon oxide film and a silicon nitride film.

Figure 36:
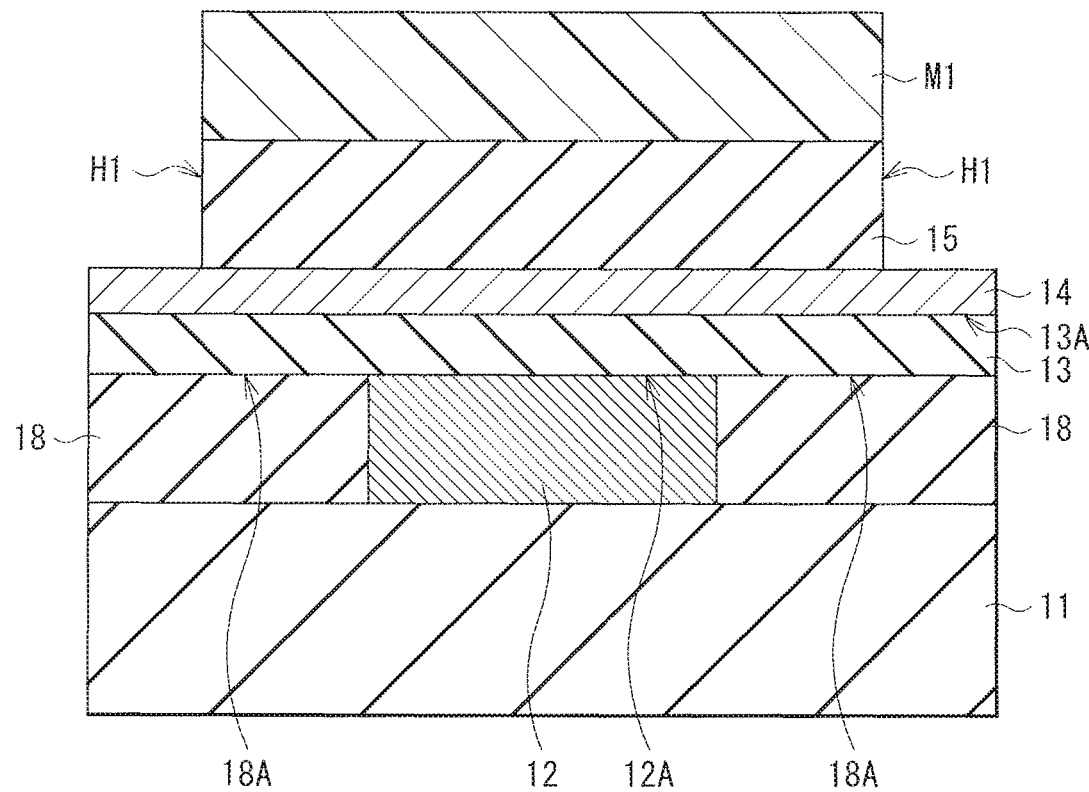
FIG. 36 is a cross-sectional view illustrating a process following FIG. 35.

After forming the insulating film 15, as illustrated in FIG. 36, the contact holes H1 are formed in the insulating film 15. Subsequently, as illustrated in FIG. 27, the source electrode 16S and the drain electrode 16D are formed. The source electrode 16S and the drain electrode 16D are connected to the semiconductor layer 14 through the contact holes H1. Thus, the thin film transistor 10B as illustrated in FIG. 27 is completed.

Figure 37:
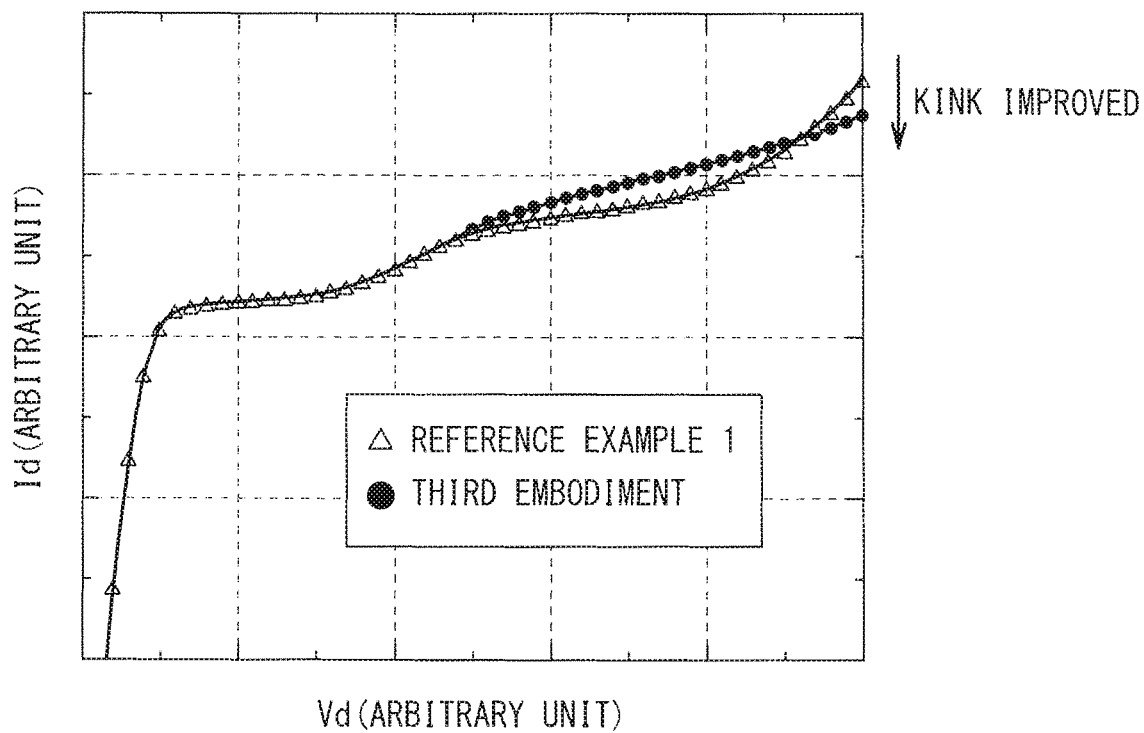
FIG. 37 is a diagram illustrating an Id-Vd curve of the thin film transistor illustrated in FIG. 36 in comparison with the reference example 1.

FIG. 37 illustrates an Id-Vd characteristic of the thin film transistor 10B. It is to be noted that FIG. 37 also illustrates the result of the reference example 1 as well.

As seen from FIG. 37, in the thin film transistor 10B according to the present embodiment, an amount of kink occurring is reduced as compared to the reference example 1. A possible reason may be as follows. The position P1 of the change in the distance D from the semiconductor layer 14 to the gate electrode 12 is apart from the position P2 where the semiconductor layer 14 bends in shape. This allows a gradual change in the distance D, relaxing the concentration of electric field at the edge of the gate electrode 12. That is, it is known that if the semiconductor layer 14 forms a linear shape that is parallel to the first region A1, it is possible to relax the local concentration of electric field in the semiconductor layer 14.

As described above, in the present embodiment, the semiconductor layer 14 has a linear shape that is parallel to the first region A1. Hence, it is possible to reduce the degree of bending of the shape of the semiconductor layer 14 at the boundary position P1. This allows a gradual change in the distance D from the semiconductor layer 14 to the gate electrode 12, relaxing the local concentration of electric field in the semiconductor layer 14.

Fourth Embodiment

Figure 38:
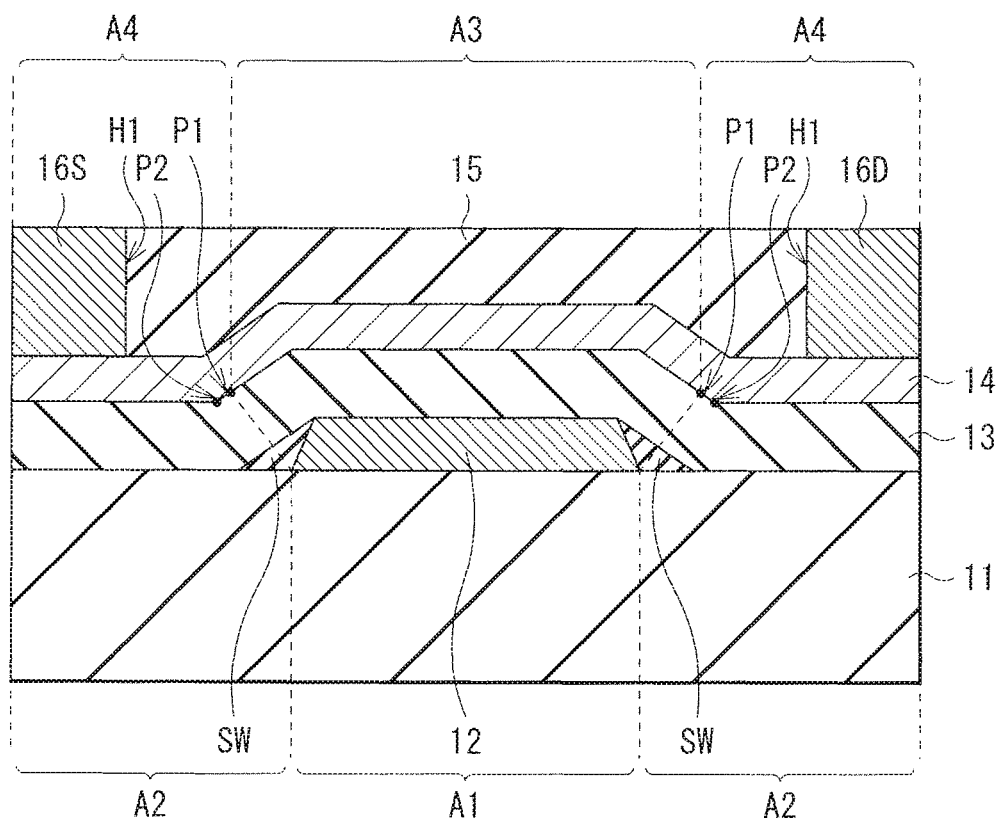
FIG. 38 is a cross-sectional view illustrating a configuration of a thin film transistor according to a fourth embodiment of the present disclosure.

FIG. 38 illustrates a cross-sectional configuration of a thin film transistor 10C according to a fourth embodiment of the present disclosure. The present embodiment involves a side wall SW that is provided on the side surface 12B of the gate electrode 12, allowing a gradual change in the distance D from the semiconductor layer 14 to the gate electrode 12. Otherwise, the thin film transistor 10C according to the present embodiment has similar configurations, functions, and effects to those of the thin film transistor 10 according to the above-described first embodiment. Therefore, description will be given with similar components denoted by similar reference numerals.

Figure 39:
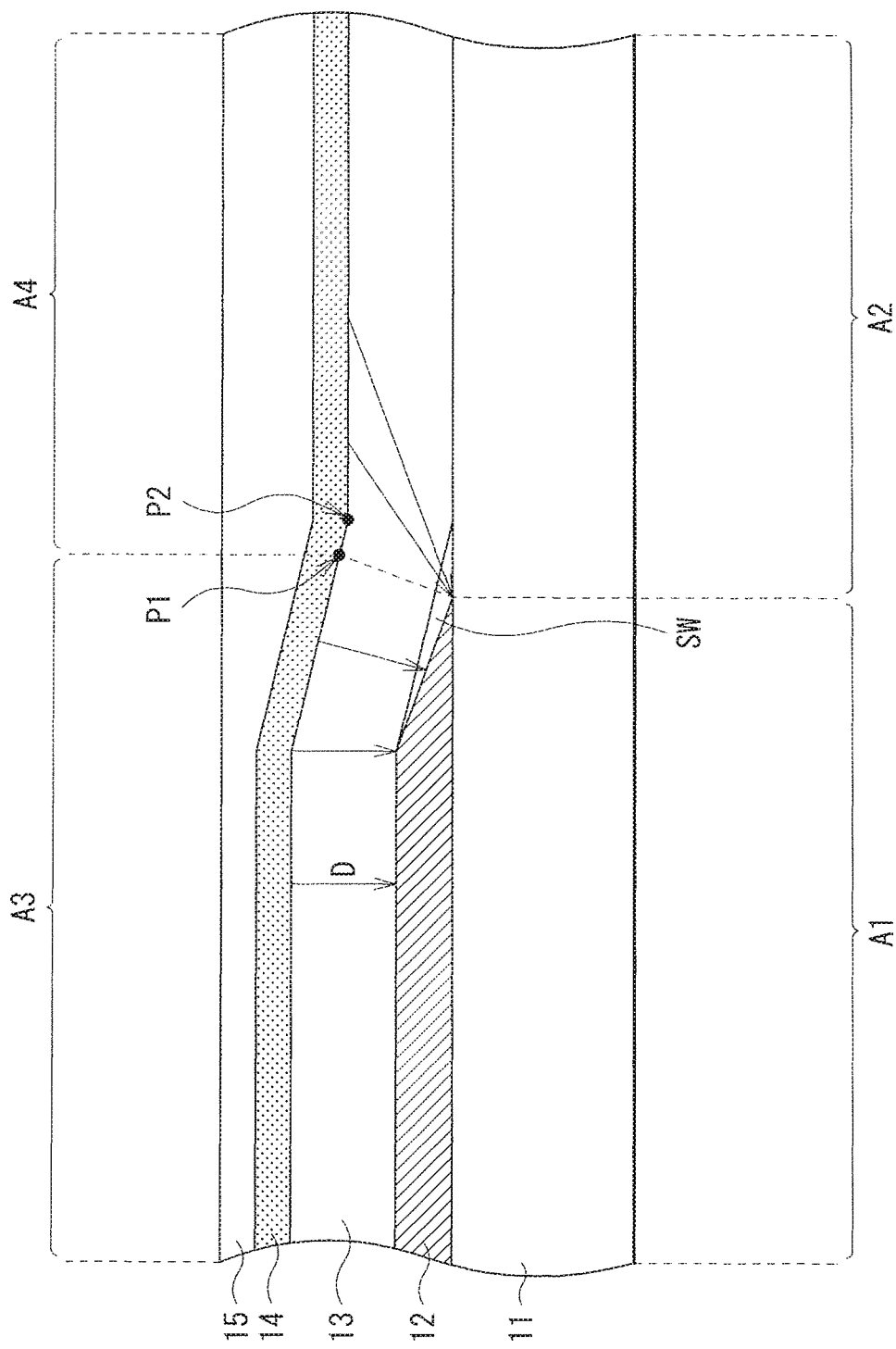
FIG. 39 is a cross-sectional view illustrating, in an enlarged manner, a part of the thin film transistor illustrated in FIG. 38.

In the thin film transistor 10C, since the side wall SW is provided on the side surface 12B of the gate electrode 12, a degree of inclination of the semiconductor layer 14 with respect to the first region A1 at the side surface 12B of the gate electrode 12 is different from a degree of inclination of the side surface 12B of the gate electrode 12 with respect to the first region A1. Also in this case, as illustrated in FIG. 39 in an enlarged manner, the position P1 of the change in the distance D from the semiconductor layer 14 to the gate electrode 12 does not coincide with the position P2 where the semiconductor layer 14 bends in shape, making it possible to relax the concentration of electric field at the edge of the gate electrode 12. In other words, it is possible to reduce the degree of bending of the shape of the semiconductor layer 14 at the boundary position P1. This allows a gradual change in the distance D from the semiconductor layer 14 to the gate electrode 12, relaxing the local concentration of electric field in the semiconductor layer 14.

The side wall SW may have a triangular shape in section that is narrowed in width from the bottom (the base 11 side) toward the top along the side surface 12B of the gate electrode 12. The side wall SW may be configured of, for example, a silicon nitride film.

The thin film transistor 10C may be manufactured, for example, as follows.

Figure 40:
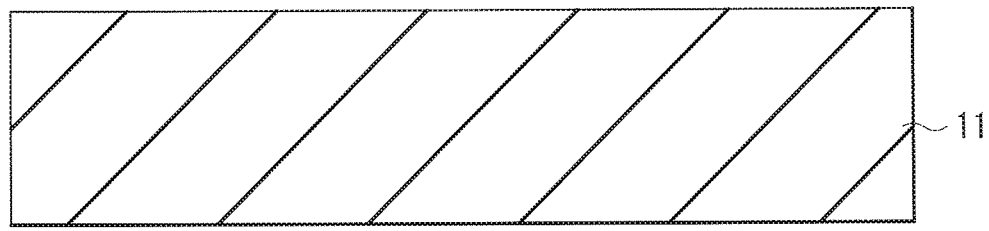
FIG. 40 is a cross-sectional view illustrating a method of manufacturing the thin film transistor illustrated in FIG. 38 in the order of procedure.
Figure 41:
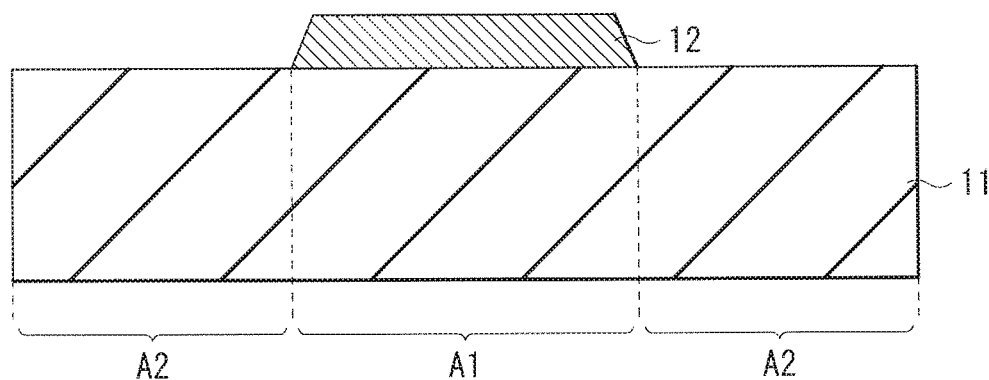
FIG. 41 is a cross-sectional view illustrating a process following FIG. 40.

FIGS. 40 to 47 illustrate a method of manufacturing the thin film transistor 10C in the order of procedure. First, as illustrated in FIG. 40, the base 11 that is configured of, for example, a glass substrate is prepared. On the base 11, a gate electrode material film (not illustrated) that is configured of, for example, molybdenum is formed by, for example, a sputtering method. Next, the gate electrode material film is subjected to photolithography and etching. Thus, as illustrated in FIG. 41, the gate electrode 12 is patterned on the first region A1 of the base 11.

Figure 42:
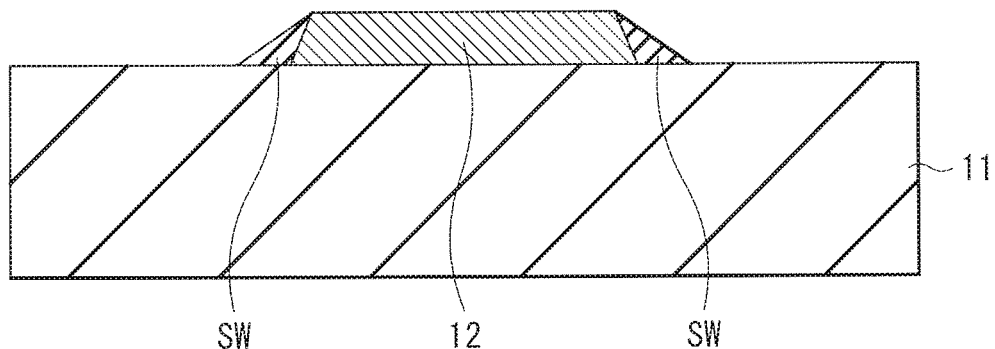
FIG. 42 is a cross-sectional view illustrating a process following FIG. 41.

After this, an insulating film (not illustrated) that is configured of, for example, a silicon nitride film is formed on the surface of the gate electrode 12 and the second region A2 of the base 11. And then, the insulating film is etched back. Thus, as illustrated in FIG. 42, the side wall SW is formed on the side surface 12B of the gate electrode 12.

Figure 43:
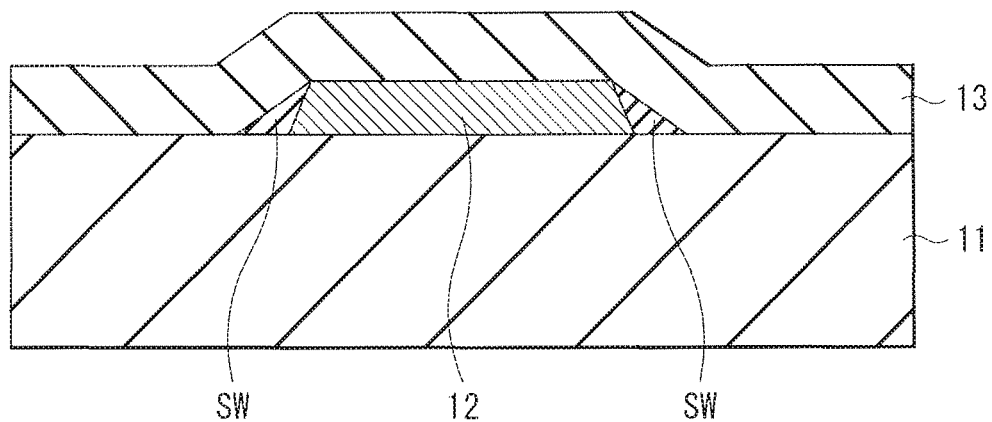
FIG. 43 is a cross-sectional view illustrating a process following FIG. 42.

After forming the side wall SW, as illustrated in FIG. 43, on the upper surface 12A of the gate electrode 12, on a side surface of the side wall SW, and on the second region A2 of the base 11, the gate insulating film 13 is formed by, for example, a CVD method. The gate insulating film 13 may be configured of, for example, a layered film of a silicon nitride film and a silicon oxide film. The gate insulating film 13 may be preferably formed with a uniform thickness.

Figure 44:
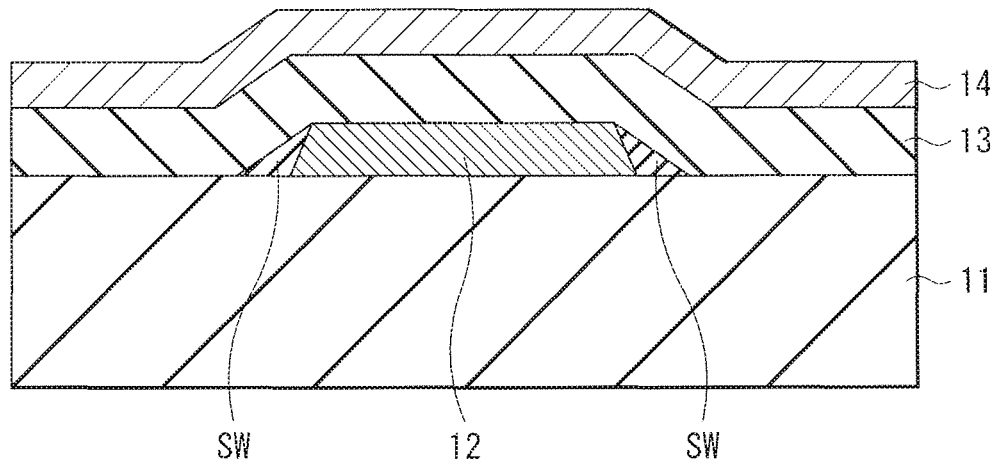
FIG. 44 is a cross-sectional view illustrating a process following FIG. 43.

After forming the gate insulating film 13, on the surface of the gate insulating film 13, a semiconductor material film (not illustrated) that is configured of the above-mentioned material, specifically polysilicon, is formed. The semiconductor material film is patterned to a predetermined shape by, for example, photolithography and etching. Thus, as illustrated in FIG. 44, the semiconductor layer 14 is formed on the surface of the gate insulating film 13. The semiconductor layer 14 may be preferably formed with a uniform thickness.

Figure 45:
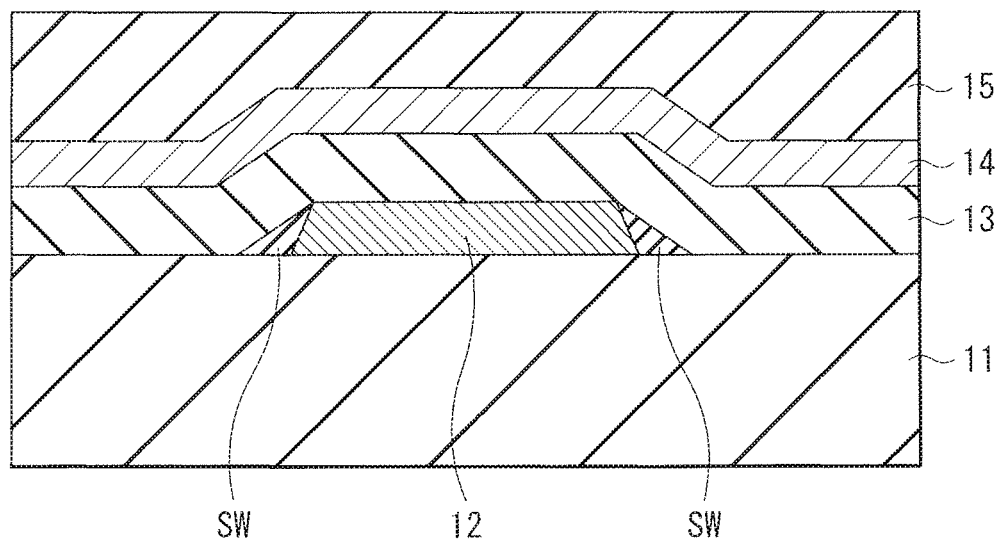
FIG. 45 is a cross-sectional view illustrating a process following FIG. 44.

After forming the semiconductor layer 14, as illustrated in FIG. 45, on the surface of the semiconductor layer 14, the insulating layer 15 is formed by, for example, a CVD method. The insulating film 15 may be configured of, for example, a layered film of a silicon oxide film and a silicon nitride film.

Figure 46:
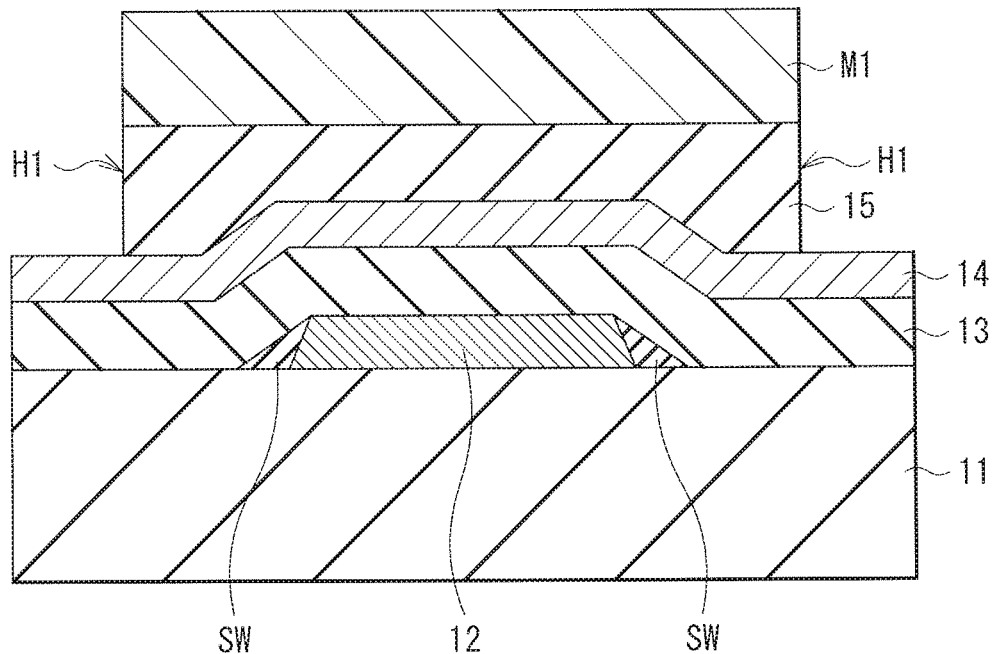
FIG. 46 is a cross-sectional view illustrating a process following FIG. 45.
Figure 47:
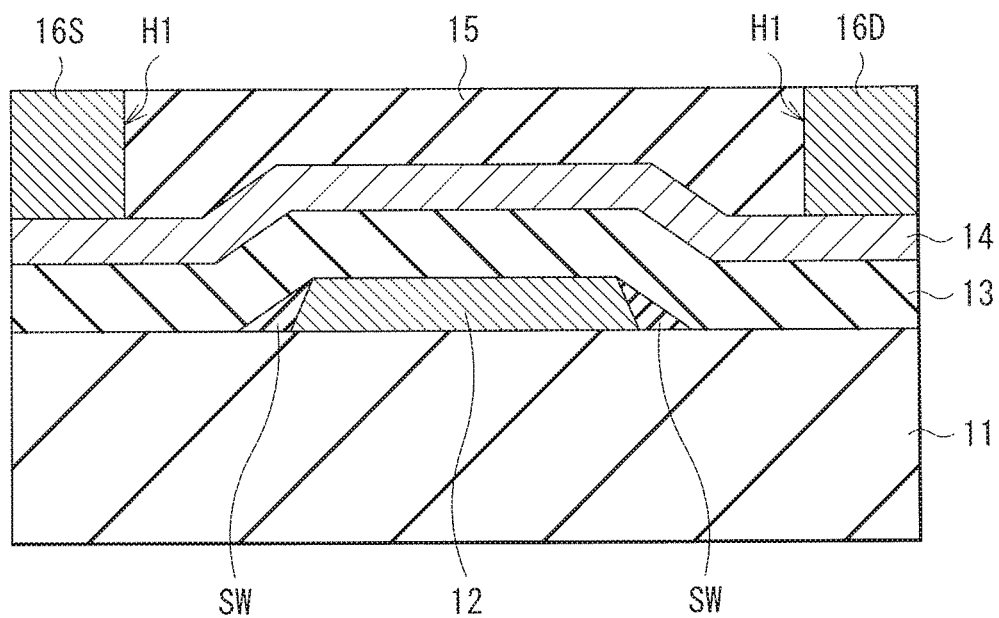
FIG. 47 is a cross-sectional view illustrating a process following FIG. 46.

After forming the insulating film 15, as illustrated in FIG. 46, the contact holes H1 are formed in the insulating film 15. Subsequently, as illustrated in FIG. 47, the source electrode 16S and the drain electrode 16D are formed. The source electrode 16S and the drain electrode 16D are connected to the semiconductor layer 14 through the contact holes H1. Thus, the thin film transistor 10C as illustrated in FIG. 38 is completed.

Figure 48:
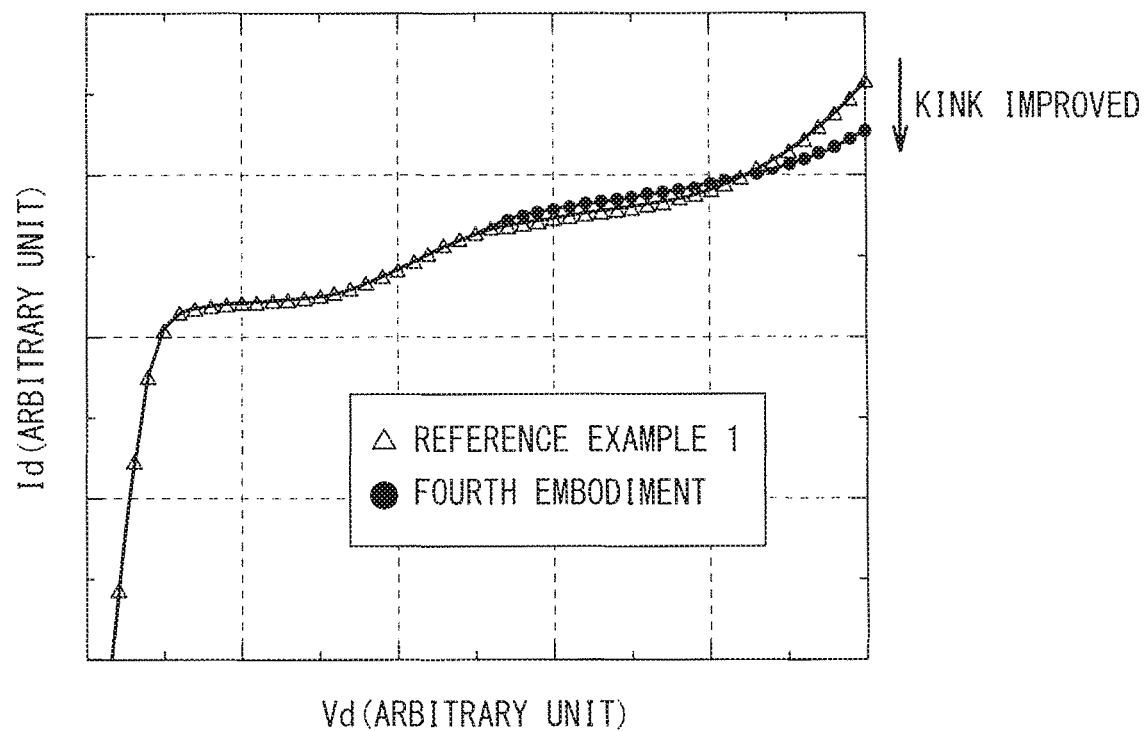
FIG. 48 is a diagram illustrating an Id-Vd curve of the thin film transistor illustrated in FIG. 38 in comparison with the reference example 1.

FIG. 48 illustrates an Id-Vd characteristic of the thin film transistor 10C. It is to be noted that FIG. 48 also illustrates the result of the reference example 1 as well.

As seen from FIG. 48, in the thin film transistor 10C according to the present embodiment, an amount of kink occurring is reduced as compared to the reference example 1. A possible reason may be as follows. Since the side wall SW is provided on the side surface 12B of the gate electrode 12, the position P1 of the change in the distance D from the semiconductor layer 14 to the gate electrode 12 is separated from the position P2 where the semiconductor layer 14 bends in shape. This allows a gradual change in the distance D, relaxing the concentration of electric field at the edge of the gate electrode 12. That is, it is known that if the degree of inclination of the semiconductor layer 14 with respect to the first region A1 at the side surface 12B of the gate electrode 12 is different from the degree of inclination of the side surface 12B of the gate electrode 12 with respect to the first region A1, it is possible to relax the local concentration of electric field in the semiconductor layer 14.

As described above, in the present embodiment, the side wall SW is provided on the side surface 12B of the gate electrode 12, allowing the degree of inclination of the semiconductor layer 14 with respect to the first region A1 at the side surface 12B of the gate electrode 12 to be different from the degree of inclination of the side surface 12B of the gate electrode 12 with respect to the first region A1. Hence, it is possible to reduce the degree of bending of the shape of the semiconductor layer 14 at the boundary position P1. This allows a gradual change in the distance D from the semiconductor layer 14 to the gate electrode 12, making it possible to relax the local concentration of electric field in the semiconductor layer 14.

Fifth Embodiment

Figure 49:
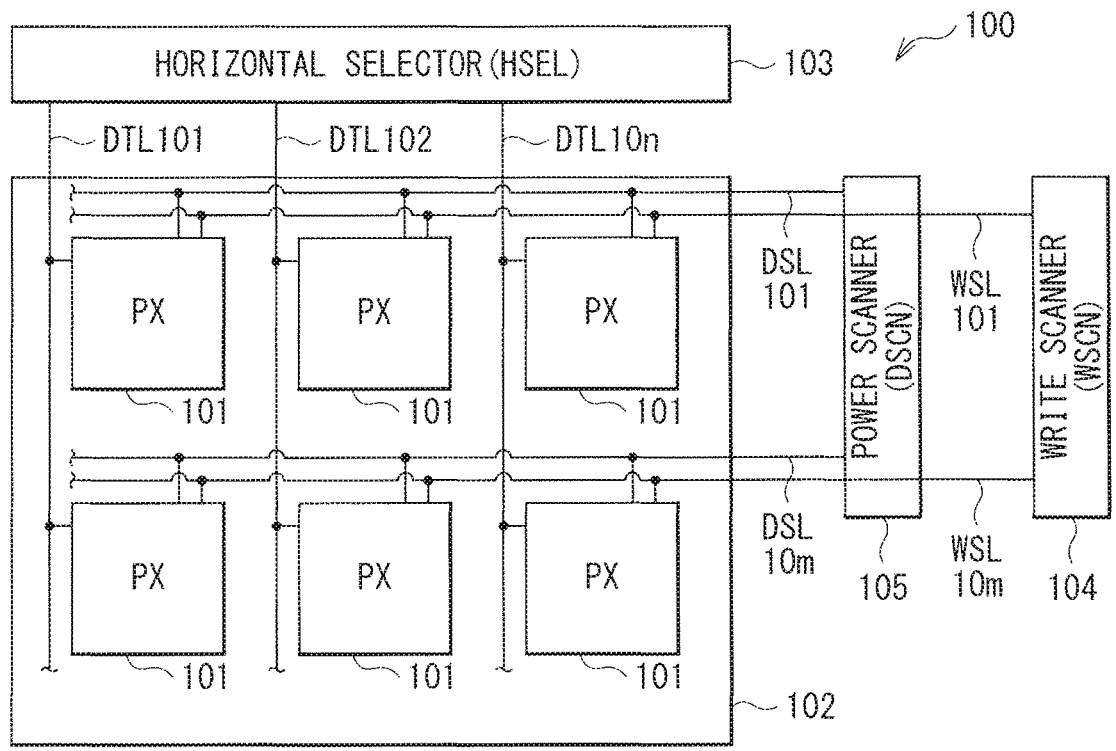
FIG. 49 is a block diagram illustrating an overall configuration of a display device according to a fifth embodiment of the present disclosure.

FIG. 49 illustrates an overall configuration of a display device according to a fifth embodiment of the present disclosure. The display device 100 includes, for example, a pixel array section 102 and a drive section (a signal selector 103, a main scanner 104, and a power scanner 105) that drives the pixel array section 102.

The pixel array section 102 includes a plurality of pixels PX arranged in a matrix and power lines DSL101 to 10m that are arranged in correspondence with the respective rows of the plurality of pixels PX. Each of the pixels PX is disposed at an intersection at which scan lines WSL101 to 10m in rows and signal lines DTL101 to 10n in columns intersect. Each of the pixels PX includes a pixel circuit 101.

The main scanner (a write scanner WSCN) 104 is adapted to supply, to each of the scan lines WSL101 to 10m, a control signal in turn, performing line sequential scanning of the pixels PX in units of row. The power scanner (DSCN) 105 is adapted to supply, to each of the power lines DSL101 to 10m, a power voltage that is switched between a first potential and a second potential, in accordance with the line sequential scanning The signal selector (a horizontal selector HSEL) 103 is adapted to supply, to the signal lines DTL101 to 10n in columns, a signal potential as a picture signal and a reference potential in accordance with the line sequential scanning.

Figure 50:
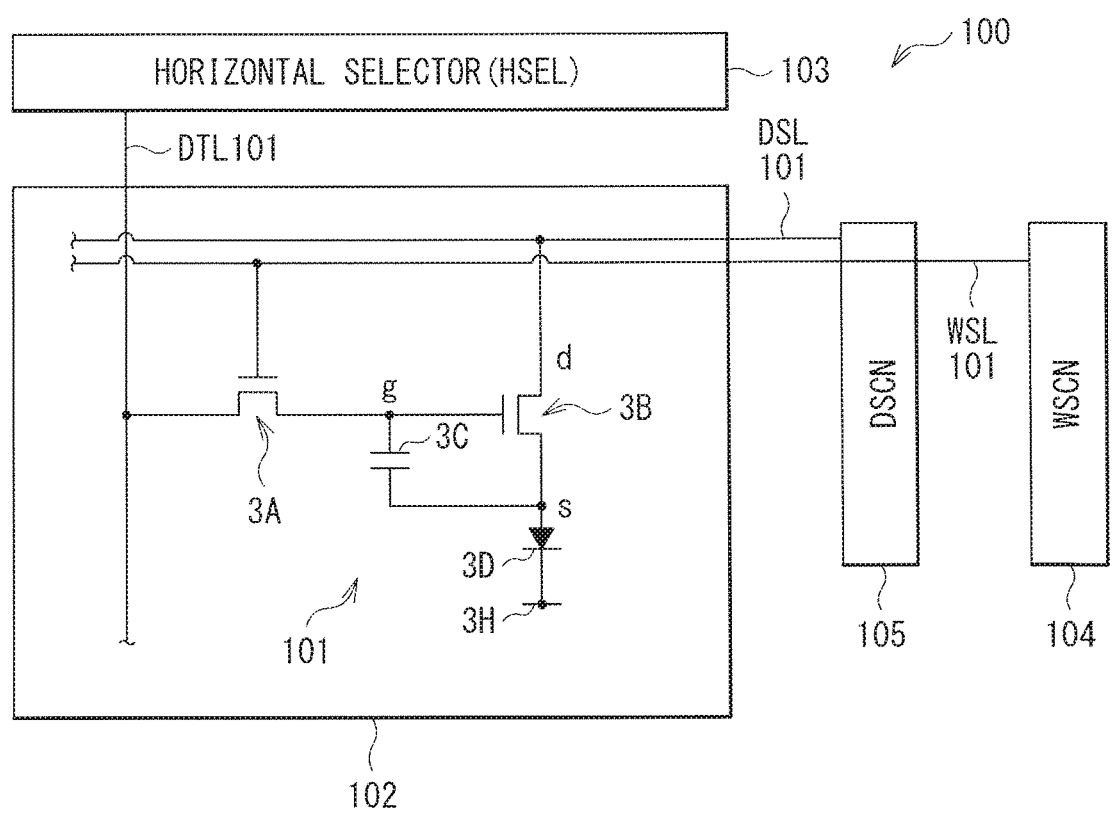
FIG. 50 is a diagram illustrating one example of a pixel circuit of the display device illustrated in FIG. 49.

FIG. 50 illustrates one example of a specific configuration and connecting relation of the pixel circuit 101 illustrated in FIG. 49. The pixel circuit 101 includes, for example, a light emitting element 3D, which is typified by an organic EL display element, and so on, a sampling transistor 3A, a driving transistor 3B, and a storage capacitor 3C.

The sampling transistor 3A includes a gate, a source, and a drain. The gate is connected to the associated scan line WSL101. One of the source and the drain is connected to the associated signal line DTL101. Another of the source and the drain is connected to a gate g of the driving transistor 3B.

The driving transistor 3B includes the gate g, a source s, and a drain d. One of the source s and the drain d is connected to the light emitting element 3D. Another of the source s and the drain d is connected to the associated power line DSL101. In the present embodiment, the drain d of the driving transistor 3B is connected to the power line DSL101, while the source s is connected to an anode of the light emitting element 3D. A cathode of the light emitting element 3D is connected to a ground wiring 3H. It is to be noted that the ground wiring 3H is wired commonly to all the pixels PX.

The storage capacitor 3C is connected between the source s and the gate g of the driving transistor 3B. The storage capacitor 3C is adapted to retain the signal potential of the picture signal that is supplied from the signal line DTL101.

Figure 51:
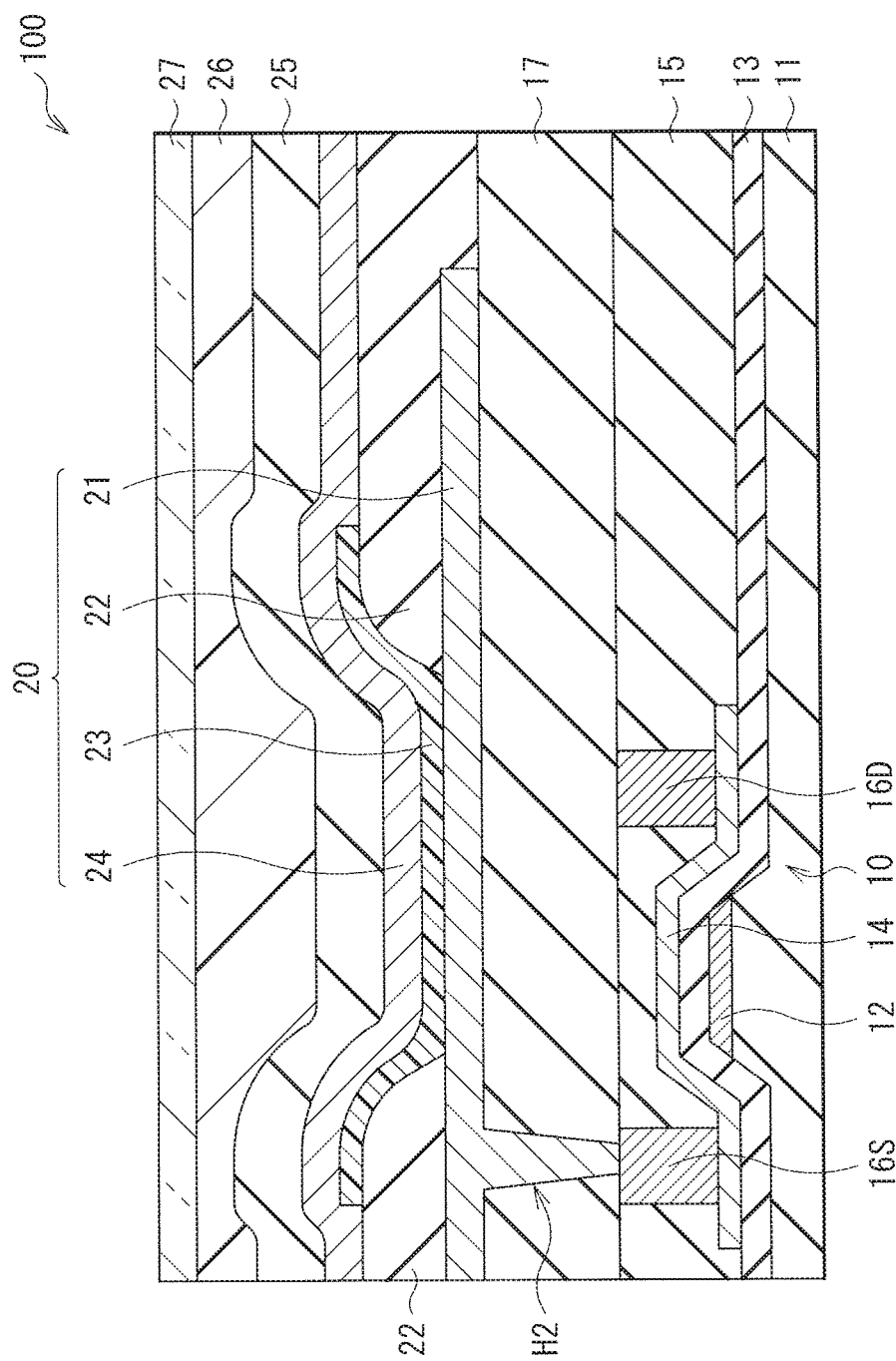
FIG. 51 is a cross-sectional view illustrating a configuration of the pixel illustrated in FIG. 50.

FIG. 51 illustrates a cross-sectional configuration of one pixel PX of the display device 100. The display device 100 includes, for example, the thin film transistor 10 and a display element 20.

The thin film transistor 10 is, for example, a thin film transistor as described above in the first embodiment. It is to be noted that, instead of the thin film transistor 10, the thin film transistors 10A to 10C according to the second to fourth embodiments may be adoptable.

The display element 20 is configured of, for example, an organic EL element and corresponds to the light emitting element 3D illustrated in FIG. 50. Specifically, the display element 20 is one of a red organic EL element 20R that is adapted to produce red light, a green organic EL element 20G that is adapted to produce green light, and a blue organic EL element 20B that is adapted to produce blue light (refer to FIG. 52).

The display element 20 is provided on a planarization layer 17 illustrated in FIG. 51, and has a configuration in which an anode electrode (a first electrode) 21, a barrier rib 22, an organic layer 23, and a cathode electrode (a second electrode) 24 are stacked in this order. The display element 20 is an organic EL element of an upper surface emission type (of a top emission type) in which holes injected from the anode electrode 21 and electrons injected from the cathode electrode 24 are recombined in a light emission layer 23C (to be described later) to produce light, and the light thus produced is extracted on an opposite side to the base 11 (on the cathode electrode 24 side). The use of the organic EL element of the upper surface emission type allows an enhanced aperture ratio of a light emission region of the display device 100. It is to be noted that the display element 20 is not limited to the organic EL element of the upper surface emission type but may be an organic EL element of a lower surface emission type (of a bottom emission type), i.e. a transparent type in which light is extracted on the base 11 side, for example.

The planarization layer 17 is adapted to reduce unevenness due to the thin film transistor 10 for planarization. The planarization layer 17 may have a thickness of, for example, about 2 μm, and may be configured of an organic insulating film that includes acrylic, polyimide, siloxane, or the like as a material. The planarization layer 17 may also be configured of a layered film of a silicon oxide film, a silicon nitride film, or an aluminum oxide film, and an organic insulating film such as acrylic, polyimide, siloxane, and so on.

In a case that the display device 100 is of an upper surface emission type, the anode electrode 21 may be configured of, for example, a highly reflecting material, specifically, an alloy of aluminum and neodymium, aluminum (Al), titanium (Ti), chromium (Cr), and so on. In a case that the display device 100 is of a transparent type, the anode electrode 21 may be configured of, for example, a transparent material, specifically, ITO, IZO (a registered trademark), IGZO, or the like. The anode electrode 21 is connected to the source electrode 16S through a contact hole H2.

The barrier rib 22 may be configured of, for example, an organic material such as polyimide, novolac, or the like, and has a function of securing insulation between the anode electrode 21 and the cathode electrode 24.

Figure 52:
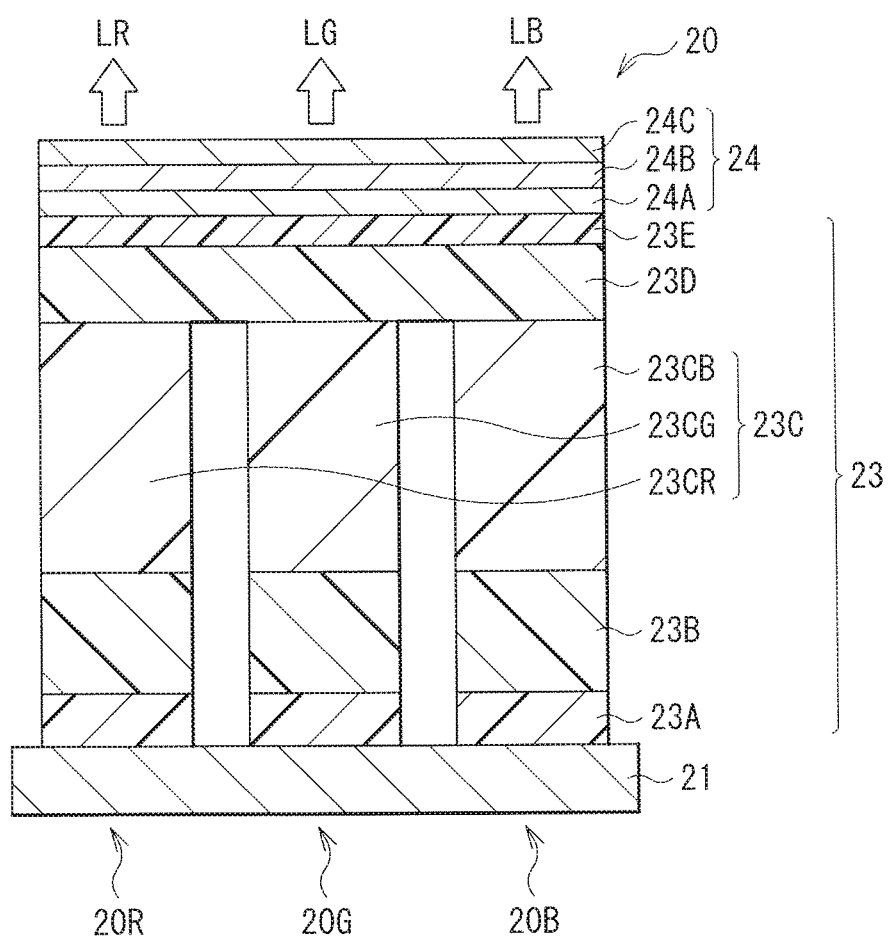
FIG. 52 is a cross-sectional view illustrating one example of an organic layer illustrated in FIG. 51.

The organic layer 23 may have a configuration in which, as illustrated in FIG. 52 for example, a hole injection layer 23A, a hole transport layer 23B, the light emission layer 23C (a red light emission layer 23CR, a green light emission layer 23CG, and a blue light emission layer 23CB), an electron transport layer 23D, and an electron injection layer 23E are stacked in this order from the anode electrode 21 side. An upper surface of the organic layer 23 is covered with the cathode electrode 24. The red light emission layer 23CR is adapted to produce red light LR. The green light emission layer 23CG is adapted to produce green light LG The blue light emission layer 23CB is adapted to produce blue light LB.

Figure 53:
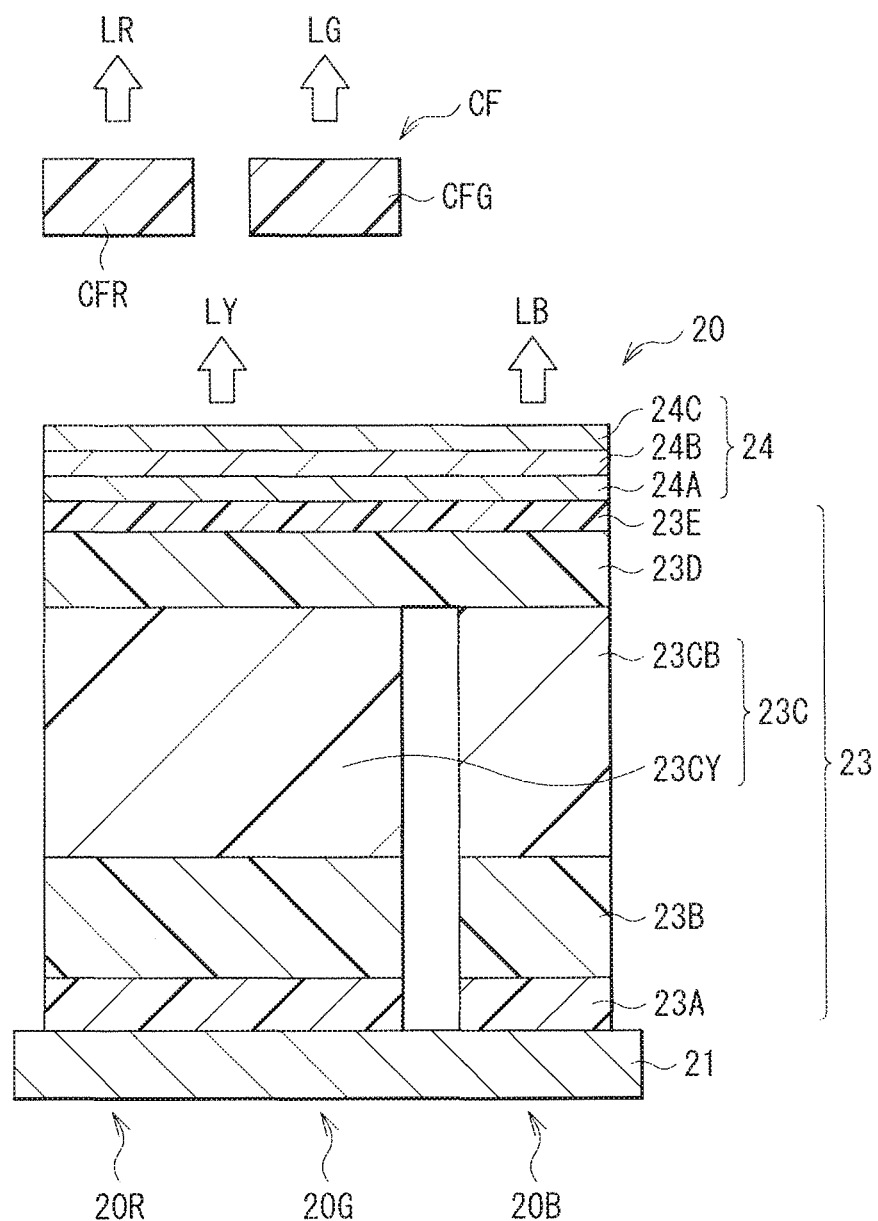
FIG. 53 is a cross-sectional view illustrating another example of the organic layer illustrated in FIG. 51.

Alternatively, the organic layer 23 may have a configuration in which, as illustrated in FIG. 53 for example, the hole injection layer 23A, the hole transport layer 23B, the light emission layer 23C (a yellow light emission layer 23CY and the blue light emission layer 23CB), the electron transport layer 23D, and the electron injection layer 23E are stacked in this order from the anode electrode 21 side. In this case, the yellow light emission layer 23CY is adapted to produce yellow light LY. The yellow light LY is adapted to be color-separated into the red light LR and the green light LG by a color filter CF (a red filter CFR and a green filter CFG).

Figure 54:
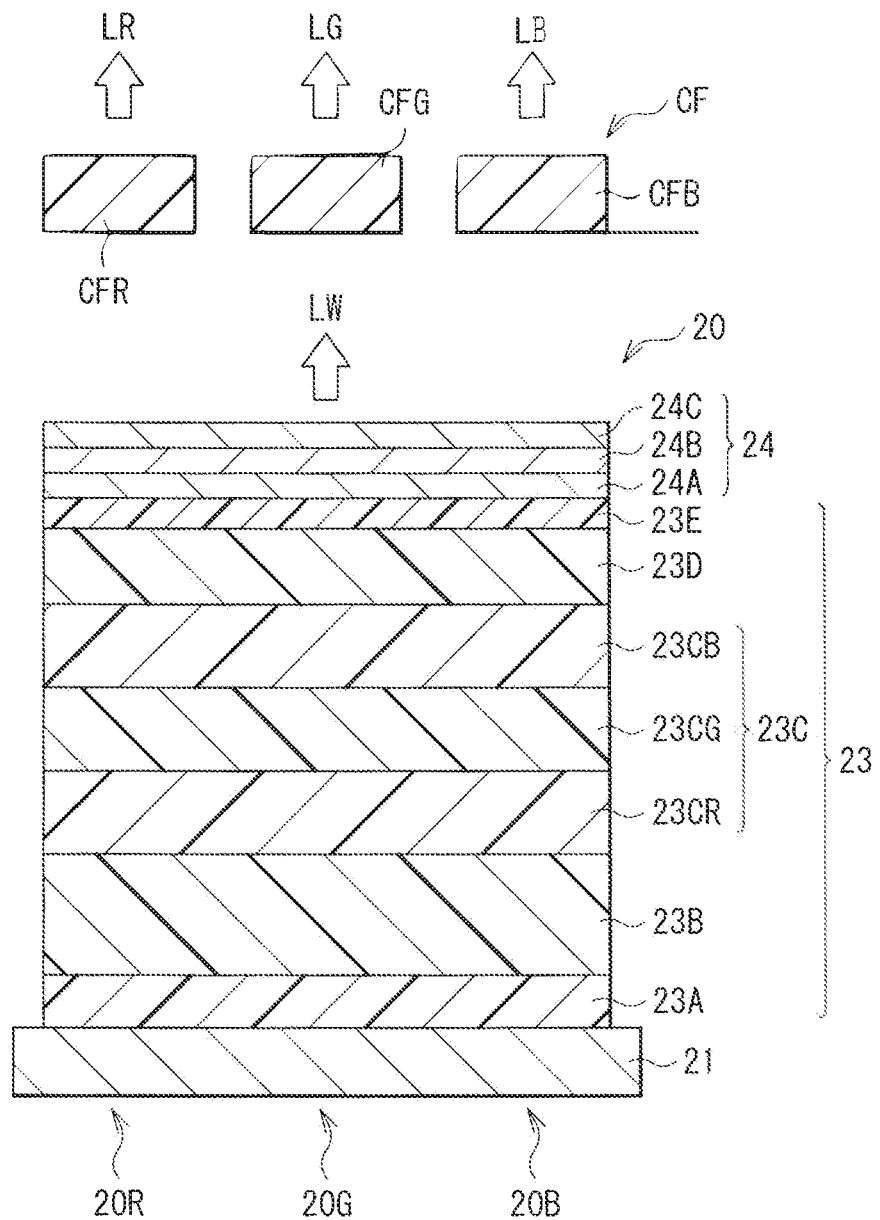
FIG. 54 is a cross-sectional view illustrating still another example of the organic layer illustrated in FIG. 51.

In another alternative, as illustrated in FIG. 54, for example, the light emission layer 23C may be a white light emission layer having a configuration of a layered structure of the red light emission layer 23CR, the blue light emission layer 23CB, and the green light emission layer 23CG. In this case, the light emission layer 23C is adapted to produce white light LW. The white light LW is adapted to be color-separated into the red light LR, the green light LG, and the blue light LB by the color filter CF (the red filter CFR, the green filter CFG, and a blue filter CFB).

It is to be noted that the configurations of the organic layer 23 and the light emission layer 23C are not limited to examples illustrated in FIGS. 52 to 54, and it goes without saying that they may have other configurations.

In the organic layer 23, the hole injection layer 23A, the hole transport layer 23B, the electron transport layer 23D, and the electron injection layer 23E may be formed as a common layer over an entire surface of the pixel array section 102 (refer to FIG. 49) by, for example, a vacuum deposition method. On the other hand, the red light emission layer 23CR, the green light emission layer 23CG, and the yellow light emission layer 23CY may be formed separately for each color by, for example, a coating method. The blue light emission layer 23CB may be formed as a common layer over the entire surface of the pixel array section 102 by, for example, a vacuum deposition method, or may be formed separately for each color by, for example, a coating method.

A thickness and a material of each layer that constitutes the organic layer 23 may be exemplified as follows, though they are not limited in particular.

The hole injection layer 23A is adapted to enhance an electron injection efficiency into the light emission layer 23C. The hole injection layer 23A is also adapted to be a buffer layer to prevent a leak. A thickness of the hole injection layer 23A may be, for example, preferably 5 nm to 200 nm both inclusive, and more preferably 8 nm to 150 nm both inclusive. A constituent material of the hole injection layer 23A may be selected appropriately in relation to the materials of the electrodes and adjacent layers. Examples may include polyaniline, polythiophene, polypyrrole, polyphenylene vinylene, poly(thienylene vinylene), polyquinoline, polyquinoxaline, and their derivatives, a conductive polymer such as a polymer that includes an aromatic amine structure in a main chain or in a side chain, metal phthalocyanine (such as copper phthalocyanine), carbon, and so on. Examples of conductive polymers may include oligoaniline and polydioxythiophene such as poly(3,4-ethylenedioxythiophehe) (PEDOT).

The hole transport layer 23B is adapted to enhance a hole transport efficiency into the light emission layer 23C. A thickness of the hole transport layer 23B may be, for example, preferably 5 nm to 200 nm both inclusive, and more preferably 8 nm to 150 nm both inclusive, though it depends on the whole configuration of the element. As a constituent material of the hole transport layer 23B, a light emitting material that is soluble to an organic solvent may be adopted. Examples may include polyvinyl carbazole, polyfluorene, polyaniline, polysilane, or their derivatives, a polysiloxane derivative that includes an aromatic amine in a side chain or in a main chain, polythiophene and its derivatives, polypyrrole, or $Alq_3$, and so on.

In the light emission layer 23C, when an electric field is applied, there occurs the recombination of holes and electrons, allowing light to be produced. A thickness of the light emission layer 23C may be, for example, preferably 10 nm to 200 nm both inclusive, and more preferably 20 nm to 150 nm both inclusive, though it depends on the whole configuration of the element. Each layer in the light emission layer 23C may be a single layer or may have a laminated structure.

As a constituent material of the light emission layer 23C, materials suitable for the respective light emission colors may be adopted. Examples may include a polyfluorene-based polymer derivative, a (poly)paraphenylene vinylene derivative, a polyphenylene derivative, a polyvinyl carbazole derivative, a polythiophene derivative, a pelylene-based pigment, a coumarin-based pigment, a rhodamine-based pigment, or the above-mentioned polymer doped with an organic EL material. Examples of materials to be doped may include rubrene, perylene, 9,10-diphenylanthracene, tetraphenyl butadiene, nile red, coumarin-6, and so on. It is to be noted that the constituent materials of the light emission layer 23C may be a mixture of two or more of the above-mentioned materials. The constituent materials of the light emission layer 23C are not limited to the above-mentioned materials of high molecular weight, but materials of low molecular weight may be used in combination. Examples of materials of low molecular weight may include benzene, styrylamine, triphenylamine, porphyrin, triphenylene, azatriphenylene, tetracyanoquinodimethane, triazole, imidazole, oxadiazole, polyaryl alkane, phenylenediamine, arylamine, oxazole, anthracene, fluorenone, hydrazone, stilbene, or their derivatives, or a monomer or an oligomer of a heterocyclic conjugated system such as a polysilane-based compound, a vinylcarbazole-based compound, a thiophene-based compound, or an aniline-based compound.

As the constituent materials of the light emission layer 23C, in addition to the above-mentioned materials, a material having high light emission efficiency may be used as a light-emitting guest material. Examples may include an organic light emitting material such as a fluorescent material of low molecule weight, a phosphorescent pigment, or a metal complex.

It is to be noted that the light emission layer 23C may be a light emission layer having hole transporting property that also serves as the above-mentioned hole transport layer 23B. Also, the light emission layer 23C may be a light emission layer having electron transporting property that also serves as the electron transport layer 23D, which will be described later.

The electron transport layer 23D and the electron injection layer 23E are adapted to enhance an electron transport efficiency into the light emission layer 23C. A total thickness of the electron transport layer 23D and the electron injection layer 23E may be, for example, preferably 5 nm to 200 nm both inclusive, and more preferably 10 nm to 180 nm both inclusive, though it depends on the whole configuration of the element.

A constituent material of the electron transport layer 23D may be preferably an organic material having excellent electron transporting performance Enhancing the transport efficiency of the light emission layer 23C allows variation in light emission colors due to intensity of electric field to be restrained. Specifically, for example, an arylpyridine derivative and a benzoimidazole derivative may be preferably used. Thus, it is possible to maintain high electron supply efficiency at a low drive voltage. Examples of constituent materials of the electron injection layer 23E may include an alkali metal, an alkaline earth metal, a rare earth metal, and their oxides, composite oxides, fluorides, carbonates, and so on.

The cathode electrode 24 may have a thickness of, for example, about 10 nm, and may be configured of a material having good light transmitting property and a small work function. Alternatively, a transparent conductive film using an oxide may allow the light extraction to be secured. In this case, ZnO, ITO, IZnO, InSnZnO, and so on may be used. Furthermore, though the cathode electrode 24 may be a single layer, in examples illustrated in FIGS. 52 to 54, the cathode electrode 24 has a configuration in which, for example, a first layer 24A, a second layer 24B, and a third layer 24C are stacked in this order from the anode electrode 21 side.

The first layer 24A may be preferably configured of a material having a small work function and good light transmitting property. Specific examples may include an alkaline earth metal such as calcium (Ca), barium (Ba), or the like, an alkali metal such as lithium (Li), caesium (Cs), or the like, indium (In), magnesium (Mg), and silver (Ag). Furthermore, other examples may include an alkali metal oxide, an alkali metal fluoride, an alkaline earth metal oxide, an alkaline earth metal fluoride, specifically, $Li_2O$, $Cs_2CO_3$, $Cs_2SO_4$, MgF, LiF, $CaF_2$, or the like.

The second layer 24B may be configured of a material having light transmitting property and good electrical conductivity, such as a thin film Mg—Ag electrode or a Ca electrode. The third layer 24C may be preferably configured of a transparent lanthanoid-based oxide to restrain degradation of the electrode. This makes it possible to use the third layer 24C as a sealing electrode that allows light to be extracted through the upper surface. In the case of the bottom emission type, gold (Au), platinum (Pt), or Au—Ge, or the like may be used for a material of the third layer 24C.

It is to be noted that the first layer 24A, the second layer 24B, and the third layer 24C may be formed by techniques such as a vacuum deposition method, a sputtering method, a plasma CVD (chemical vapor deposition) method, and the like. In a case that a driving method of the display device 100 is an active matrix method, the cathode electrode 24 may be formed as a continuous film on the base 11, constituting a common electrode to the display elements 20, in a state that the cathode electrode 24 is insulated from the anode electrode 21 by the barrier rib 22 and the organic layer 23.

The cathode electrode 24 may be a mixed layer that includes an organic light emitting material such as an aluminum quinoline complex, a styrylamine derivative, a phthalocyanine derivative. In this case, the cathode electrode 24 may further include an additional layer having light transmitting property such as Mg—Ag, as the third layer 24C (not illustrated). The cathode electrode 24 is not limited to the above-mentioned stacked structure, but it goes without saying that an optimum combination or stacked structure may be adopted according to the configuration of the device to be manufactured. For example, the configuration of the cathode electrode 24 according to the above-described present embodiment is a stacked structure of layers having respectively separated functions, in which an inorganic layer (the first layer 24A) that facilitates electron injection into the organic layer 23, an inorganic layer (the second layer 24B) that controls the electrode, and an inorganic layer (the third layer 24C) that protects the electrode are separated. However, the inorganic layer that facilitates electron injection into the organic layer 23 may also serve as the inorganic layer that controls the electrode. Alternatively, these layers may constitute a single layer.

Furthermore, in a case that the display element 20 has a cavity structure, the cathode electrode 24 may be preferably configured of a semitransparent and semireflecting material. This makes it possible to allow multiple interference of produced light between a light reflecting plane on the anode electrode 21 side and a light reflecting plane on the cathode electrode 24 side, allowing the light to be extracted on the cathode electrode 24 side. In this case, an optical distance between the light reflecting plane on the anode electrode 21 side and the light reflecting plane on the cathode electrode 24 side may be determined by a wavelength of the light to be extracted. The thickness of each layer may be assumed to be set to satisfy the optical distance. In such a display element of the upper surface light emission type, the positive use of the cavity structure allows improvement in the light extraction efficiency to the outside and the control of the light emission spectrum.

Above the display element 20, there may be provided, for example, a protective layer 25, an adhesive layer 26, and a sealing substrate 27, which are adapted to seal the display element 20 (a solid sealing structure).

The protective layer 25 is adapted to prevent water from intruding into the organic layer 23. The protective layer 25 may be configured of a material having low permeability and low water permeability and may have a thickness of, for example, 2 μm to 3 μm both inclusive. A material of the protective layer 25 may be either an insulating material or a conductive material. Examples of insulating materials may include inorganic amorphous insulating material such as amorphous silicon (α-Si), amorphous silicon carbide (α-SiC), amorphous silicon nitride (α-$Si_{1-x}N_x$), amorphous carbon (α-C), and so on. Such inorganic amorphous insulating materials have low water permeability since they do not constitute grains, making a good protective film.

The sealing substrate 27 is disposed on the cathode electrode 24 side of the display element 20, and is adapted to seal the display element 20 together with the adhesive layer 26. The sealing substrate 27 may be configured of a transparent material with respect to the light produced in the display element 20, specifically, glass, or the like. The sealing substrate 27 may be provided with, for example, a color filter and a light shielding film as a black matrix (both not illustrated), allowing the light produced in the display element 20 to be extracted and absorbing the external light that is reflected by wirings between the display elements 20 to improve contrast.

The color filter may include the red filter, the green filter, and the blue filter (neither illustrated), which are arranged in order. The red filter, the green filter, and the blue filter are formed in, for example, a square shape with little space between them. The red filter, the green filter, and the blue filter each may be configured of a resin mixed with a pigment. Selection of a pigment allows adjustment of light transmitting property so that light transmittance in a target wavelength region, i.e. red, green, or blue, is high while light transmittance in other wavelength regions are low.

The light shielding film may be configured of a black resin film that is mixed with, for example, a black colorant and has an optical density of 1 or more, or a thin film filter that utilizes interference in thin films. Among them, the configuration with the black resin film may be preferable, allowing low-cost and easy fabrication. The thin film filter may have, for example, a lamination of one or more layers of thin films that are configured of a metal, a metal nitride, or a metal oxide, allowing light to be attenuated utilizing interference in thin films. Specific examples of the thin film filters may include an alternate lamination of chromium (Cr) and chromium (III) oxide ($Cr_2O_3$).

In the display device 100, the sampling transistor 3A becomes conductive in response to the control signal supplied from the scan line WSL, and the signal potential of the picture signal is sampled. The sampled signal potential is retained by the storage capacitor 3C. In the meanwhile, the driving transistor 3B is supplied with a current from the power line DSL, allowing a drive current to be supplied to the light emitting element 3D (the display element 20) according to the signal potential retained by the storage capacitor 3C. The light emitting element 3D (the display element 20) emits light by the drive current thus supplied, at luminance according to the signal potential of the picture signal. The light is extracted through the cathode electrode 24, the color filter, and the sealing substrate 27.

Here, since the local concentration of electric field in the semiconductor layer 14 of the thin film transistor 10 is relaxed, the occurrence of a kink current or degradation in reliability of the thin film transistor 10 is restrained. Thus, defects of pixel characteristics are reduced, and display quality is improved.

Modification Example 3

Figure 55:
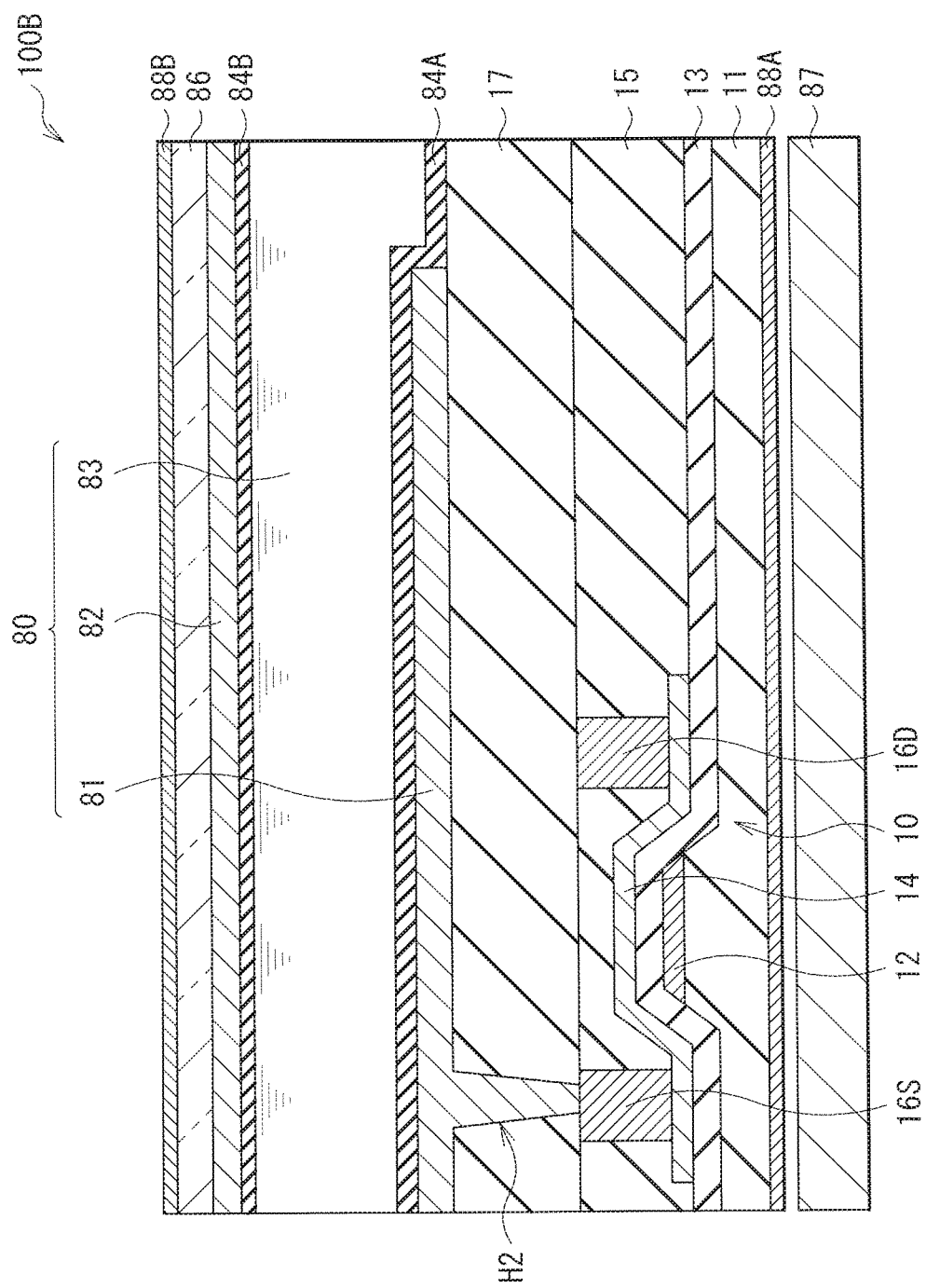
FIG. 55 is a cross-sectional view illustrating a configuration of a pixel of a display device according to a modification example 3 of the present disclosure.

FIG. 55 illustrates a plan configuration of a display device 100B according to a modification example 3 of the present disclosure. The present modification example involves a display element 80 that is configured of a liquid crystal display element. Otherwise, the display device 100B has similar configurations, functions and effects to those of the display device 100 according to the above-described embodiment, and may be manufactured similarly to the above-described embodiment. Therefore, description will be given with similar components denoted by same reference numerals.

The display element 80 has a configuration in which, for example, a liquid crystal layer 83 is sealed between a pixel electrode 81 and an opposite electrode 82. The faces on the liquid crystal layer 83 side of the pixel electrode 81 and the opposite electrode 82 are provided with orientation films 84A and 84B. The pixel electrode 81 is provided for each pixel and is connected to the source electrode 16S through the contact hole H2 provided in the planarization layer 17. The opposite electrode 82 is provided, on an opposite substrate 86, as a common electrode to a plurality of pixels and is configured to be maintained at, for example, a common potential. The liquid crystal layer 83 may be configured of a liquid crystal that is to be driven by, for example, a vertical alignment (VA) mode, a twisted nematic (TN) mode, or an in plane switching (IPS) mode, or the like.

Moreover, below the base 11, there is provided a backlight 87. On the backlight 87 side of the base 11 and on the opposite substrate 86, polarization plates 88A and 88B are attached.

Modification Example 4

Figure 56:
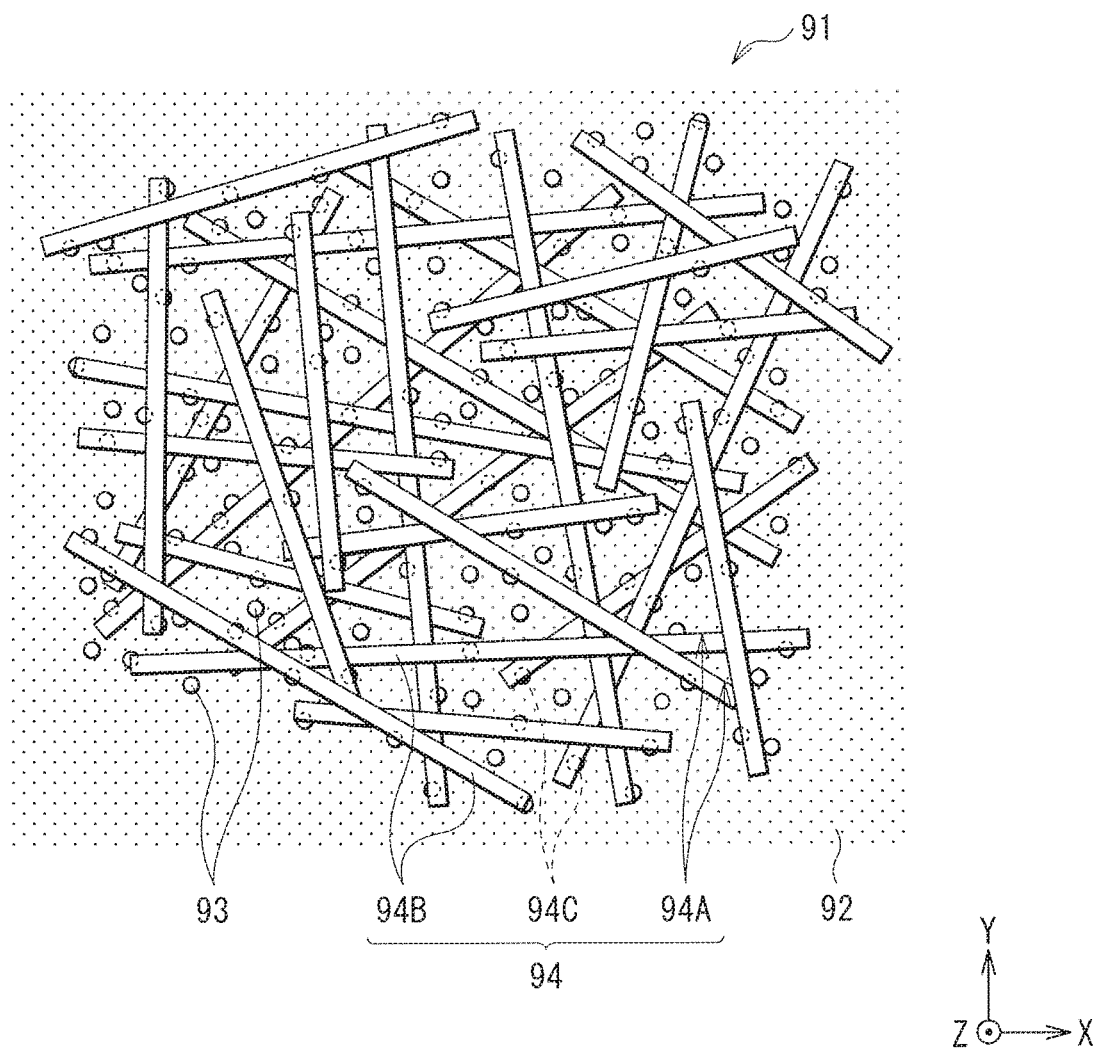
FIG. 56 is a plan view illustrating a configuration of an electrophoretic element as an example of a display element, in a display device according to a modification example 4 of the present disclosure.
Figure 57:
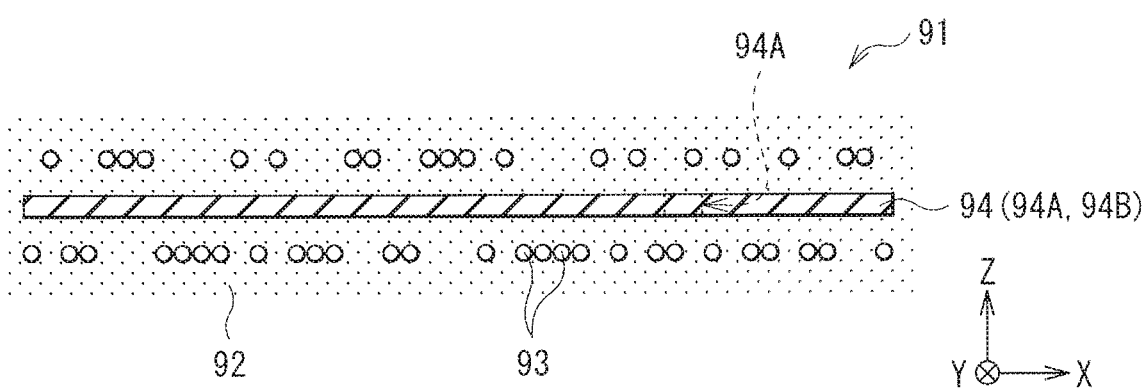
FIG. 57 is a cross-sectional view illustrating a configuration of the electrophoretic element illustrated in FIG. 56.

FIG. 56 illustrates a plan configuration of an electrophoretic element 91 that constitutes a display element of a display device according to a modification example 4 of the present disclosure. FIG. 57 illustrates a cross-sectional configuration of the electrophoretic element 91. The electrophoretic element 91 is adapted to produce contrast utilizing an electrophoretic phenomenon and may be applied to various electronic apparatuses such as display devices. The electrophoretic element 91 includes, in an insulating liquid 92, a phoretic particle 93 (a first particle) and a porous layer 94 having a pore 94A. It is to be noted that FIGS. 56 and 57 schematically illustrates a configuration of the electrophoretic element 91 and the illustration may be different from actual dimentions or shapes.

The insulating liquid 92 may be configured of, for example, an organic solvent such as paraffin or isoparaffin. For the insulating liquid 92, either one kind of organic solvent or a plurality of kinds of organic solvents may be used. A viscosity and a refractive index of the insulating liquid 92 may be preferably as low as possible. Lowering the viscosity of the insulating liquid 92 allows mobility (response speed) of the phoretic particle 93 to be enhanced. In accordance with this, energy (power consumption) for movement of the phoretic particle 93 is reduced. Lowering the refractive index of the insulating liquid 92 allows an increase in a difference in refractive index between the insulating liquid 92 and the porous layer 94, leading to higher reflectivity of the porous layer 94.

To the insulating liquid 92, for example, a colorant, a charge adjusting agent, a dispersion stabilizer, a viscosity adjusting agent, a surfactant, or a resin may be added.

The phoretic particle 93 dispersed in the insulating liquid 92 may be one charged particle, or two or more charged particles. Such a charged photeric particle 93 is adapted to move through the pore 94A in response to electric field. The phoretic particle 93 has an arbitrary optical reflective characteristic (light reflectivity). A difference between the light reflectivity of the phoretic particle 93 and the light reflectivity of the porous layer 94 allows contrast to be produced. For example, the phoretic particle 93 may perform bright display while the porous layer 94 may perform dark display. Alternatively, the phoretic particle 93 may perform dark display while the porous layer 94 may perform bright display.

When viewing the electrophoretic element 91 from the outside, in the case that the phoretic particle 93 performs bright display, the phoretic particle 93 is visually recognized in, for example, white color or near white color. In the case that the phoretic particle 93 performs dark display, the phoretic particle 93 is visually recognized in, for example, black color or near black color. The color of the phoretic particle 93 is not limited as long as it is possible to produce contrast.

The phoretic particle 93 may be configured of, for example, an organic pigment, an inorganic pigment, a dye, a carbon material, a metal material, a metal oxide, particles (powder) of glass or a polymer material (a resin), and so on. For the phoretic particle 93, either one kind of these, or two or more kinds of these may be used. It may be possible to configure the phoretic particle 93 of a crushed particle, a capsule particle, and so on of a resin solid content that includes the above-mentioned particle. It is to be noted that materials that correspond to the above-mentioned carbon material, the metal material, the metal oxide, the glass, or the polymer material are excluded from the materials that correspond to the organic pigment, the inorganic pigment, or the dye. A particle diameter of the phoretic particle 93 may be, for example, 30 nm to 300 nm both inclusive.

Examples of the above-mentioned organic pigments may include an azo-based pigment, a metal-complex-azo-based pigment, poly condensed azo-based pigment, a flavanthrone-based pigment, a benzimidazolone-based pigment, a phthalocyanine-based pigment, a quinacridone-based pigment, an anthraquinone-based pigment, a pelylene-based pigment, a pelynone-based pigment, an anthrapyridine-based pigment, a pyranthrone-based pigment, a dioxazine-based pigment, a thioindigo-based pigment, an isoindolinone-based pigment, a quinophthalone-based pigment, an indanthrene-based pigment, or the like. Examples of the inorganic pigments may include zinc oxide, antimony white, iron black, titanium boride, red iron oxide, mapico yellow, red lead, cadmium yellow, zinc sulfide, lithophone, barium sulfide, cadmium celenide, calcium carbonate, barium sulphate, lead chromate, lead sulfate, barium carbonate, lead white, alumina white, or the like. Examples of the dyes may include a nigrosine-based dye, an azo-based dye, a phthalocyanine-based dye, a quinophthalone-based dye, an anthraquinone-based dye, a methine-based dye, or the like. Examples of the carbon materials may include carbon black, or the like. Examples of the metal materials may include gold, silver, copper, or the like. Examples of the metal oxides may include titanium oxide, zinc oxide, zirconium oxide, barium titanate, a copper-chromium oxide, a copper-manganese oxide, a copper-iron-manganese oxide, a copper-chromium-manganese oxide, or a copper-iron-chromium oxide, or the like. Examples of polymer materials may include a polymer compound into which a functional group having a light absorbing region in a visible light region is introduced, or the like. Such a polymer compound is not limited in particular in terms of kind, as long as the polymer compound has the light absorbing region in the visible light region.

Selection of a specific material of the phoretic particle 93 may be made, for example, according to a role the phoretic particle 93 plays in producing contrast. In the case that the phoretic particle 93 performs bright display, for example, the metal oxide such as titanium oxide, zinc oxide, zirconium oxide, barium titanate, or potassium titanate, or the like may be used for the phoretic particle 93. In the case that the phoretic particle 93 performs dark display, for example, the carbon material such as carbon black, the metal oxide such as a copper-chromium oxide, a copper-manganese oxide, a copper-iron-manganese oxide, a copper-chromium-manganese oxide, and a copper-iron-chromium oxide, or the like may be used for the phoretic particle 93. Among them, the carbon material may be preferably used for the phoretic particle 93. The phoretic particle 93 made of the carbon material exhibits excellent chemical stability, mobility, and light absorbing property.

An amount (a concentration) of the phoretic particle 93 contained in the insulating liquid 92 may be, though not being limited in particular, 0.1 percent by weight to 10 percent by weight both inclusive, for example. In this concentration range, shielding property and mobility of the phoretic particle 93 are secured. Specifically, when the amount of the phoretic particle 93 contained is smaller than 0.1 percent by weight, the phoretic particle 93 hardly shield (conceal) the porous layer 94, causing a possibility of difficulty in generating sufficient contrast. On the other hand, when the amount of the phoretic particle 93 contained is larger than 10 percent by weight, dispersion property of the phoretic particle 93 is lowered. Therefore, there is a possibility of difficulty in phoresis of the phoretic particle 93, causing condensation.

It is preferable that the phoretic particle 93 be easily dispersed and charged in the insulating liquid 92 for a long period. Also, it is preferable that the phoretic particle 93 be hardly absorbed on the porous layer 94. Therefore, for example, a dispersion agent may be added to the insulating liquid 92. The dispersion agent may be used together with the charge adjusting agent.

The dispersion agent or the charge adjusting agent includes, for example, either one or both of positive and negative charges, and is adapted to increase an amount of charges in the insulating liquid 92 and to allow the phoretic particles 93 to disperse due to electrostatic repulsion. Examples of the dispersion agents may include "Solsperce" series manufactured by the Lubrizol Corporation, "BYK" series or "Anti-Terra" series manufactured by BYK-Chemie, or "Span" series manufactured by TCI America, Inc.

In order to enhance the dispersing property of the phoretic particles 93, surface treatment may be applied to the phoretic particles 93. Examples of the surface treatment may include rosin treatment, surfactant treatment, pigment derivative treatment, coupling agent treatment, graft polymerization treatment, or microcapsulation treatment, or the like. In particular, by performing graft polymerization treatment, microcapsulation treatment, or a combination thereof, it is possible to maintain dispersion stability of the phoretic particle 93 for a long period.

For the surface treatment, for example, a material (an absorptive material) that includes a functional group capable of being absorbed on a surface of the phoretic particle 93 and a polymerizable functional group, and so on may be used. A functional group capable of being absorbed may be determined according to a material that forms the phoretic particle 93. For example, in a case that the phoretic particle 93 is configured of a carbon material such as carbon black, an aniline derivative such as 4-vinylaniline may be absorbed. In a case that the phoretic particle 93 is configured of a metal oxide, an organosilane derivative such as 3-(trimethoxy silyl) propyl methacrylate may be absorbed. Examples of polymerizable functional groups may include a vinyl group, an acrylic group, a methacrylic group, and so on.

It may be possible to introduce a polymerizable functional group into the surface of the phoretic particle 93 and to perform the surface treatment by allowing the polymerizable functional group to be grafted (a grafted material). The grafted material may include, for example, a polymerizable functional group and a functional group for dispersion. The functional group for dispersion is adapted to allow the phoretic particle 93 to be dispersed in the insulating liquid 92 and to maintain the dispersing property by steric hindrance. In a case that the insulating liquid 92 is, for example, paraffin, a branched alkyl group and so on may be used for the functional group for dispersion. Examples of polymerizable functional groups may include a vinyl group, an acrylic group, a methacrylic group, and so on. In order to allow the grafted material to be polymerized and grafted, for example, a polymerization initiator such as azobisisobutyronitrile (AIBN) may be used.

Details of a method of dispersing the above-mentioned phoretic particle 93 in the insulating liquid 92 is included in books such as "Dispersion technology of ultrafine particles and its evaluation—surface treatment—pulverization and dispersion stabilization in atmosphere/liquid/polymer" published by Science & Technology Co. Ltd.

The porous layer 94 is adapted to be capable of shielding the phoretic particle 93, and may include a fibrous structure 94B and non-phoretic particle 94C (a second particle) that is supported by the fibrous structure 94B. The porous layer 94 may be a three-dimensional structure (an irregular network structure such as nonwoven fabric) formed by the fibrous structure 94B, and may be provided with a plurality of gaps (the pores 94A). The fibrous structure 94B constitutes the three-dimensional structure of the porous layer 94, allowing light (external light) to be irregularly reflected (multiplyscattered) and increasing reflectivity of the porous layer 94. Therefore, it is possible to obtain high reflectivity even in a case that a thickness of the porous layer 94 is small. This makes it possible to improve contrast of the electrophoretic element 91 and to reduce the energy for the movement of the phoretic particle 93. Moreover, an average pore diameter of the pore 94A becomes larger, and the number of the pores 94A provided in the porous layer 94 is increased. Thus, the movement of the phoretic particle 93 through the pore 94A is facilitated, increasing response speed and further reducing the energy for the movement of the phoretic particle 93. The thickness of the porous layer 94 may be, for example, 5 μm to 100 μm both inclusive.

The fibrous structure 94B may be a fibrous substance having a sufficient length with respect to a fiber diameter (diameter). For example, a plurality of fibrous structures 94B may be collected and randomly overlapped to constitute the porous layer 94. One fibrous structure 94B may be randomly entangled to constitute the porous layer 94. Alternatively, the porous layer 94 formed of one fibrous structure 94B and the porous layer 94 formed of the plurality of fibrous structures 94B may be mixedly present.

The fibrous structure 94B may be configured of, for example, a polymer material or an inorganic material, or the like. Examples of polymer materials may include nylon, polylactic acid, polyamide, polyimide, polyethylene terephthalate, polyacrylonitrile, polyethylene oxide, polyvinyl carbazole, polyvinyl chloride, polyurethane, polystyrene, polyvinyl alcohol, polysulfone, polyvinylpyrrolidone, polyvinylidene fluoride, polyhexafluoropropylene, cellulose acetate, collagen, gelatin, chitosan, or a copolymer thereof, and so on. Examples of the inorganic materials may include titanium oxide, and so on. For fibrous structure 94B, the polymer material may be preferably used. This is because the polymer materials have low reactivity with, for example, light, and are chemically stable. In other words, the use of the polymer materials makes it possible to prevent an unintended decomposition reaction of the fibrous structure 94B. In a case that the fibrous structure 94B is configured of a material having high reactivity, it is preferable that a surface be covered with an arbitrary protective film.

The fibrous structure 94B may extend, for example, linearly. The fibrous structure 94B may have whatever shape. For example, the fibrous structure 94B may shrink, or bends halfway. Alternatively, the fibrous structure 94B may be branched halfway.

An average fiber diameter of the fibrous structure 94B may be, for example, 50 nm to 2000 nm both inclusive. However, the average fiber diameter may fall out of the above-mentioned range. By reducing the average fiber diameter, it is possible to allow light to be easily irregularly reflected and to increase the pore diameter of the pore 94A. The fiber diameter may be determined so that the fibrous structure 94B is capable of support the non-phoretic particle 94C. The average fiber diameter may be measured by, for example, microscope observation using a scanning type electron microscope. An average length of the fibrous structure 94B may be arbitrary. The fibrous structure 94B may be formed by, for example, a phase separation method, a phase inversion method, an electrostatic spinning (electrospinning) method, a melt spinning method, a wet spinning method, a dry spinning method, a gel spinning method, a sol-gel method, or a spray coating method, or the like. The use of such methods makes it possible to form easily and steadily the fibrous structure 94B that has a sufficient length with respect to the fiber diameter.

The fibrous structure 94B may be preferably configured of nanofiber. Here, nanofiber refers to fibrous substance having a fiber diameter of 1 nm to 1000 nm both inclusive and having a length 100 times larger than the fiber diameter. The use of the nanofiber as the fibrous structure 94B facilitates irregular reflection of light, contributing to further enhancement of reflectivity of the porous layer 94. That is, it is possible to improve contrast of the electrophoretic element 91. Moreover, in the fibrous structure 94B made of nanofiber, a ratio of volume occupied by the pore 94A in unit volume becomes larger, facilitating the movement of the phoretic particle 93 through the pore 94A. Therefore, it is possible to reduce the energy for the movement of the phoretic particle 93. The fibrous structure 94B made of nanofiber may be preferably formed by the electrostatic spinning method. The use of the electrostatic spinning method makes it possible to form easily and steadily the fibrous structure 94B of a small fiber diameter.

For the fibrous structure 94B, one that has different light reflectivity from that of the phoretic particle 93 may be preferably used. Thus, it is possible to easily generate contrast due to a difference in light reflectivity between the porous layer 94 and the phoretic particle 93. The fibrous structure 94B that exhibits light transparency (that is colorless and transparent) in the insulating liquid 92 may also be used.

The pore 94A is configured by overlap of the plurality of the fibrous structures 94B or by entanglement of one fibrous structure 94B. The pore 94A may preferably have an average pore diameter as large as possible in order to facilitate the movement of the phoretic particle 93 through the pore 94A. The average pore diameter of the pore 94A may be, for example, 0.1 μm to 10 μm both inclusive.

The non-phoretic particle 94C is fixed to the fibrous structure 94B, and has different light reflectivity from that of the phoretic particle 93. The non-phoretic particle 94C may be configured of a same material as that of the above-mentioned phoretic particle 93. Specifically, in a case that the non-phoretic particle 94C (the porous layer 94) performs bright display, a same material as that of the phoretic particle 93 in a case that the phoretic particle 93 performs bright display may be used. In a case that the non-phoretic particle 94C (the porous layer 94) performs dark display, a same material as that of the phoretic particle 93 in a case that the phoretic particle 93 performs dark display. In a case that the porous layer 94 performs bright display, the non-phoretic particle 94C may be preferably configured of a metal oxide. Thus, it is possible to obtain excellent chemical stability, fixation and light reflectivity. In particular, the non-phoretic particle 94C may be preferably configured of a metal oxide having a high refractive index, for example, titanium oxide of rutile type. The constituent material of the non-phoretic particle 94C may be same as or different from that of the phoretic particle 93. The non-phoretic particle 94C may be fully buried inside of the fibrous structure 94B, or alternatively, may be partially exposed from the fibrous structure 94B. A color that is visually recognized externally when the non-phoretic particle 94C performs bright display or dark display is similar to that as described above with respect to the phoretic particle 93.

The porous layer 94 may be manufactured as follows, for example. First, a constituent material of the fibrous structure 94B such as a polymer material or the like is dissolved in, for example, an organic solvent or the like, preparing a spinning solution. Next, the non-phoretic particle 94C is added to the spinning solution, and the solution is sufficiently stirred to allow the non-phoretic particle 94C to be dispersed. Finally, spinning is carried out by, for example, an electrostatic spinning method from the spinning solution. Thus, the non-phoretic particle 94C is fixed to the fibrous structure 94B to form the porous layer 94. In order to form the pore 94A in the porous layer 94, a polymer film may be subjected to a piercing process using laser. Alternatively, for the porous layer 94, a cloth knitted of a synthetic fiber or the like, or an open-cell porous polymer, or the like may also be used.

The electrophoretic element 91 is adapted, as described above, to generate contrast due to the difference between the light reflectivity of the phoretic particle 93 and the light reflectivity of the porous layer 94. Specifically, out of the phoretic particle 93 and the porous layer 94, the light reflectivity of what performs bright display is higher than the light reflectivity of what performs dark display. Preferably, the light reflectivity of the non-phoretic particle 94C is higher than that of the phoretic particle 93, allowing the porous layer 94 to perform bright display and allowing the phoretic particle 93 to perform dark display. By performing such display, the light reflectivity in performing bright display is allowed to be remarkably increased utilizing the irregular reflection of light by the porous layer 94 (the three-dimensional structure). Therefore, in accordance with this, the contrast is remarkably enhanced.

In the electrophoretic element 91, within a range where an electric field is applied, the phoretic particle 93 moves through the pore 94A of the porous layer 94. In correspondence with a region where the phoretic particle 93 have moved and a region where the phoretic particle 93 have not moved, either bright display or dark display is performed, allowing an image to be displayed.

Figure 58:
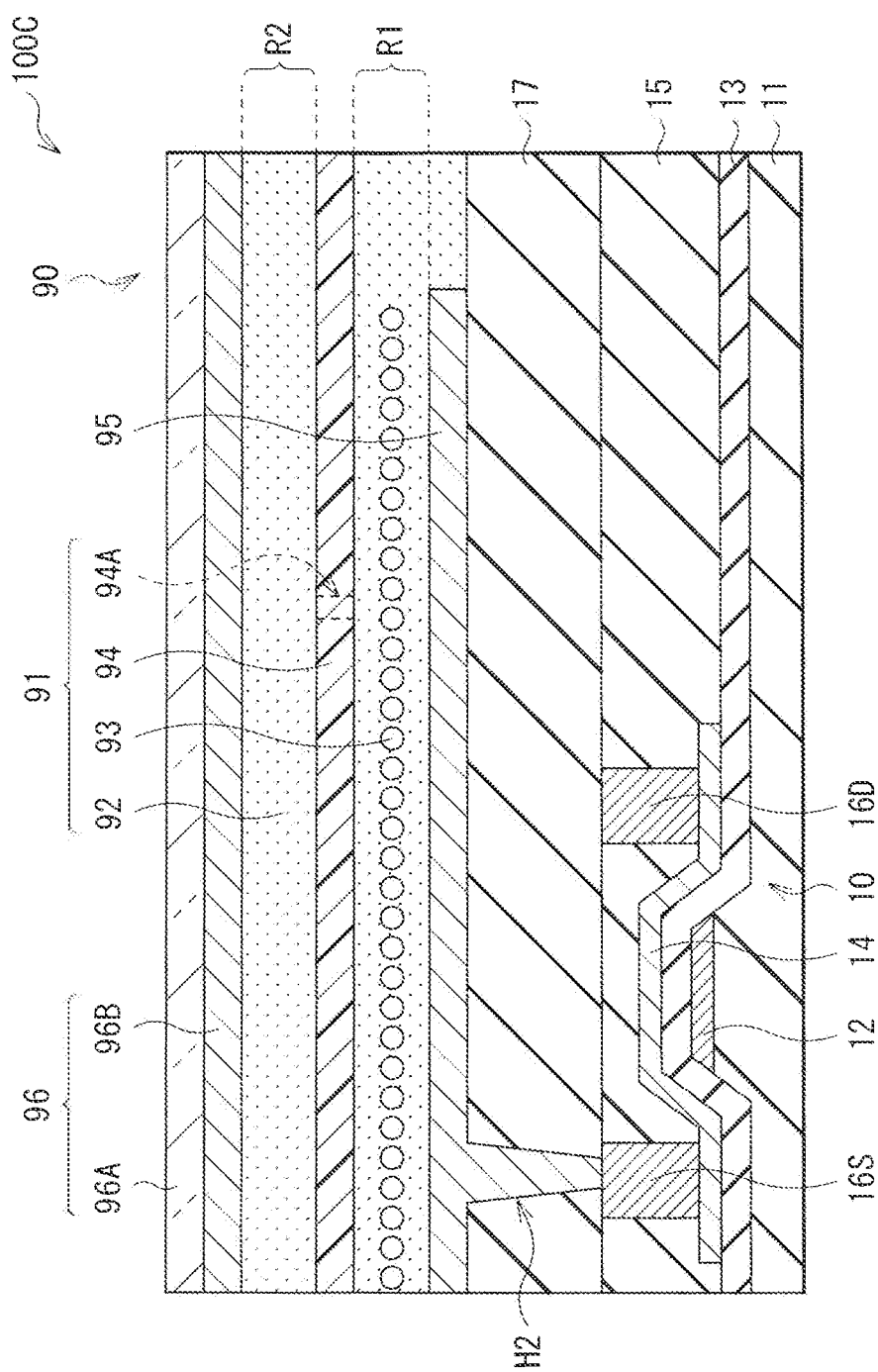
FIG. 58 is a cross-sectional view illustrating a configuration of a pixel of a display device including the electrophoretic element illustrated in FIG. 57.

FIG. 58 illustrates a cross-sectional configuration of a display device 100C using the electrophoretic element 91 as the display element. The display device 100C is an electrophoretic display device (a so-called electronic paper display device) that is adapted to display an image (for example, character information and so on) utilizing the electrophoretic phenomenon. The display device 100C may include, for example, on the base 11, a display element 90 that is configured of the electrophoretic element 91.

The display element 90 includes a pixel electrode 95, the above-described electrophoretic element 91, and an opposite substrate 96. A spacer (not illustrated) is interposed between the planarization layer 17 on the base 11 and the opposite substrate 96.

The pixel electrode 95 may be formed of, for example, a metal material such as gold (Au), silver (Ag), or copper (Cu), or the like. The pixel electrode 95 is connected to the source electrode 16S through the contact hole H2. The pixel electrode 95 may be arranged, for example, in a matrix or in a segment shape according to a pixel layout.

The opposite substrate 96 includes, for example, a plate member 96A and an opposite electrode 96B. The opposite electrode 96B may be formed on an entire surface (a surface facing the base 11) of the plate member 96A. The opposite electrode 96B may be arranged, similarly to the pixel electrode 95, in a matrix or in a segment shape.

The plate member 96A has light transparency and may be configured of, for example, an inorganic material, a metal material, or a plastic material, or the like. Examples of inorganic materials may include silicon (Si), silicon oxide (SiOx), silicon nitride (SiNx), or aluminum oxide (AlOx), and so on. Examples of silicon oxide may include glass, or spin on glass (SOG), or the like. Examples of metal materials may include aluminum (Al), nickel (Ni), or stainless steel, or the like. Examples of plastic materials may include polycarbonate (PC), polyethylene terephthalate (PET), polyethylene naphthalate (PEN), or polyethyl ether ketone (PEEK), or the like.

For the opposite electrode 96B, the following light transparent conductive materials (transparent electrode materials) may be used. For example, indium oxide-tin oxide (ITO), antimony oxide-tin oxide (ATO), fluorine doped tin oxide (FTO), or aluminum doped zinc oxide (AZO).

In a case that an image is displayed on the opposite substrate 96 side, the electrophoretic element 91 is viewed through the opposite electrode 96B. Therefore, the light transparency (light transmittance) of the opposite electrode 96B is preferably as high as possible, for example, 80 percent or more. Moreover, electrical resistance of the opposite electrode 96B is preferably as low as possible, for example, 100Ω/□ or less.

The electrophoretic element 91 includes, as described above, in the insulating liquid 92, the phoretic particle 93, the porous layer 94 including the plurality of pores 94A. The insulating liquid 92 is filled in a space between the planarization layer 17 and the opposite substrate 96. The porous layer 94 is supported by, for example, the spacer (not illustrated). The space where the insulating liquid 92 is filled is divided into, for example, a retreat region R1 and a display region R2 with the porous layer 94 as a boundary. The retreat region R1 is on the side closer to the pixel electrode 95. The display region R2 is on the side closer to the opposite electrode 96B. Configurations of the insulating liquid 92, the phoretic particle 93, and the porous layer 94 may be same as described above. It is to be noted that, in FIG. 58 and FIG. 59, which is to be described later, part of the pores 94A are shown for simplicity of the figures.

The porous layer 94 may be adjacent to either one of the pixel electrode 95 and the opposite electrode 96B. The retreat region R1 and the display region R2 may not be divided clearly. The phoretic particle 93 is adapted to move toward the pixel electrode 95 or the opposite electrode 96B in response to an electric field.

A thickness of the spacer (not illustrated) may be, for example, 10 μm to 100 μm both inclusive. The thickness of the spacer (not illustrated) is preferably as thin as possible. Thus, it is possible to reduce power consumption. The spacer (not illustrated) may be configured of, for example, an insulating material such as a polymer material, or the like, and is provided in a lattice shape between the planarization layer 17 and the opposite substrate 96. An arrangement and a shape of the spacer (not illustrated) are not limited in particular, but may be preferably provided so that the movement of the phoretic particle 93 is not hindered and the phoretic particles 93 are distributed uniformly.

In the display device 100C in an initial state, the phoretic particle 93 is disposed in the retreat region R1 (FIG. 58). In this case, the phoretic particle 93 is shielded by the porous layer 94 in all the pixels. Therefore, when viewed from the opposite substrate 96 side, the electrophoretic element 91 is in a no-contrast-generated (no-display) state.

Figure 59:
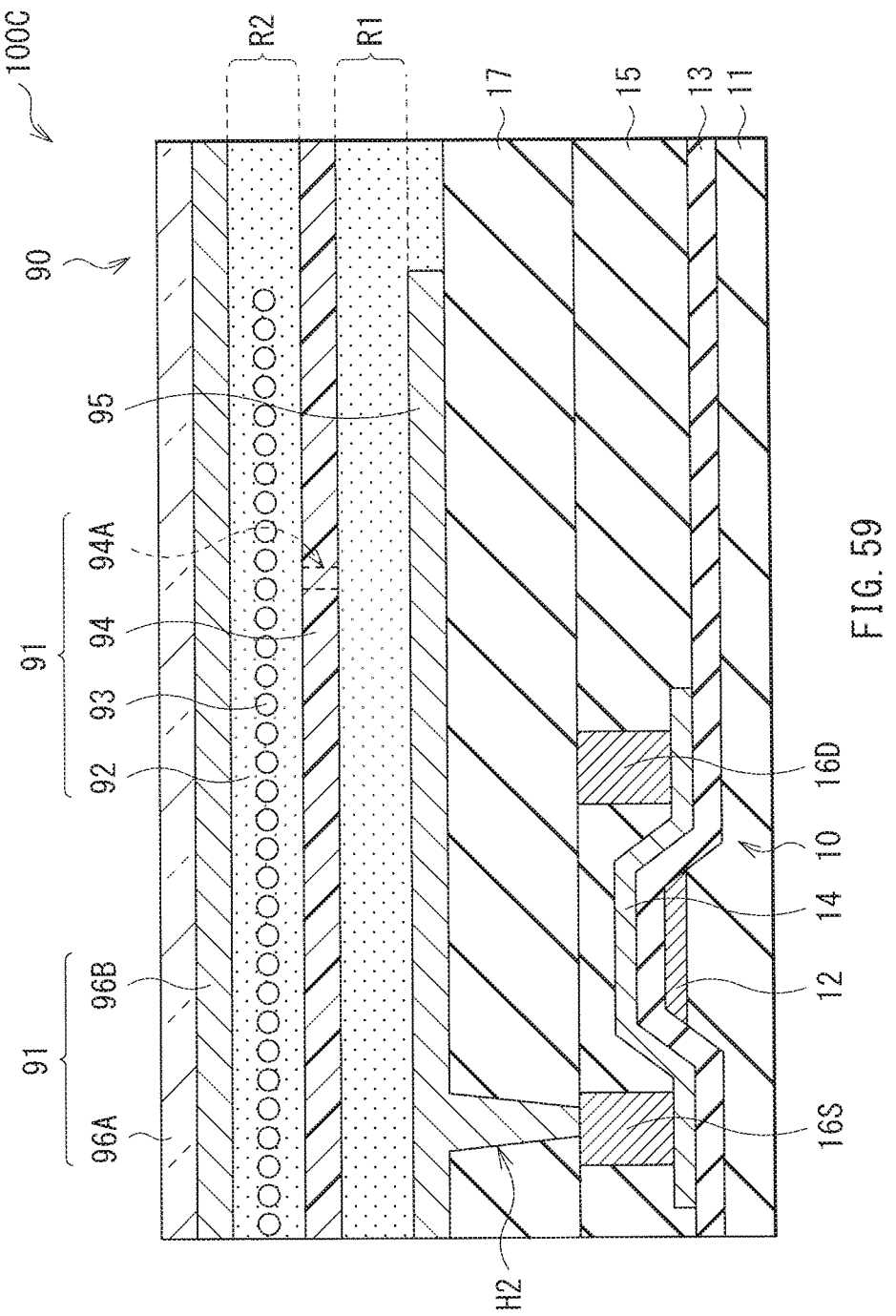
FIG. 59 is a cross-sectional view illustrating an operation of the display device illustrated in FIG. 58.

On the other hand, when a pixel is selected by the thin film transistor 10 on the base 11, and an electric filed is applied between the pixel electrode 95 and the opposite electrode 96B, as illustrated in FIG. 59, the phoretic particle 93 moves, for each pixel, from the retreat region R1 to the display region R2 through the porous layer 94 (the pores 94A). In this case, there are a pixel where the phoretic particle 93 is shielded by the porous layer 94 and a pixel where the phoretic particle 93 is not shielded by the porous layer 94. Therefore, when viewed from the opposite substrate 96 side, the electrophoretic element 91 is in a contrast-generated state. Thus, an image is displayed.

Application Examples

In the following, description will be given on application examples of the display device according to the above-described example embodiment with reference to FIGS. 60 to 74. The display device according to above-described example embodiment may be applied to an electronic apparatus in various fields, for example, a television set, a digital camera, a notebook personal computer, a mobile terminal device such as a mobile phone and a smart phone or a video camera. In other words, the display device may be applied to an electronic apparatus in various fields that is configured to display an image or a picture based on a picture signal input from outside or generated inside.
(Module)

Figure 60:
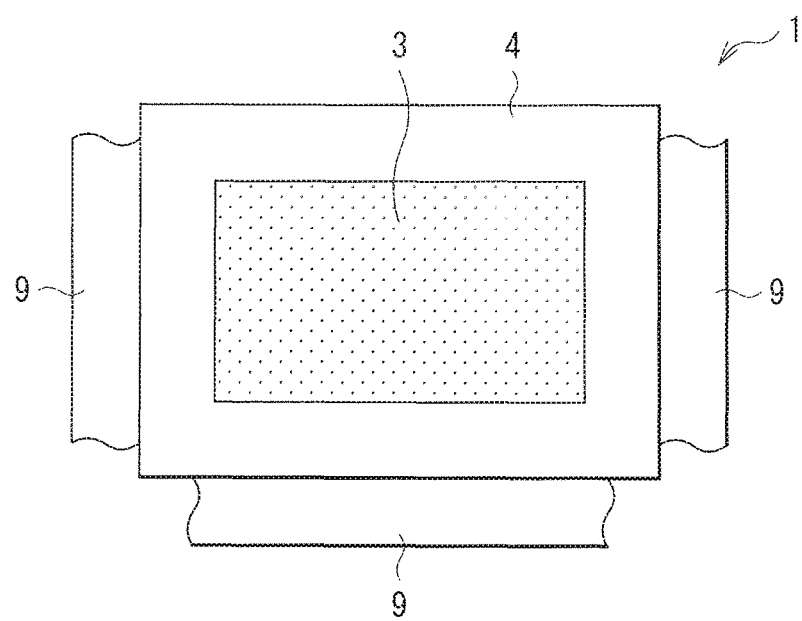
FIG. 60 is a plan view illustrating an overall configuration of a module including the display device of the above-described embodiment.

The display device according to above-described example embodiment may be incorporated, in a form of a module as illustrated in FIG. 60, in an electronic apparatus such as application examples 1 to 9, which will be exemplified in the followings. The module includes, for example, a pixel region 3 in the center of the base 11 and a peripheral region 4 outside the pixel region 3. In the pixel region 3, provided is a pixel array section 102 as illustrated in FIG. 49. In the peripheral region 4, provided is a drive section (the signal selector 103, the main scanner 104, and the power scanner 105) as illustrated in FIG. 49. Also in the peripheral region 4, provided are external connection terminals (not illustrated) that are extended from wirings of the pixel array section 102. To the external connection terminals, a flexible printed circuit (FPC) 9 for signal input and output may be connected.

Application Example 1

Figure 61:
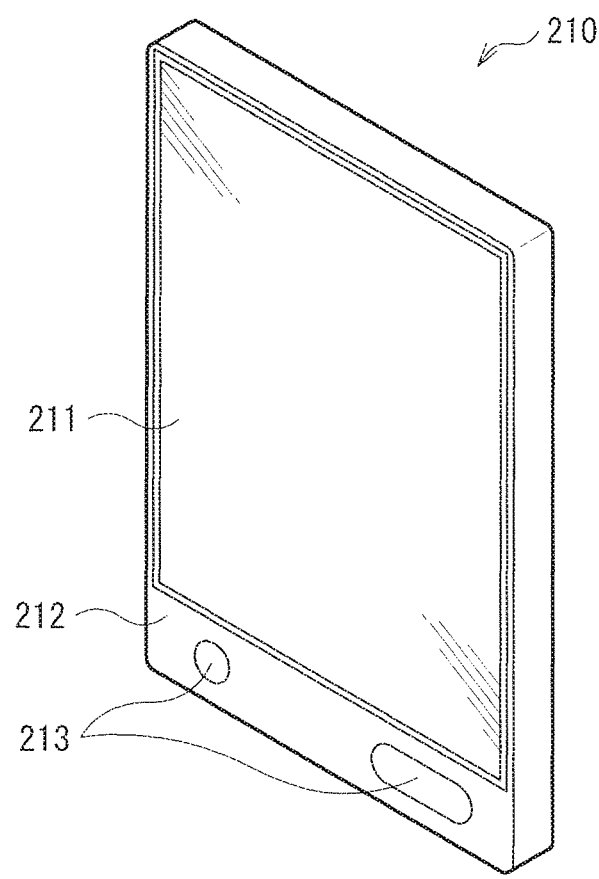
FIG. 61 is a perspective view illustrating an appearance of an application example 1.
Figure 62:
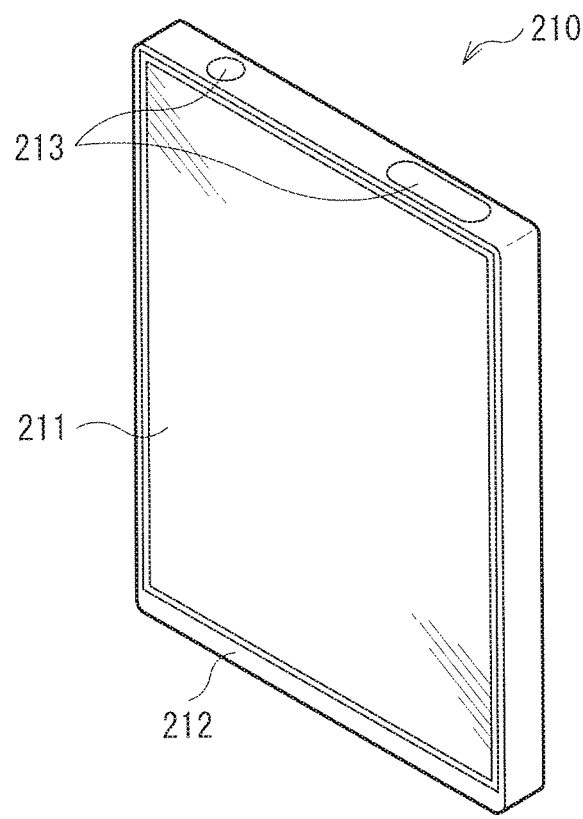
FIG. 62 is another perspective view illustrating the appearance of the application example 1.

FIGS. 61 and 62 illustrate an appearance configuration of an electronic book 210. The electronic book 210 includes, for example, a display section 211 and a non-display section 212, and an operation section 213. It is to be noted that the operation section 213 may be provided either on a front face of the non-display section 212 as illustrated in FIG. 61, or on an upper face of the non-display section 212 as illustrated in FIG. 62. The display section 211 is configured of the display device according to the above-described example embodiment. It is to be noted that the display device according to the above-described example embodiment may be mounted on a personal digital assistant (PDA) having a similar configuration to that of the electronic book as illustrated in FIGS. 61 and 62.

Application Example 2

Figure 63:
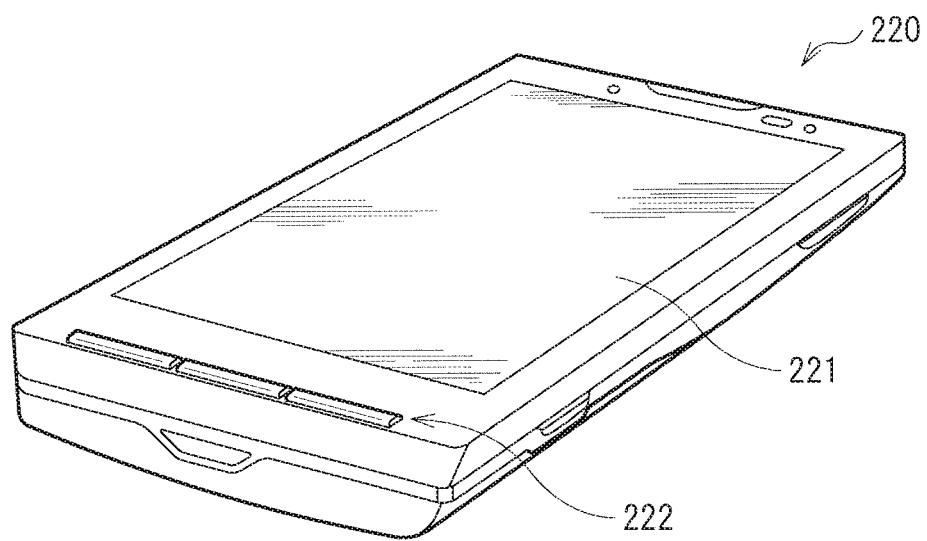
FIG. 63 is a perspective view illustrating an appearance of an application example 2 viewed from the front side.
Figure 64:
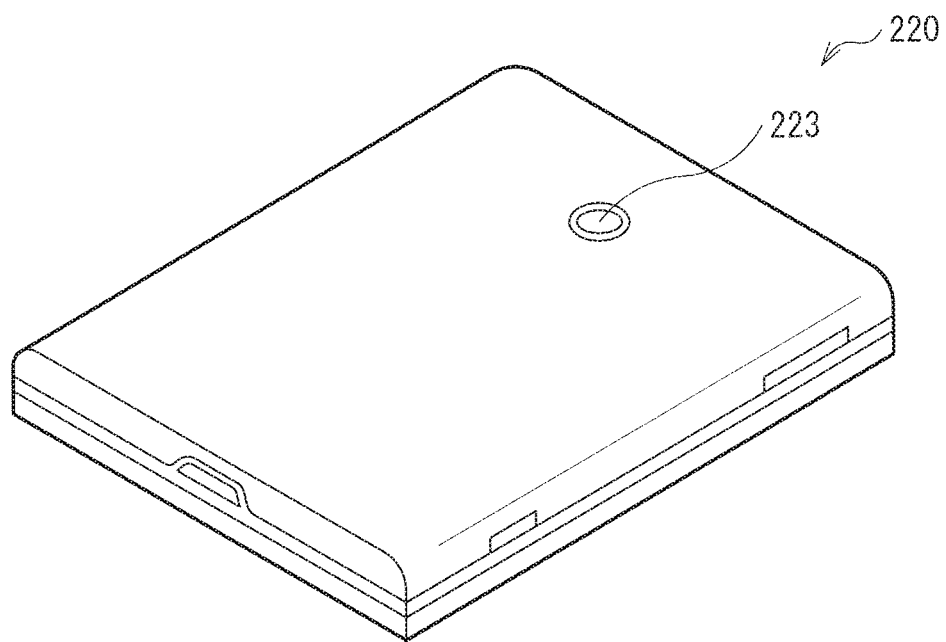
FIG. 64 is a perspective view illustrating the appearance of the application example 2 viewed from the back side.

FIGS. 63 and 64 illustrate an appearance of a smart phone 220. The smart phone 220 includes, for example, a display section 221 and an operation section 222 on a front side, and a camera 223 on a back side. The display section 221 is configured of the display device according to the above-described example embodiment.

Application Example 3

Figure 65:
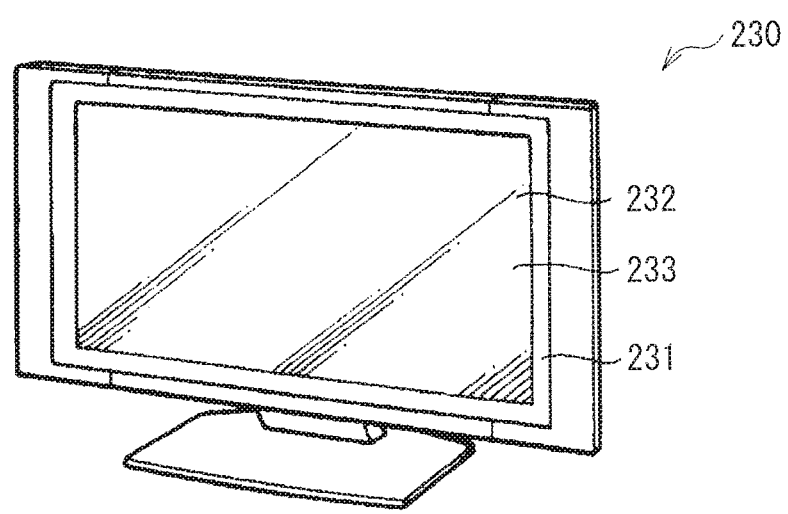
FIG. 65 is a perspective view illustrating an appearance of an application example 3.

FIG. 65 illustrates an appearance of a television set 230 to which the display device according to the above-described example embodiment is applied. The television set 230 includes, for example, a picture display screen section 233 that includes a front panel 231 and a filter glass 232. The picture display screen section 233 is configured of the display device according to the above-described example embodiment.

Application Example 4

Figure 66:
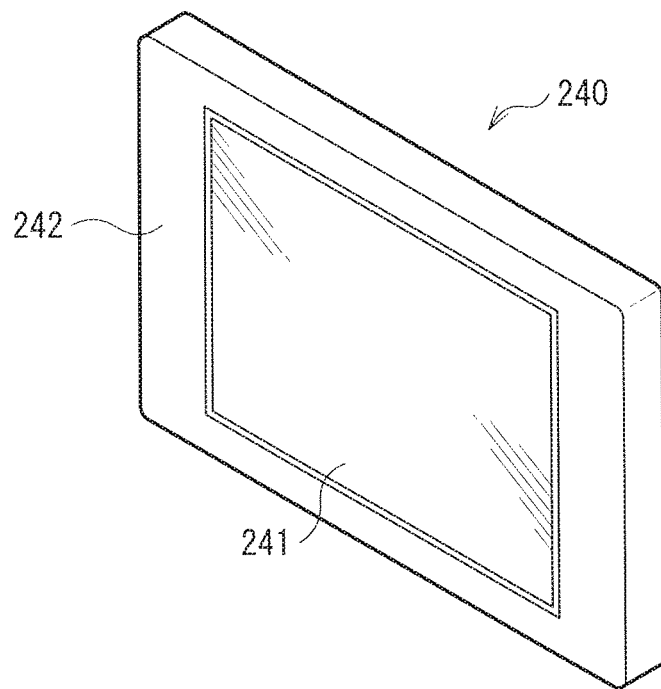
FIG. 66 is a perspective view illustrating an appearance of an application example 4.

FIG. 66 illustrates an appearance of a tablet personal computer 240. The tablet personal computer 240 includes, for example, a touch panel section 241 and a casing 242. The touch panel section 241 is configured of the display device according to the above-described example embodiment.

Application Example 5

Figure 67:
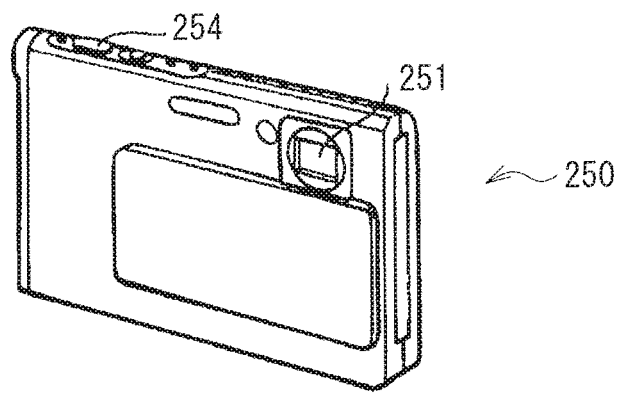
FIG. 67 is a perspective view illustrating an appearance of an application example 5 viewed from the front side.
Figure 68:
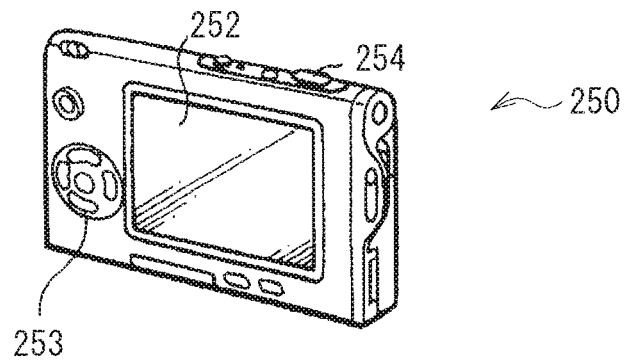
FIG. 68 is a perspective view illustrating the appearance of the application example 5 viewed from the back side.

FIGS. 67 and 68 illustrate an appearance of a digital still camera 250. The digital still camera 250 includes, for example, a lighting section for flash lighting 251, a display section 252, a menu switch 253, and a shutter button 254. The display section 252 is configured of the display device according to the above-described example embodiment.

Application Example 6

Figure 69:
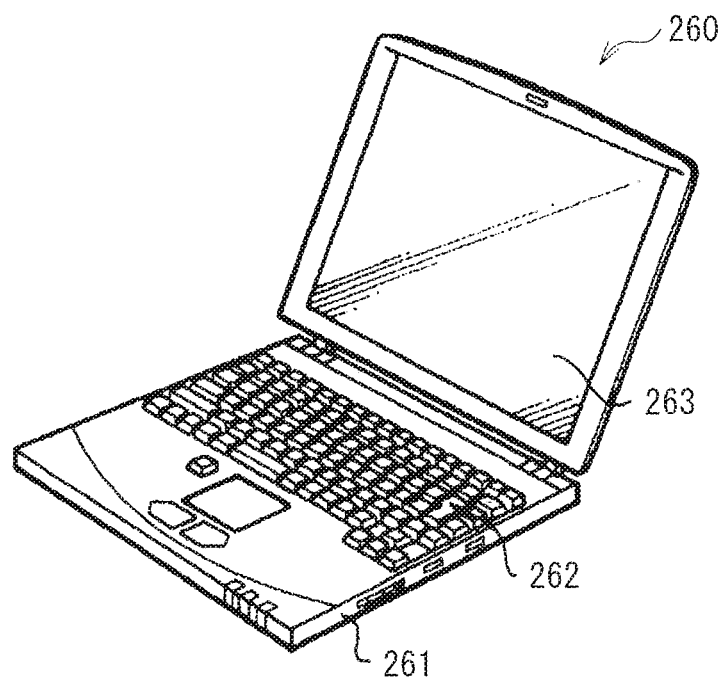
FIG. 69 is a perspective view illustrating an appearance of the application example 6.

FIG. 69 illustrates an appearance of a notebook personal computer 260. The notebook personal computer 260 includes, for example, a main body 261, a keyboard 262 for input operations of characters and the like, and a display section 263 for image display. The display section 263 is configured of the display device according to the above-described example embodiment.

Application Example 7

Figure 70:
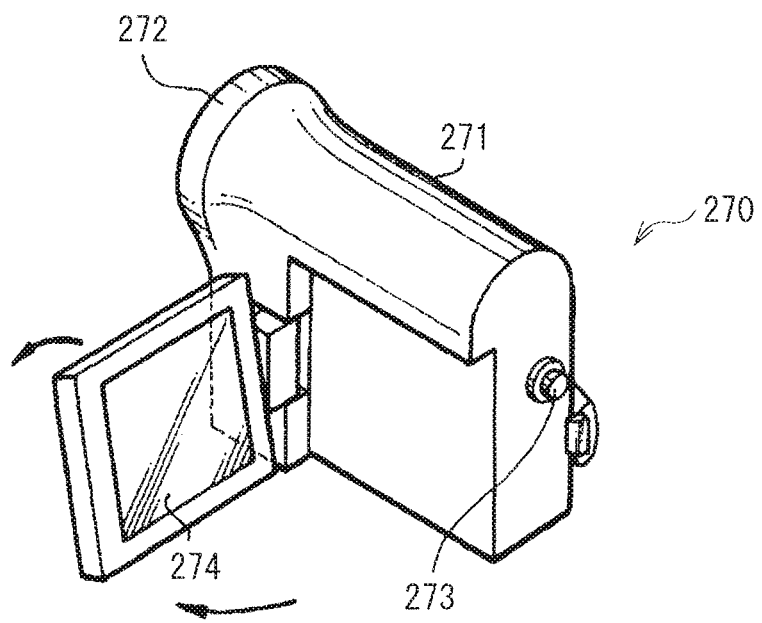
FIG. 70 is a perspective view illustrating an appearance of the application example 7.

FIG. 70 illustrates an appearance of a video camera 270. The video camera 270 includes, for example, a main body 271, a lens 272 for photographing an object, which is provided on a front side face of the main body 271, a start/stop switch 273 in photographing, and a display section 274. The display section 274 is configured of the display device according to the above-described example embodiment.

Application Example 8

Figure 71:
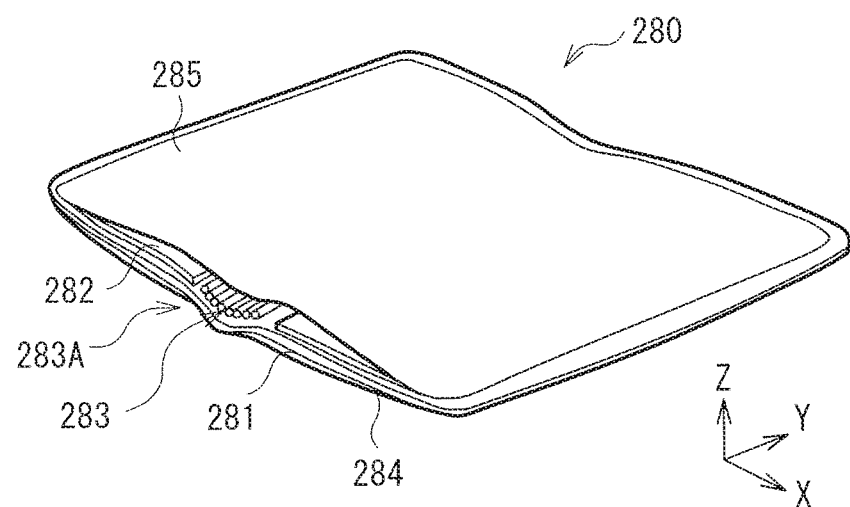
FIG. 71 is a perspective view illustrating an application example 8 in an opened state.
Figure 72:
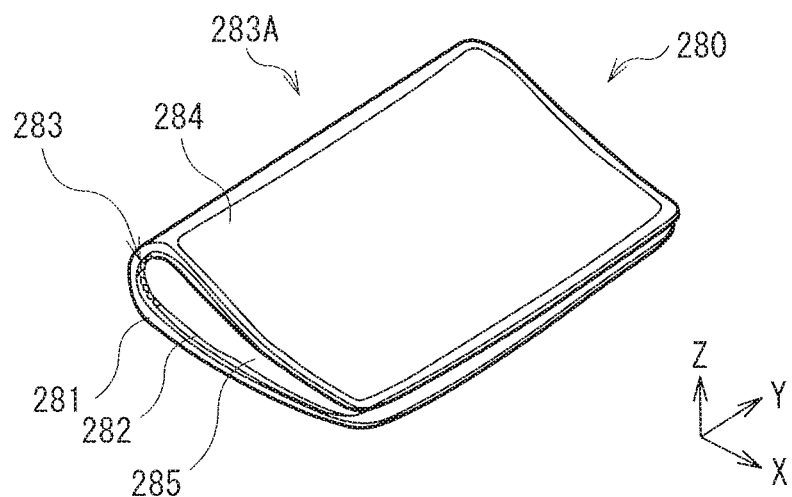
FIG. 72 is a perspective view illustrating the application example 8 in a closed state.

FIGS. 71 and 72 illustrates an appearance of another electronic book 280. The electronic book 280 is a thin flexible display formed of a component of a soft material. In the electronic book 280, the whole device is configured to be closed (folded) or opened as if an actual book manufactured by binding a plurality of sheets of paper. This allows a user to view contents displayed on the electronic book 280 (for example, pages of a book, and so on), giving the user a sensation of actual book reading.

The electronic book 280 includes, on a support substrate 281, a display section 282. The electronic book 280 also includes a hinge section 283 at a back portion (a back 283A) of a book. On a lower surface side (a surface on the outside when closed) of the electronic book 280, provided is a cover 284 made of a soft resin film. An upper surface side (a surface on the inside when closed) is covered with a protective sheet 285 made of a resin film that is soft and transparent to display light. The display section 282 is configured of the display device according to the above-described example embodiment.

Application Example 9

Figure 73:
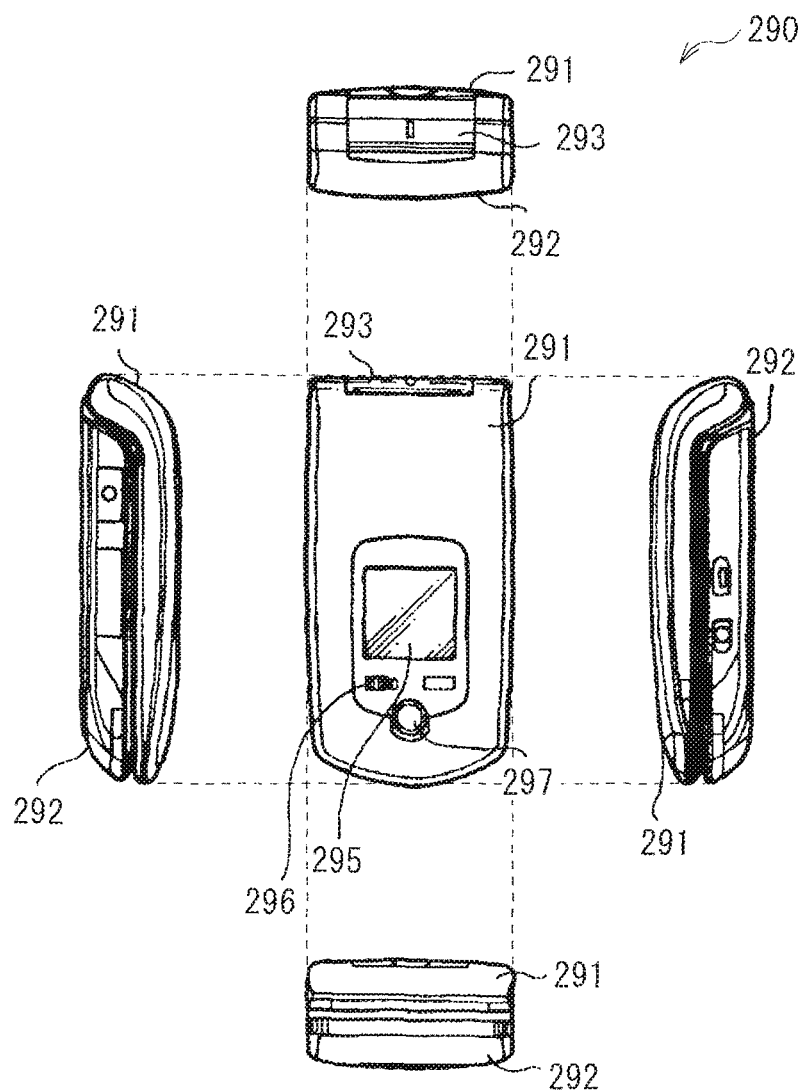
FIG. 73 illustrates an application example 9 in a closed state.
Figure 74:
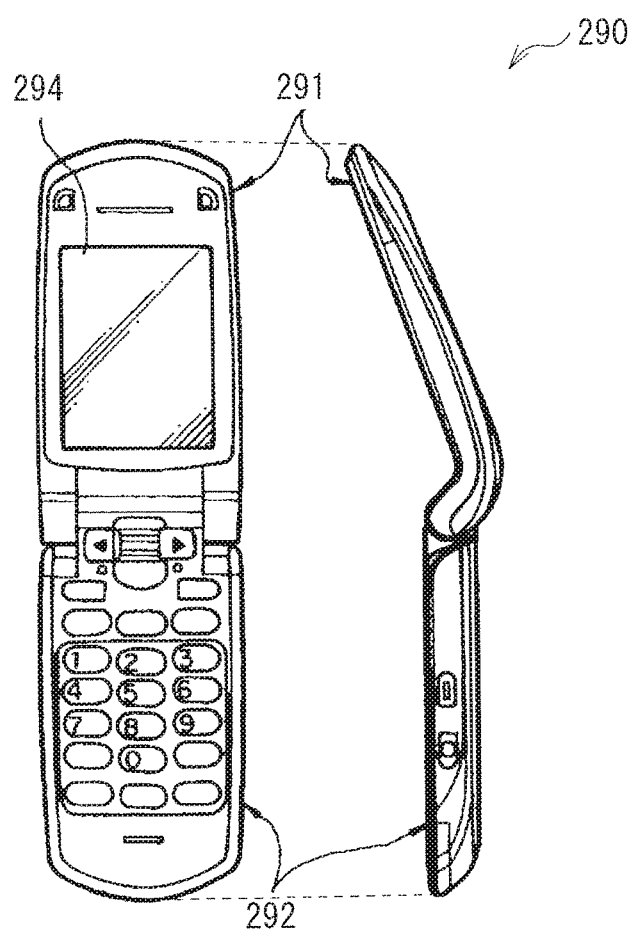
FIG. 74 illustrates the application example 9 in an opened state.

FIGS. 73 and 74 illustrate an appearance of a mobile phone 290. The mobile phone 290 has a configuration, for example, in which an upper casing 291 and a lower casing 292 are linked by a connection section (a hinge section) 293, and includes a display 294, a sub-display 295, a picture light 296, and a camera 297. The display 294 or the sub-display 295 is configured of the display device according to the above-described example embodiment.

Although description has been made by giving the example embodiment as mentioned above, the contents of the present technology are not limited to the above-mentioned example embodiment and may be modified in a variety of ways.

For example, in the above-described example embodiment, description has been given on specific configurations of the display devices 100, and 100A to 100C. However, the display devices 100, and 100A to 100C are not limited to display devices including all the components as illustrated. Moreover, some components may be substituted by other components.

Moreover, in the above-described example embodiment, description has been given on specific configurations and operations of the pixel circuit 101. However, configurations of the pixel circuit for active matrix driving are not limited to as exemplified in the above-described example embodiment. A capacitor or a transistor may be added as necessary, or the connection relation may be altered. In this case, according to changes or alterations of the pixel circuit, an additional drive circuit may be provided in addition to the above-mentioned drive section (the signal selector 103, the main scanner 104, and the power scanner 105). Moreover, it goes without saying that driving methods and operations of the pixel circuit are not limited to as exemplified above, but appropriate changes or alterations may be possible.

Furthermore, a material and a thickness, or a deposition method or a deposition condition of each layer as described in the above-mentioned example embodiment are not limited to as exemplified above, but other materials and other thicknesses, or other deposition methods or other deposition conditions may be adopted.

In addition, in the above-described example embodiment, description has been given on a solid sealing structure in which the display element 20 is covered with the protective layer 25, the adhesive layer 26, and the sealing substrate 27, with no space left between the protective layer 25 and the sealing substrate 27. However, it is possible to adopt a hollow sealing structure in which the display element 20 is covered with the protective layer 25 and a lid member (not illustrated), with a space left between the protective layer 25 and the lid member. In this case, it is desirable that a getter agent (not illustrated) is disposed in the space between the protective layer 25 and the lid member, preventing water from intruding into the organic layer 23.

Furthermore, in the above-described example embodiment, description has been given on a case that the display element 20 includes the anode electrode 21, the organic layer 23, and the cathode electrode 24 in this order from the base 11 side. However, the anode electrode 21 and the cathode electrode 24 may be inverted, and the display element 20 may include the cathode electrode 24, the organic layer 23, and the anode electrode 21 from the base 11 side. Also in this case, it is possible to adopt both the upper surface emission in which light is extracted from the anode electrode 21 side and the lower surface emission in which light is extracted from the cathode electrode 24 (the base 11) side.

Further in addition, in the above-described example embodiment, description has been given on specific configurations of the display elements 20, 80, and 90. However, it is not necessary to include all the layers, and another layer or other layers may be further provided.

Furthermore, the display elements 20, 80, and 90 may be configured of other display elements such as an inorganic electroluminescence element, or an electrodeposition or electrochromic display element or the like, in addition to the organic EL element, the liquid crystal display element, and the electrophoretic display element.

It is to be noted that effects described in the specification are merely exemplified and not limitative, and effects of the present disclosure may be other effects or may further include other effects.

It is possible to achieve at least the following configurations from the above-described example embodiments of the disclosure.

(1) A thin film transistor, including:
a base that includes, on an upper surface, a first region and a second region other than the first region;
a gate electrode that is provided on the first region of the base;
a gate insulating film that is provided on a surface of the gate electrode and the second region of the base; and
a semiconductor layer that is provided on a surface of the gate insulating film,
wherein the semiconductor layer includes a third region and a fourth region other than the third region,
in the third region, the semiconductor layer and the gate electrode face with a minimum interval,
in the fourth region, a distance from the semiconductor layer to the gate electrode is larger than the minimum interval, and
at a boundary position between the third region and the fourth region, the semiconductor layer forms a linear shape or a substantially linear shape.

(2) The thin film transistor according to (1), wherein
the base includes, in the second region, a fifth region and a sixth region, the fifth region being inclined with respect to the first region, the sixth region being parallel to the first region, and
the boundary position between the third region and the fourth region of the semiconductor layer is different from a position at which the semiconductor layer bends in shape at a boundary between the fifth region and the sixth region of the base.

(3) The thin film transistor according to (2), wherein
the gate electrode includes an upper surface and a side surface, the upper surface being parallel to the first region, the side surface being inclined with respect to the first region, and
the side surface of the gate electrode and the fifth region form a linear shape or a substantially linear shape.

(4) The thin film transistor according to (2) or (3),
wherein a level difference between the first region and the sixth region of the base is larger than a thickness of the gate electrode.

(5) The thin film transistor according to any one of (2) to (4), wherein
the base is configured of a laminated body of a first insulating layer and a second insulating layer,
the first region has a configuration in which the second insulating layer is laminated on the first insulating layer,
the fifth region is configured of a side surface of the second insulating layer, and
the sixth region is configured of an upper surface of the first insulating layer.

(6) The thin film transistor according to any one of (2) to (5), wherein the fifth region is provided on one or both of a drain side and a source side of the gate electrode.

(7) The thin film transistor according to (1), wherein the semiconductor layer has a linear shape that is parallel to the first region.

(8) The thin film transistor according to (1), wherein the gate electrode has an upper surface and a side surface, the upper surface being parallel to the first region, the side surface being inclined with respect to the first region, and a degree of inclination of the semiconductor layer with respect to the first region at the side surface of the gate electrode is different from a degree of inclination of the side surface of the gate electrode with respect to the first region.

(9) The thin film transistor according to (8), further including a side wall, the side wall being provided on the side surface of the gate electrode.

(10) A display device provided with a display element and a thin film transistor that is configured to drive the display element, the thin film transistor including:
a base that includes, on an upper surface, a first region and a second region other than the first region;
a gate electrode that is provided on the first region of the base;
a gate insulating film that is provided on a surface of the gate electrode and the second region of the base; and
a semiconductor layer that is provided on a surface of the gate insulating film,
wherein the semiconductor layer includes a third region and a fourth region other than the third region,
in the third region, the semiconductor layer and the gate electrode face with a minimum interval,
in the fourth region, a distance from the semiconductor layer to the gate electrode is larger than the minimum interval, and
at a boundary position between the third region and the fourth region, the semiconductor layer forms a linear shape or a substantially linear shape.

(11) An electronic apparatus provided with a display device, the display device including a display element and a thin film transistor that is configured to drive the display element, the thin film transistor including:
a base that includes, on an upper surface, a first region and a second region other than the first region;
a gate electrode that is provided on the first region of the base;
a gate insulating film that is provided on a surface of the gate electrode and the second region of the base; and
a semiconductor layer that is provided on a surface of the gate insulating film,
wherein the semiconductor layer includes a third region and a fourth region other than the third region,
in the third region, the semiconductor layer and the gate electrode face with a minimum interval,
in the fourth region, a distance from the semiconductor layer to the gate electrode is larger than the minimum interval, and
at a boundary position between the third region and the fourth region, the semiconductor layer forms a linear shape or a substantially linear shape.

(12) A method of manufacturing a thin film transistor, the method including:
forming a gate electrode on a first region of a base, the base including, on an upper surface, the first region and a second region other than the first region;
forming a gate insulating film on a surface of the gate electrode and the second region of the base; and
forming a semiconductor layer on a surface of the gate insulating film,
wherein the semiconductor layer includes a third region and a fourth region other than the third region,
in the third region, the semiconductor layer and the gate electrode face with a minimum interval,
in the fourth region, a distance from the semiconductor layer to the gate electrode is larger than the minimum interval, and
at a boundary position between the third region and the fourth region, the semiconductor layer forms a linear shape or a substantially linear shape.

(13) The method of manufacturing the thin film transistor according (12), further including, after forming the gate electrode, etching the second region of the base using, as a mask, the gate electrode or a resist film having a same layout as the gate electrode, to form a fifth region and a sixth region in the second region, the fifth region being inclined with respect to the first region, the sixth region being parallel to the first region,
wherein the boundary position between the third region and the fourth region of the semiconductor layer is different from a position at which the semiconductor layer bends in shape at a boundary between the fifth region and the sixth region of the base.

(14) The method of manufacturing the thin film transistor according to (13), wherein
in forming the gate electrode, the gate electrode is provided with an upper surface and a side surface, the upper surface being parallel to the first region, the side surface being inclined with respect to the first region, and
in etching the second region of the base, the side surface of the gate electrode and the fifth region form a linear shape or a substantially linear shape.

(15) The method of manufacturing the thin film transistor according to (13),
wherein in etching the second region of the base, the second region of the base is etched deeper than a thickness of the gate electrode.

(16) The method of manufacturing the thin film transistor according to (13), wherein
the base is configured of a laminated body of a first insulating layer and a second insulating layer, and
in etching the second region of the base, the second insulating layer of the sixth region is removed.

(17) The method of manufacturing the thin film transistor according to (12), wherein
in forming the gate electrode, a spacer layer is formed in the second region, the spacer layer having a same thickness or a substantially same thickness as a thickness of the gate electrode, and
in forming the gate insulating film, the gate insulating film is formed on an upper surface of the gate electrode and an upper surface of the spacer layer, allowing an upper surface of the gate insulating film to be formed flat.

(18) The method of manufacturing the thin film transistor according to (12), further including, after forming the gate electrode, forming a side wall on a side surface of the gate electrode,
wherein a degree of inclination of the semiconductor layer with respect to the first region at the side surface of the gate electrode is different from a degree of inclination of the side surface of the gate electrode with respect to the first region.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
an insulating substrate;
a metal layer disposed on the insulating substrate;
an insulating layer disposed on the metal layer; and
a semiconductor layer disposed on the insulating layer, a surface of the semiconductor layer including a first corner, a second corner, a third corner, and a fourth corner in a cross-sectional perspective, including a first horizontal region extending from the first corner and a second horizontal region extending from the fourth corner, and including a first slope region extending from the first corner to the second corner and a second slope region extending from the third corner to the fourth corner, wherein
the first slope region and the second slope region are disposed between the first horizontal region and the second horizontal region,
the semiconductor layer includes a channel region of a drive transistor, the channel region disposed between the first slope region and the second slope region, the drive transistor being configured to supply a drive current to a light emitting element of a pixel,
the first slope region has a first angle with respect to a surface of the insulating substrate,
a side surface of the metal layer has a fifth corner, a sixth corner, a seventh corner, and an eighth corner in the cross-sectional perspective, and including a third slope region extending from the fifth corner to the sixth corner and a fourth slope region extending from the seventh corner to the eighth corner,
the first corner, the second corner, the third corner, and the fourth corner are disposed outside the fifth corner, the sixth corner, the seventh corner and the eighth corner of the side surface of the metal layer in a plan view perspective,
the third slope region has a second angle with respect to the surface of the insulating substrate,
the first angle is smaller than the second angle, and
the second angle is greater than zero degrees and less than ninety degrees.

2. The display device according to claim 1, wherein
a distance between the first corner and the fifth corner is shorter than a distance between the second corner and the sixth corner.

3. The display device according to claim 1, wherein the light emitting element of the pixel is configured to emit a white light.

4. The display device according to claim 3, further comprising:
a side wall, wherein an edge of the metal layer is covered with the side wall.

5. The display device according to claim 1, wherein the metal layer is set to a predetermined potential.

6. The display device according to claim 5, wherein the metal layer includes aluminum, titanium, copper, molybdenum, or a combination thereof.

7. The display device according to claim 5, wherein the insulating substrate is a plastic film.

8. The display device according to claim 5, wherein the metal layer forms a gate electrode.

* * * * *